US011004865B2

(12) United States Patent
Kim et al.

(10) Patent No.: US 11,004,865 B2
(45) Date of Patent: May 11, 2021

(54) MEMORY DEVICE

(71) Applicant: Samsung Electronics Co., Ltd., Suwon-si (KR)

(72) Inventors: Kwang Soo Kim, Hwaseong-si (KR); Shin Hwan Kang, Seoul (KR); Jae Hoon Jang, Seongnam-si (KR); Kohji Kanamori, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/692,385

(22) Filed: Nov. 22, 2019

(65) Prior Publication Data

US 2020/0091189 A1  Mar. 19, 2020

Related U.S. Application Data

(60) Continuation of application No. 16/149,249, filed on Oct. 2, 2018, now Pat. No. 10,522,562, which is a division of application No. 15/393,775, filed on Dec. 29, 2016, now Pat. No. 10,134,752.

(30) Foreign Application Priority Data

Jun. 22, 2016 (KR) .................. 10-2016-0077840
Jul. 29, 2016 (KR) .................. 10-2016-0097148

(51) Int. Cl.
*H01L 27/11582* (2017.01)
*H01L 27/11556* (2017.01)
*G11C 16/04* (2006.01)

(52) U.S. Cl.
CPC .... *H01L 27/11582* (2013.01); *G11C 16/0483* (2013.01); *H01L 27/11556* (2013.01)

(58) Field of Classification Search
CPC ................................. H01L 27/11582
See application file for complete search history.

(56) References Cited

U.S. PATENT DOCUMENTS

| 8,614,126 | B1 | 12/2013 | Lee et al. |
| 8,680,604 | B2 | 3/2014 | Higashi et al. |
| 8,951,865 | B2 | 2/2015 | Goda |
| 9,012,974 | B2 | 4/2015 | Chae et al. |
| 9,129,681 | B2 | 9/2015 | Rabkin et al. |

(Continued)

FOREIGN PATENT DOCUMENTS

KR  20150091606 A  8/2015

*Primary Examiner* — Sitaramarao S Yechuri
(74) *Attorney, Agent, or Firm* — Harness, Dickey & Pierce, P.L.C.

(57) ABSTRACT

A memory device includes a plurality of gate electrode layers stacked on a substrate, a plurality of channel layers penetrating the plurality of gate electrode layers, a gate insulating layer between the plurality of gate electrode layers and the plurality of channel layers, and a common source line on the substrate adjacent to the gate electrode layers. The common source line includes a first part and a second part that are alternately arranged in a first direction and have different heights in a direction vertical to a top surface of the substrate. The gate insulating layer includes a plurality of vertical parts and a horizontal part. The plurality of vertical parts surrounds corresponding ones of the plurality of channel layers. The horizontal part extends parallel to a top surface of the substrate.

20 Claims, 60 Drawing Sheets

(56) References Cited

U.S. PATENT DOCUMENTS

| | | |
|---|---|---|
| 9,136,394 B2 | 9/2015 | Kim et al. |
| 2011/0143524 A1 | 6/2011 | Son et al. |
| 2011/0147824 A1 | 6/2011 | Son et al. |
| 2012/0098139 A1 | 4/2012 | Chae et al. |
| 2012/0153291 A1 | 6/2012 | Kim et al. |
| 2012/0273865 A1* | 11/2012 | Lee ............... H01L 29/7926 257/316 |
| 2013/0009235 A1 | 1/2013 | Yoo |
| 2013/0100741 A1* | 4/2013 | Choi ............... G11C 5/02 365/185.18 |
| 2013/0248974 A1 | 9/2013 | Alsmeier et al. |
| 2013/0270643 A1 | 10/2013 | Lee et al. |
| 2014/0070302 A1 | 3/2014 | Yoo et al. |
| 2014/0203364 A1 | 7/2014 | Tsunomura et al. |
| 2015/0104916 A1 | 4/2015 | Lee et al. |
| 2015/0126007 A1 | 5/2015 | Jang et al. |
| 2015/0145020 A1 | 5/2015 | Kim et al. |
| 2015/0221654 A1 | 8/2015 | Kim et al. |
| 2015/0303209 A1 | 10/2015 | Park et al. |
| 2015/0318297 A1 | 11/2015 | Hada |
| 2015/0348637 A1 | 12/2015 | Han et al. |
| 2015/0348984 A1 | 12/2015 | Yada et al. |
| 2015/0364488 A1 | 12/2015 | Pachamuthu et al. |
| 2016/0013202 A1 | 1/2016 | Hwang |
| 2016/0071873 A1* | 3/2016 | Tsuji ............... H01L 27/11597 257/324 |
| 2016/0225754 A1 | 8/2016 | Jang |
| 2017/0263623 A1 | 9/2017 | Zhang et al. |

\* cited by examiner

IV-IV'

VI–VI'

MEMORY DEVICE

CROSS-REFERENCE TO RELATED APPLICATIONS

This application is a continuation of U.S. application Ser. No. 16/149,249, filed on Oct. 2, 2018, which is divisional of U.S. Non-Provisional application Ser. No. 15/393,775, filed on Dec. 29, 2016, now granted as U.S. Pat. No. 10,134,752 on Nov. 20, 2018, which claims priority under 35 U.S.C. § 119 to Korean Patent Application No. 10-2016-0077840, filed on Jun. 22, 2016 and Korean Patent Application No. 10-2016-0097148, filed on Jul. 29, 2016 in the Korean Intellectual Property Office. The entire contents of each of the above-referenced applications are incorporated by reference herein.

BACKGROUND

Example embodiments of inventive concepts relate to a memory device.

A three-dimensional memory device includes a plurality of memory cells vertically arranged with respect to a substrate to constitute vertical NAND string structures. In some three dimensional flash memories, a NAND string may be built vertically, stacking the individual FETs of the string on top of each other, so that the string extends out from the substrate.

SUMMARY

Example embodiments of inventive concepts provide a memory device with increased integration density.

According to some example embodiments of inventive concepts, a memory device may include a substrate, a plurality of gate electrode layers stacked on the substrate, a plurality of channel layers penetrating the plurality of gate electrode layers, a gate insulating layer between the plurality of gate electrode layers and the plurality of channel layers, and a common source line on the substrate adjacent to a plurality of gate electrode layers. The common source line includes a first part and a second part that are alternately arranged in a first direction and have different heights in a direction vertical to a top surface of the substrate. The gate insulating layer may include a plurality of vertical parts and a horizontal part. The plurality of vertical parts may surround respective ones of the plurality of channel layers. The horizontal part may be below the plurality of gate electrode layers and may extend parallel to the top surface of the substrate.

According to some example embodiments of inventive concepts, a memory device may include a substrate, a plurality of gate structures on the substrate and the plurality of gate structure each include a plurality of gate electrode layers and a plurality of insulating layers that are alternately stacked on the substrate, a plurality of channel layers extending in a direction vertical to a top surface of the substrate, a charge storage layer, and a horizontal channel layer. The plurality of channel layers may penetrate the plurality of gate structures. The charge storage layer may include vertical parts and a horizontal part. The vertical parts may be outside respective ones of the plurality of channel layers of each of the plurality of gate structures. The horizontal part may extend from the vertical parts to below each of the gate structures. The horizontal channel layer may be below the horizontal part of the charge storage layer. The horizontal channel layer may connect the plurality of channel layers to each other and contacts the substrate.

According to some example embodiments of inventive concepts, a memory device may include a substrate, a plurality of gate structures on the substrate and each of the plurality of gate structures including a plurality of gate electrode layers that are stacked on the substrate, a plurality of channel layers penetrating the plurality of gate electrode layers of respective ones of the plurality of gate structures and extending in a direction perpendicular to a top surface of the substrate, a horizontal channel layer connecting the plurality of channel layers to the substrate below the plurality of gate structures, a charge storage layer between the plurality of the gate electrode layers and the plurality of channel layers and on a top surface of the horizontal channel layer, and a common source line on the substrate between the plurality of gate structures and extending in a first direction that is parallel to a top surface of the substrate. The substrate may include a first impurity region below the horizontal channel layer and a second impurity region between the common source line and the horizontal channel layer, and the first and second impurity regions may include carbon.

According to some example embodiments of inventive concepts, a memory device may include a stack structure on a substrate. The stack structure may include a gate insulating layer that includes a horizontal part extending parallel to a top surface of the substrate and a plurality of vertical parts that are spaced apart from each other and extend vertical above the top surface of the substrate, a plurality of channel layers surrounded by the plurality of vertical parts of the gate insulating layer and extending vertical to the top surface of the substrate, a plurality of gate electrode layers and insulating layers alternately stacked on top of each other on the horizontal part of the gate insulating layer, a plurality of strings, and a horizontal channel layers. The plurality of strings may be defined by the gate insulating layer, the plurality of channel layers and the plurality of gate electrode layers, and each string may include a plurality of memory cells stacked on top of each other between a ground selection transistor and a string selection transistor. The horizontal channel layer may connect at least some of the plurality of channel layers to each other and may extend between a lower surface of the horizontal part of the gate insulating layer and the top surface of the substrate.

DETAILED DESCRIPTION

Example embodiments of inventive concepts will now be described more fully with reference to the accompanying drawings, in which some example embodiments are shown. Example embodiments of inventive concepts may, however, be embodied in many different forms and should not be construed as being limited to the embodiments set forth herein.

Figure 1:
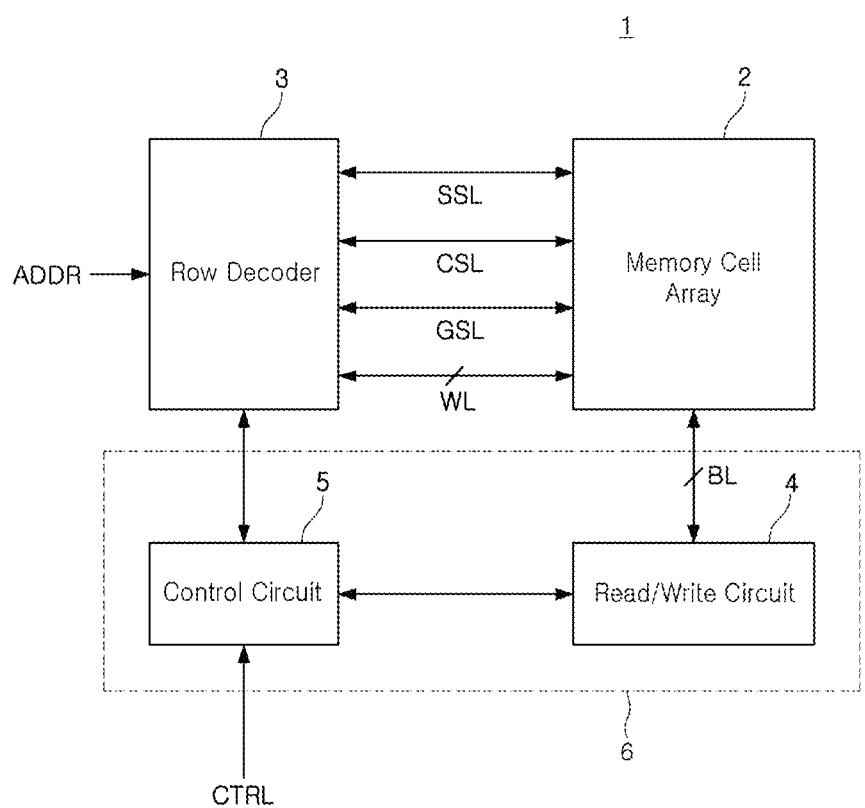
FIG. 1 is a schematic block diagram illustrating a memory device according to some example embodiments of inventive concepts.

FIG. 1 is a schematic block diagram illustrating a memory device according to some example embodiments of inventive concepts.

Referring to FIG. 1, a memory device 1 according to some example embodiments of inventive concepts may include a memory cell array 2, a row decoder 3 and a core logic circuit 6. The core logic circuit 6 may include a read/write circuit 4 and a control circuit 5.

The memory cell array 2 may include a plurality of memory cells arranged in rows and columns. The plurality of memory cells may be connected to the row decoder 3 through a word line WL, a common source line CSL, a string select line SSL and a ground select line GSL and may be connected to the read/write circuit 4 through a bit line BL. In some example embodiments, a plurality of memory cells arranged along a same row may be connected to a same word line WL, and a plurality of memory cells arranged along a same column may be connected to a same bit line BL.

The plurality of memory cells included in the memory cell array 2 may be divided into a plurality of memory blocks. Each block may include a plurality of word lines WL, a plurality of string select lines SSL, a plurality of ground select lines GSL, a plurality of bit lines BL and at least one common bit line CSL.

The row decoder 3 may receive an address information ADDR from the outside and may decode the received address information ADDR to determine a voltage supplied to at least some of the word lines WL, the common source lines CSL, the string select lines SSL and the ground select lines GSL that are connected to the memory cell array 2.

The read/write circuit 4 may select at least some of the bit lines BL connected to the memory cell array 2 according to a command received from the control circuit 5. The read/write circuit 4 may read data stored in the memory cells connected to the selected at least some of the bit lines BL and may write data in the memory cells connected to the selected at least some of the bit lines BL. The read/write circuit 4 may include a circuit, such as a page buffer, an input/output buffer, or a data latch, to perform at least the above operation.

The control circuit 5 may control operations of the row decoder 3 and the read/write circuit 4 in response to a control signal CTRL transmitted from the outside. When reading data stored in the memory cell array 2, the control circuit 5 may control the operation of the row decoder 3 to supply a read voltage to the word line WL connected to the memory cell in which data to be read is stored. When the read voltage is supplied to a certain word line WL, the control circuit 5 may control the read/write circuit 4 to read data stored in the memory cell connected to the certain word line WL.

When writing data in the memory cell array 2, the control circuit 5 may control the operation of the row decoder 3 to supply a write voltage to the word line WL connected to the memory cell in which data is to be written. When the write voltage is supplied to a certain word line WL, the control circuit 5 may control the read/write circuit 4 to write data into the memory cell connected to the certain word line WL.

Figure 2:
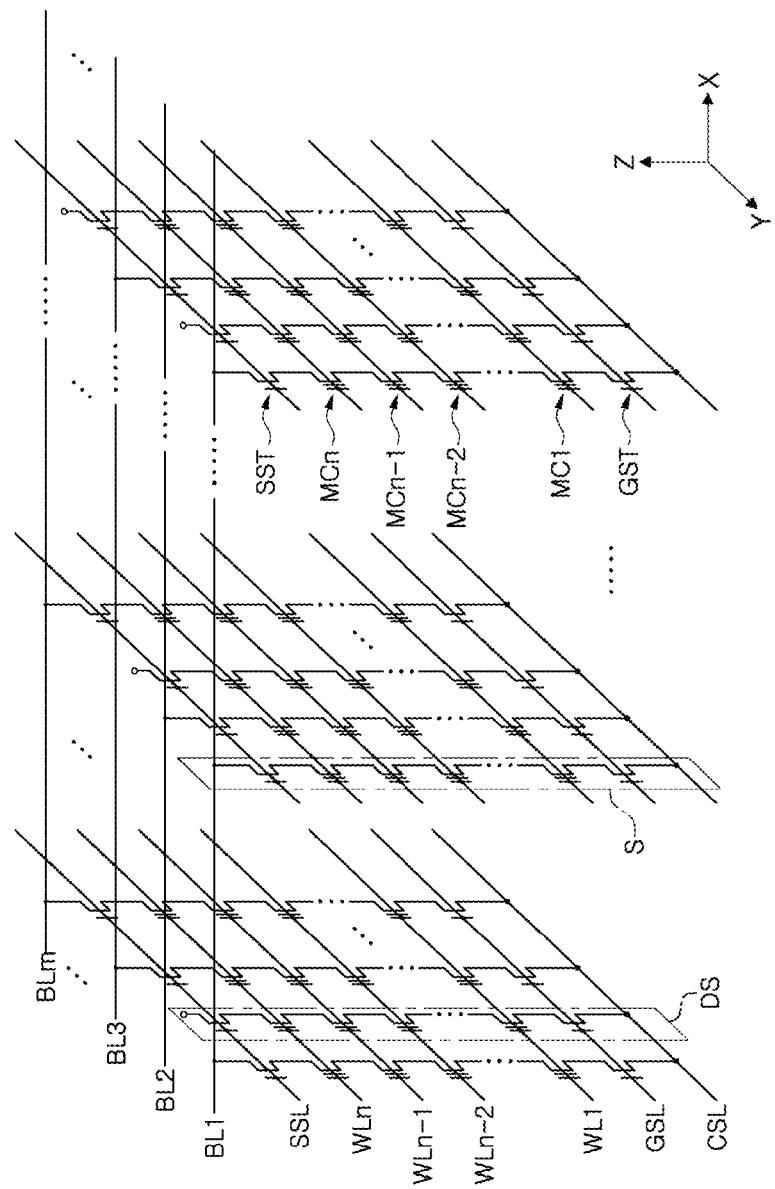
FIG. 2 is a circuit diagram illustrating a memory cell array of a memory device according to some example embodiments of inventive concepts.

FIG. 2 is a circuit diagram illustrating a memory cell array of a memory device according to some example embodiments of inventive concepts. In some example embodiments, the memory device may be a vertical type NAND flash memory device (or a three-dimensional NAND flash memory device).

Referring to FIG. 2, a memory cell array may include a plurality of memory cell strings S, each of which includes an n number of memory cells MC1-MCn (n is a natural number), and a ground select transistor GST and a string select transistor SST which are connected in series to both ends of the memory cells MC1-MCn. The n number of memory cells MC1-MCn connected in series to each other may be connected to an n number of word lines WL1-WLn for selecting the memory cells MC1-MCn. According to some example embodiments, a dummy cell may further be disposed between a first memory cell MC1 and the ground select transistor GST and between an n-th memory cell MCn and the string select transistor SST.

A gate terminal of the ground select transistor GST may be connected to a ground select line GSL, and a source terminal thereof may be connected to a common source line CSL. A gate terminal of the string select transistor SST may be connected to a string select line SSL, and a source terminal thereof may be connected to a drain terminal of the n-th memory cell MCn. In some example embodiments, a single ground transistor GST and a single string select transistor SST may be connected to then number of memory cells MC1-MCn connected in series to each other as shown in FIG. 2. In other example embodiments, a plurality of the ground transistors GST and a plurality of the string select transistor SST may be connected to the n number of memory cells MC1-MCn connected in series to each other.

A drain terminal of the string select transistor SST may be connected to a plurality of bit lines BL1-BLm. When a signal is applied to the gate terminal of the string select transistor SST through the string select line SSL, a signal applied through the bit line BL1-BLm may be transmitted to the n number of memory cells MC1-MCn connected in series to each other, thereby performing a data read operation and a data write operation. By applying a certain erase voltage to a well formed in a substrate, an erase operation for erasing data written in the memory cells MC1-MCn may be performed.

In some example embodiments, the memory device may include at least one dummy string DS. The dummy string DS may be a string including a dummy channel that is electrically separated from the bit lines BL1-BLm.

Figure 3:
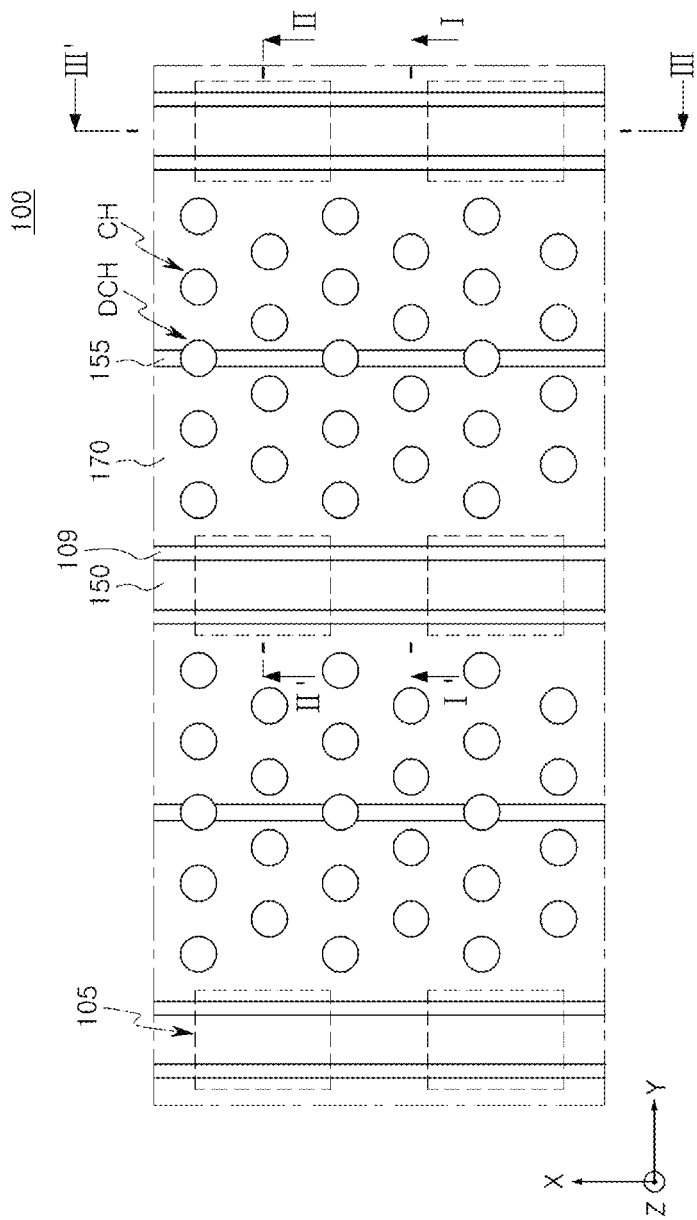
FIG. 3 is a schematic plan view illustrating a memory device according to some example embodiments of inventive concepts.

FIG. 3 is a schematic plan view illustrating a memory device according to some example embodiments of inventive concepts.

Referring to FIG. 3, a memory device 100 according to some example embodiments of inventive concepts may include a plurality of channel structures CH and a plurality of dummy channel structures DCH that are separated from each other in plan view. The dummy channel structures DCH may not be electrically connected to a bit line, unlike the channel structures CH. The channel structures CH and the dummy channel structures DCH may extend in a direction (Z direction) vertical to a top surface (X-Y plane) of a substrate to penetrate a plurality of gate electrode layers and an insulating interlayer 170.

The plurality of gate electrode layers may be divided into a plurality of unit structures by a common source line 150. A spacer 109 may be provided on a sidewall of the common source line 150 to separate from the plurality of gate electrode layers. A separation insulating layer 155 may be provided between the adjacent common source lines 150. In some example embodiments, the separation insulating layer 155 may divide at least one of the plurality of gate electrode layers. The dummy channel structures DCH may penetrate the separation insulating layer 155.

The common source line 150 may extend in the Z direction and a first direction (X direction) parallel to the top surface (X-Y plane) of the substrate. The common source line 150 may be connected to a source region in the substrate. In some example embodiments of inventive concepts, a plurality of supporting regions 105 may be provided in a portion of the substrate, and thus the common source line 150 may include a plurality of parts having different heights.

Figure 4:
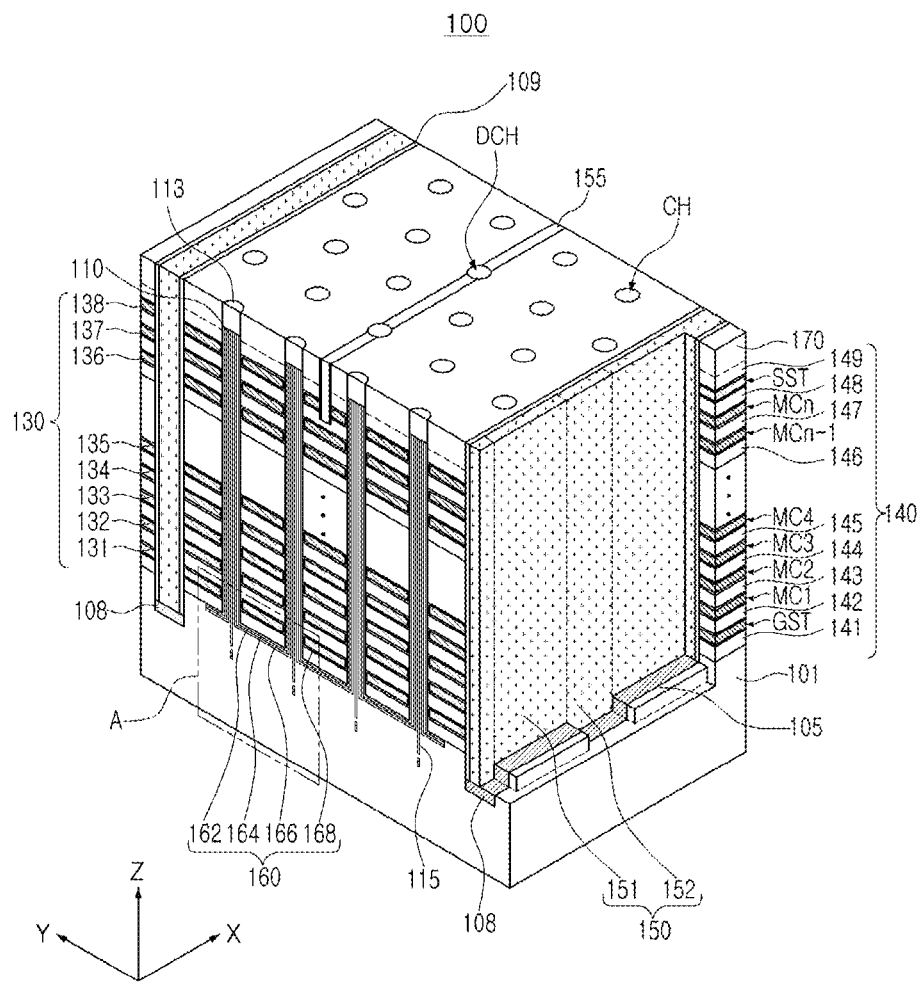
FIGS. 4 and 5 are perspective views illustrating a portion of the memory device of FIG. 3 according to some example embodiments of inventive concepts.
Figure 5:
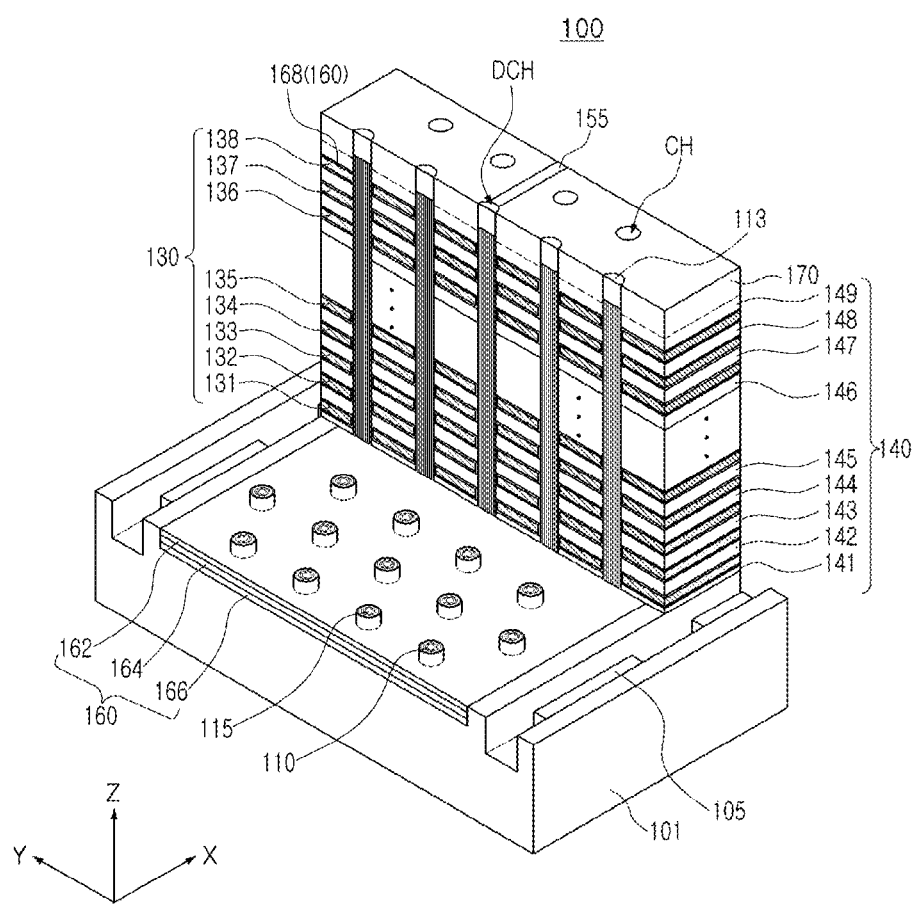

FIGS. 4 and 5 are perspective views illustrating a portion of the memory device 100 of FIG. 3 according to some example embodiments of inventive concepts.

Referring to FIGS. 4 and 5, the memory device 100 may include a substrate 101, a plurality of gate electrode layers 131-138 (130) and a plurality of insulating layers 141-149 (140) which are stacked on the substrate 101, for example, on a top surface of the substrate 101, and a plurality of channel layers 110 penetrating the plurality of gate electrode layers 130 and the plurality of insulating layers 140. A gate insulating layer 160 may be disposed between the plurality of gate electrode layers 130 and the plurality of channel layers 110.

The gate insulating layer 160 may include a blocking layer 162, a charge storage layer 164 and a tunnel layer 166 that are sequentially arranged in a direction extending from the gate electrode layer 130 to the channel layer 110. The gate insulating layer 160 may further include an additional blocking layer 168 between the blocking layer 162 and the gate electrode layers 130. In some example embodiments, the additional blocking layer 168 may be omitted.

The plurality of gate electrode layers 130, each of the plurality of channel layers 110 and the gate insulating layer 160 may constitute the ground select transistor GST, the memory cells MC1-MCn and the string select transistor SST. The number of the ground select transistor GST and the string select transistor SST may be changed from that shown in FIGS. 4 and 5, and the ground select transistor GST and the string select transistor SST may have a different structure from the memory cells MC1-MCn.

The plurality of channel layers 110 may respectively form the plurality of channel structures CH or the plurality of dummy channel structures DCH. The plurality of channel structures CH and the plurality of dummy channel structures DCH may have a similar structure. As an example, the channel structure CH and the dummy channel structure DCH may include the channel layer 110, a buried insulating layer 115 inside the channel layer 110, the gate insulating layer 160 on an outer sidewall of the channel layer 110 and a drain region 113 on a top of the channel layer 110.

The channel layer 110 may have a hollow cylinder shape. In some example embodiments, the channel layer 110 may not have a space therein. In some example embodiments, the buried insulating layer 115 may be omitted. As shown in FIGS. 4 and 5, the blocking layer 162, the charge storage layer 164 and the tunnel layer 166 may surround the outer sidewall of the channel layer 110 and the additional blocking layer 168 may surround the plurality of gate electrode layers 130. In some example embodiments, the gate insulating layer 160 that is free of the additional blocking layer 168 may surround the outer sidewall of the channel layer 110. The buried insulating layer 115 may extend to a greater distance into the substrate 101 compared to the gate insulating layer 160 and the plurality of channel layers 110.

The common source line 150 may extend in the Z direction and the first direction (X direction). The common source line 150 may be connected to a source region 108 thereunder. The source region 108 may be an impurity region formed by implanting impurities (e.g., n-type impurities) in the substrate 101.

Referring to FIG. 4, the common source line 150 may include a first part 151 and a second part 152 that have different heights in the Z direction. The height of the second part 152 may be greater than that of the first part 151. The substrate 101 may include the plurality of supporting regions 105 vertically protruding toward the common source line CSL. The plurality of supporting regions 105, each of which is under the first part 151, may be arranged in the first direction (X direction). In a manufacturing process of the memory device 100, the plurality of supporting regions 105 may be formed before forming the common source line 150, and the first part 151 may be defined as a portion of the common source line 150 positioned on the plurality of supporting regions 105. A bottom surface of the first part 151 may contact top surfaces of the plurality of supporting regions 105. By the plurality of supporting regions 105, a thickness of the substrate 101 under the first part 151 may be greater than that of the substrate 101 under the second part 152.

At least a portion of the gate insulating layer 160 may be disposed on the top surface of the substrate 101. That is, the at least a portion of the gate insulating layer 160 may be positioned between the top surface of the substrate 101 and a lowermost insulating layer 141 in the Z direction. Referring to FIG. 5 illustrating a structure in which a portion of the gate electrode layers 130 and a portion of the insulating layers 140 are cut, a portion of the blocking layer 162, a portion of the tunnel layer 166 and a portion of the charge storage layer 164 may be positioned on the top surface of the substrate 101.

In some example embodiments of inventive concepts, in each unit structure defined as a region between the adjacent common source lines 150, at least one layer (e.g., the charge storage layer 164) included in the gate insulating layer 160 may include a horizontal part disposed on the top surface of the substrate 101 and vertical parts surrounding the outer sidewalls of the respective channel layers 110 and being vertical to the top surface of the substrate 101. The horizontal part may be defined as a layer extending parallel to the top surface of the substrate 101. For example, the horizontal part may have a plate shape. Referring to FIGS. 4 and 5, the blocking layer 162, the charge storage layer 164 and the tunnel layer 166 may respectively include a horizontal part extending parallel to the top surface of the substrate 101 and vertical parts surrounding the channel layer 110. The vertical parts of each of the blocking layer 162, the charge storage layer 164 and the tunnel layer 166 surrounding the respective channel layers 110 may be connected to each other by the corresponding horizontal part thereof. A plurality of vertical parts of each of the blocking layer 162, the charge storage layer 164 and the tunnel layer 166 may be connected by a single horizontal part of each of the blocking layer 162, the charge storage layer 164 and the tunnel layer 166.

The plurality of channel layers 110, each of which is disposed on the inside of the gate insulating layer 160, may be directly connected to the substrate 101. As an example, the plurality of channel layers 110 may be connected to each other by a horizontal channel layer in the substrate 101.

Figure 6:
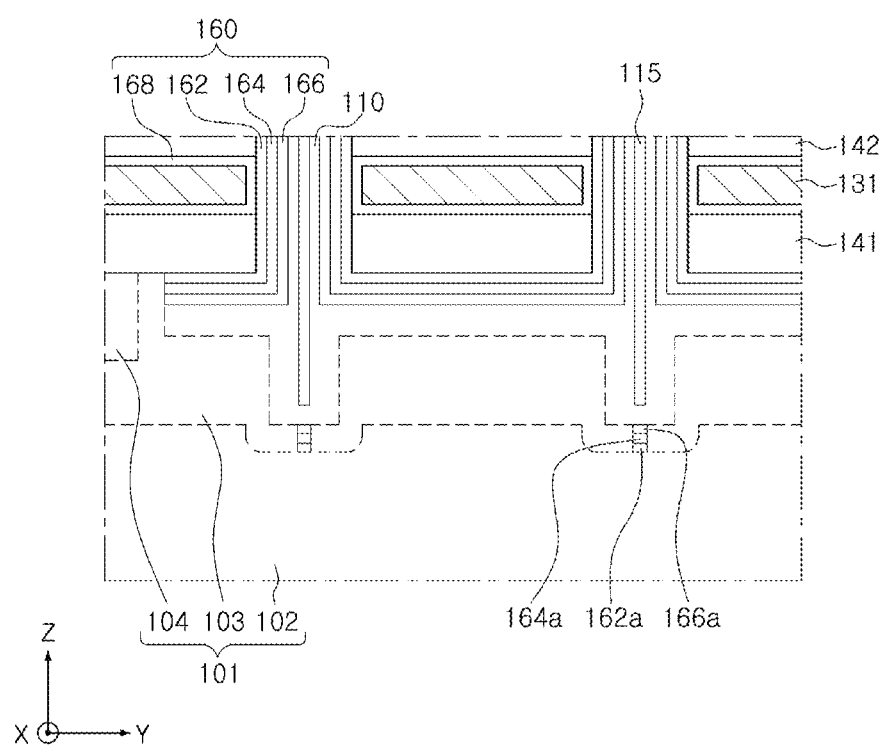
FIG. 6 is an enlarged sectional view of portion A of FIG. 4 according to some example embodiments of inventive concepts.

FIG. 6 is an enlarged sectional view of portion A of FIG. 4 according to some example embodiments of inventive concepts.

Referring to FIG. 6, the substrate 101 according to some example embodiments of inventive concepts may include a first region 102, a second region 103 and a third region 104. The first to third regions 102, 103 and 104 may have equal or different crystalline structures. As an example, the first to third regions 102, 103 and 104 may include polysilicon.

In some example embodiments, the at least one layer included in the gate insulating layer 160 may be connected to each other on the top surface of the substrate 101. As an example, the blocking layer 162, the charge storage layer 164 and the tunnel layer 166 may respectively include a horizontal part extending parallel to the top surface of the substrate 101 and vertical parts surrounding the channel layers 110. The vertical parts of the blocking layer 162, charge storage layer 164 and the tunnel layer 166 may be respectively connected to each other by the corresponding horizontal part thereof.

A part of the gate insulating layer 160 may be disposed as a remaining part 162a, 164a and 166a. The number of layers included in the remaining part 162a, 164a and 166a may be equal to or less than the number of layers included in the horizontal parts. The remaining part 162a, 164a and 166a may be formed by a part of the blocking layer 162, a part of the charge storage layer 164 and a part of the tunnel layer 166 remaining below the buried insulating layer 115 during a manufacturing process of the memory device 100.

The memory device 100 may include a horizontal channel layer 110h. The horizontal channel layer 110h may connect the plurality of channel layers 110 extending in the Z direction, under the plurality of gate electrode layers 130 and the plurality of insulating layers 140. In some example embodiments, the horizontal channel layer 110h may directly contact the second region 103 of the substrate 101 and may include polysilicon. Accordingly, the plurality of channel layers 110 may be connected to the substrate 101 by the horizontal channel layer 110h. The horizontal channel layer 110h may be disposed under the horizontal part of the at least one layer of the gate insulating layer 160 (e.g., the horizontal part of the charge storage layer 164). The horizontal part of the at least one layer of the gate insulating layer 160 may not extend on a bottom surface of the horizontal channel layer 110h.

Figure 7:
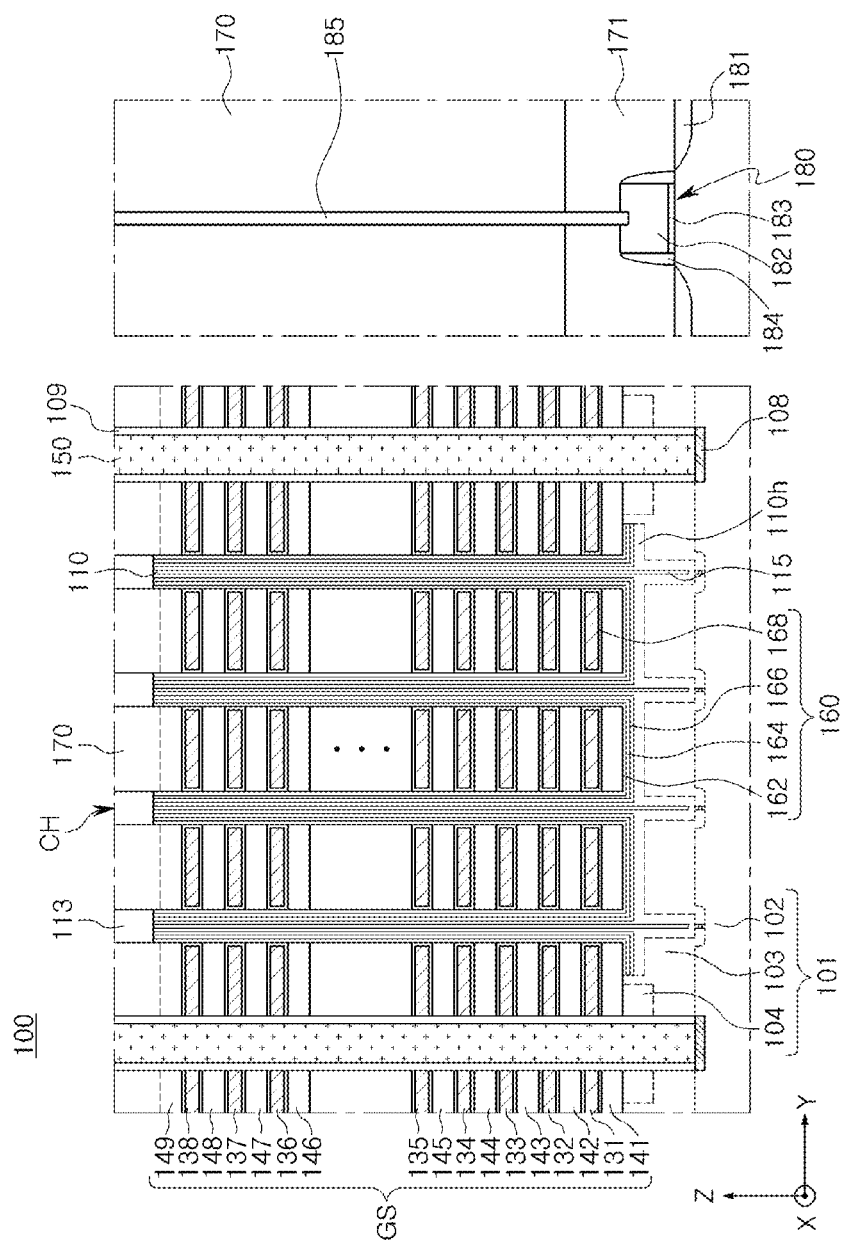
FIG. 7 is a cross-sectional view taken along the line I-I' of FIG. 3 according to some example embodiments of inventive concepts.
Figure 8:
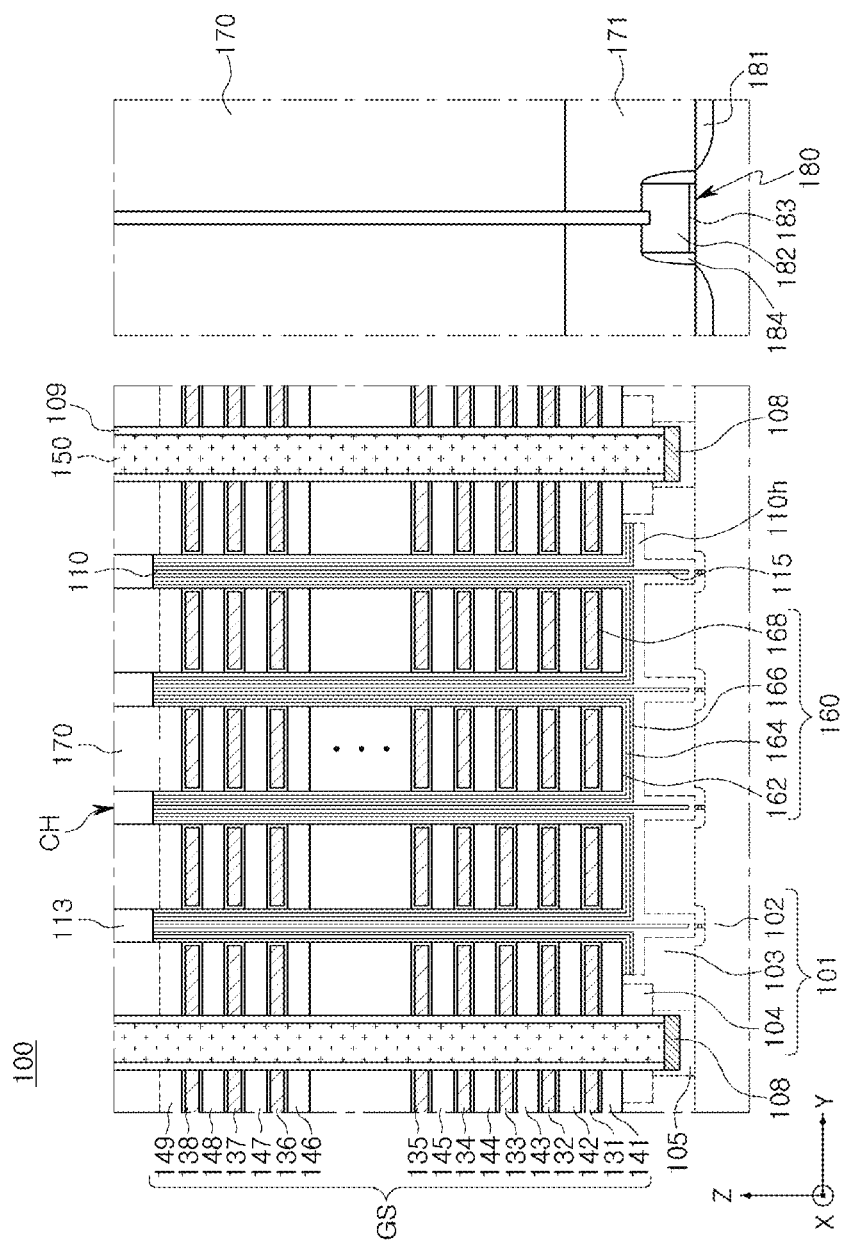
FIG. 8 is a cross-sectional view taken along the line II-II' of FIG. 3 according to some example embodiments of inventive concepts.

FIG. 7 is a cross-sectional view taken along line I-I' of FIG. 3 according to some example embodiments of inventive concepts. FIG. 8 is a cross-sectional view taken along line II-II' of FIG. 3 according to some example embodiments of inventive concepts.

Referring to FIGS. 7 and 8, the memory device 100 may include a plurality of gate structures GS, each of which includes the plurality of gate electrode layers 131-138 and the plurality of insulating layers 141-149. The plurality of gate structures GS may be arranged on the substrate 101 to be separated from each other by the common source line 150, and the plurality of gate electrode layers 131-138 and the plurality of insulating layers 141-149 may be alternately and repeatedly stacked on top of each other.

The insulating interlayer 170 may be disposed on the plurality of gate structures GS. The insulating interlayer 170 may be formed of an insulating material such as silicon nitride or silicon oxide and may disposed on a peripheral circuit device 180 in a peripheral circuit region. The peripheral circuit device 180 may be covered by a lower insulating interlayer 171, and the insulating interlayer 170 may be disposed on the lower insulating interlayer 171.

The peripheral circuit device 180 may include a planar type transistor that includes a peripheral source/drain region 181, a peripheral gate electrode 182, a peripheral gate insulating layer 183 and a peripheral spacer 184. The peripheral gate electrode 182 and the peripheral source/drain region 181 may be connected to a contact 185.

The plurality of channel layers 110 may penetrate each of the plurality of gate structure GS and may be connected to each other by the horizontal channel layer 110h below each of the plurality of gate structures GS. The plurality of channel layers 110 may be directly connected to the substrate 101 below the gate structure GS.

The horizontal parts of the blocking layer 162, the charge storage layer 164 and the tunnel layer 166 may be positioned between the horizontal channel layer 110h and the gate structure GS. The horizontal parts may not extend below the horizontal channel layer 110h. In some example embodiments, the horizontal parts may not be formed below the horizontal channel layer 110h.

The substrate 101 may include the first to third regions 102, 103 and 104. In some example embodiments, the first to third regions 102, 103 and 104 of the substrate 101 may be regions formed in separate processing steps and include the same material or different materials. The first to third regions 102, 103 and 104 may include polysilicon.

In the memory device 100, the plurality of supporting regions 105 below the common source line 150 between the plurality of gate structures GS may protrude upwardly from the first region 102. The plurality of supporting regions 105 may act to limit and/or prevent collapse of the gate structure DS during the manufacturing process of the memory device 100. The plurality of supporting regions 105 may have a larger width than a width of the common source line 150 in a second direction (Y direction) perpendicular to the first direction (X direction) and may be arranged in the first direction (X direction) as shown in FIGS. 3 to 5. The plurality of supporting regions 105 may be disposed between the first and third regions 102 and 104 of the substrate 101.

The substrate 101 may include an impurity region including carbon. In some example embodiments, a portion of an upper portion of the first region 102 adjacent to an interface between the second region 103 and the first region 102 may include carbon (or a portion of the upper portion of the first region 102 may be a carbon-doped region). The third region 104 may also include carbon (or the third region 104 may be a carbon-doped region). The third region 104 may have a smaller width in the second direction (Y direction) than the carbon doped region in the first region 102. The substrate 101 may be limited and/or prevented from being unintentionally etched during the manufacturing process of the memory device 100 since the substrate 101 includes carbon.

The common source line 150 may have different heights due to the supporting regions 105, in a cross-section along line I-I' and a cross-section along line II-IF as shown in FIGS. 7 and 8. A bottom surface of the common source line 150 in the cross-section along line II-II' may be located at a higher level than that in the cross-section along line I-I'. Accordingly, the common source line 150 may include a plurality of parts of which heights in the Z direction are different. The plurality of parts may be alternately disposed in the first direction (X direction). The parts having a relatively small height among the plurality of parts may be disposed on the plurality of supporting regions 105. A source region 108 may be disposed under the common source line 150 and may be connected to the common source line 150. The source region 108 may have an uneven or curved top surface along the first direction (X direction) due to the plurality of supporting regions 105.

Figure 9:
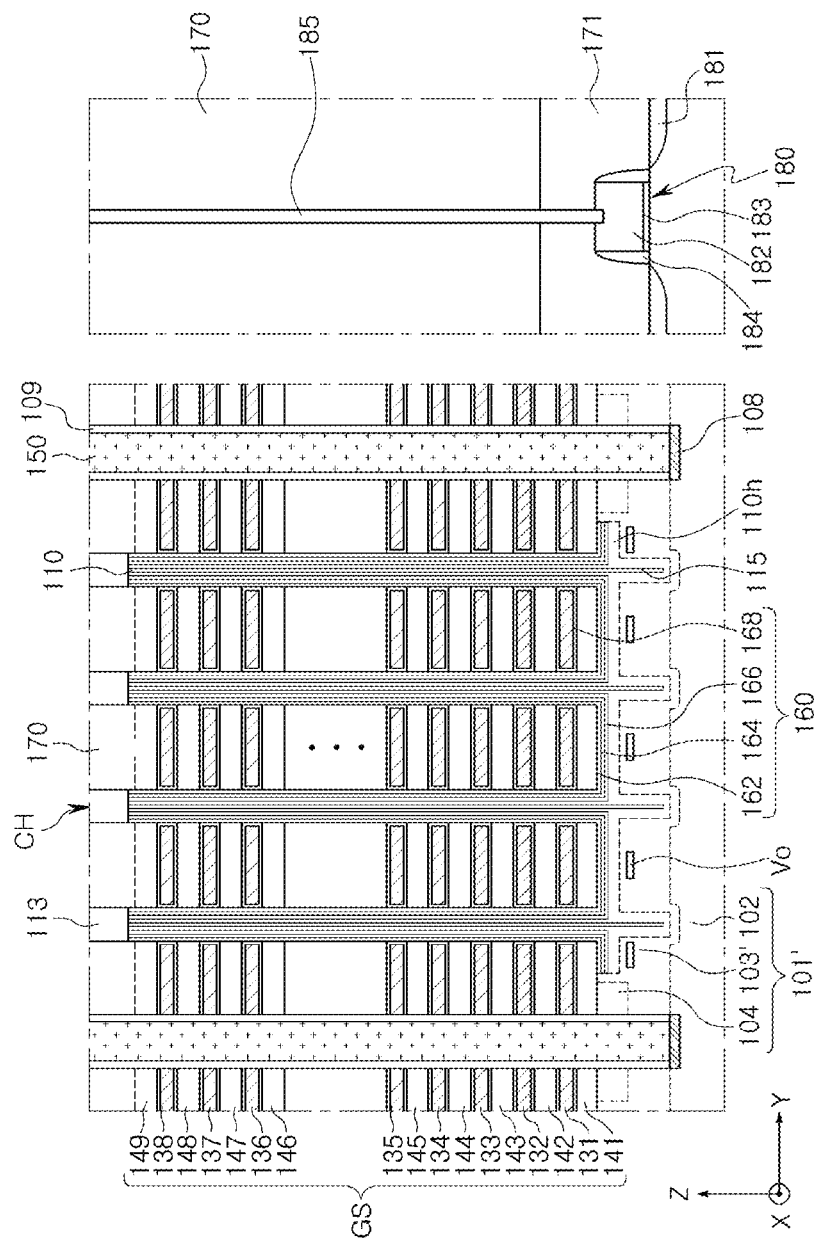
FIG. 9 is a cross-sectional view taken along the line I-I' of FIG. 3 according to some example embodiments of inventive concepts.
Figure 10:
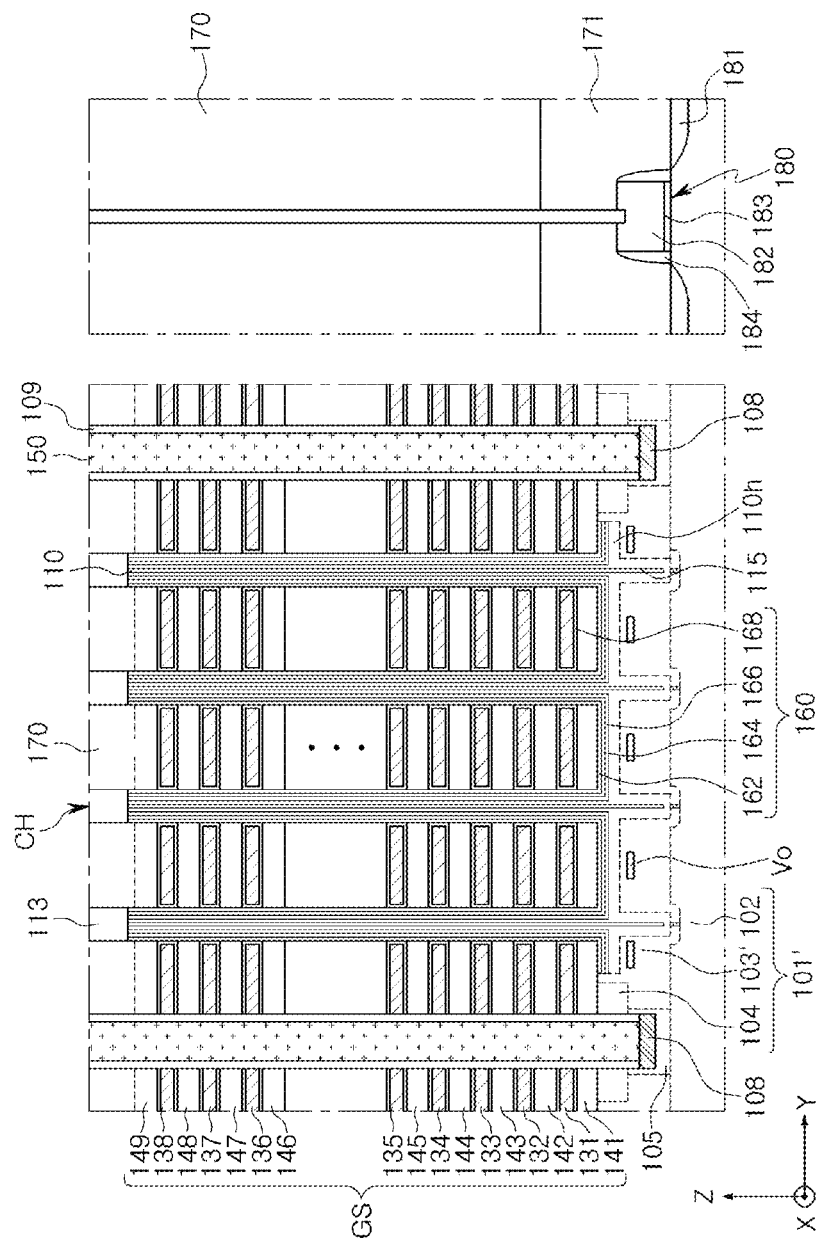
FIG. 10 is a cross-sectional view taken along the line I-I' of FIG. 3 according to some example embodiments of inventive concepts.

FIG. 9 is a cross-sectional view taken along line I-I' of FIG. 3 according to some example embodiments. FIG. 10 is a cross-sectional view taken along line II-II' of FIG. 3 according to some example embodiments.

According to some example embodiments of inventive concepts shown in FIGS. 9 and 10, a substrate 101' may include at least one void Vo therein. The void Vo may be formed in a second region 103'. The void Vo may be an air gap in some example embodiments. Further, the remaining portion 162a, 164a and 166a between the buried insulating layer 115 and the first region 102 as shown in FIGS. 6 to 8 may not be formed by a structural difference occurring in a process for forming the second region 103'. The void Vo may be formed in the horizontal channel layer 110h in addition to the second region 103'.

Figure 11:
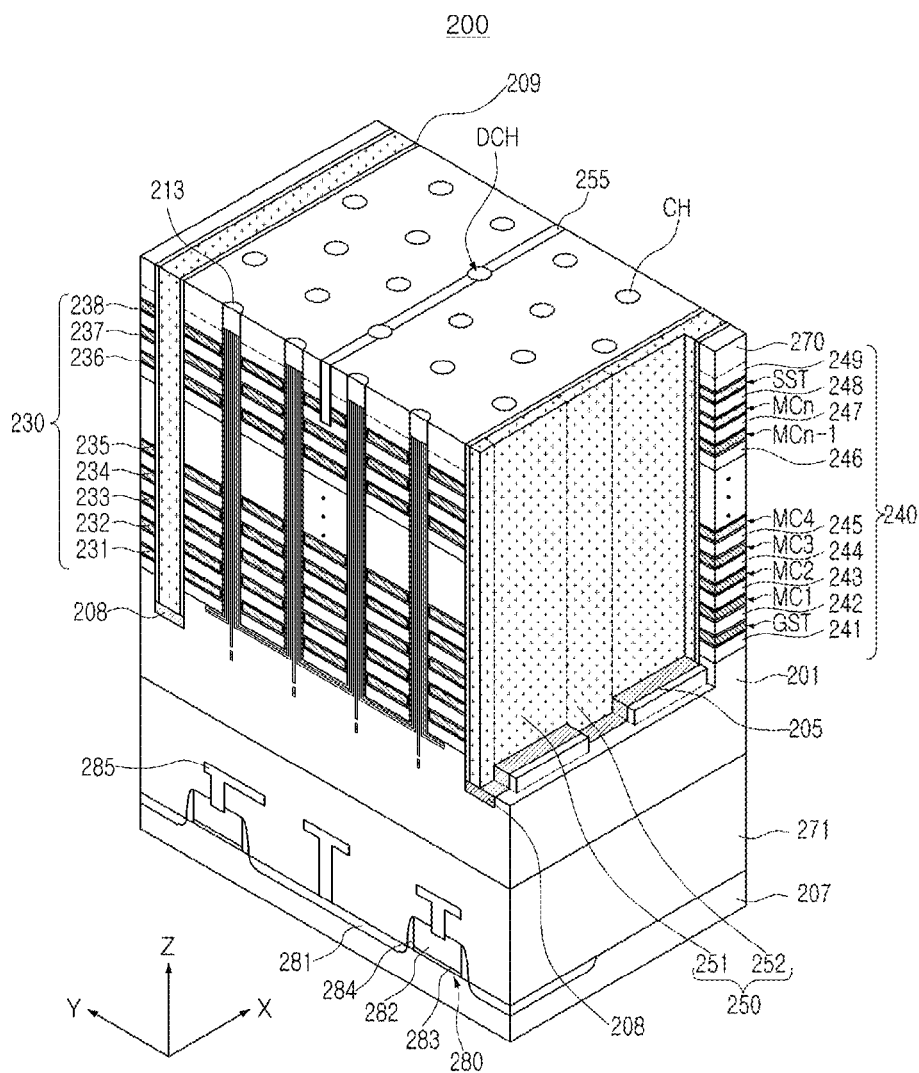
FIG. 11 is a perspective view illustrating a memory device according to some example embodiments of inventive concepts.

FIG. 11 is a perspective view illustrating a memory device according to some example embodiments of inventive concepts.

Referring to FIG. 11, a memory device 200 may include a cell-on-peripheral (COP) structure in which a peripheral circuit region including a peripheral circuit device 280 is disposed below a cell region including a plurality of memory cells MC1-MCn. The peripheral circuit device 280 may be disposed on a second substrate 207 and may be covered by a second insulating interlayer 271. A peripheral source/drain region 281 and a peripheral gate electrode 282 included in the peripheral circuit device 280 may be connected to an interconnection pattern 285. The second insulating interlayer 271 may be formed of silicon oxide or silicon nitride.

The cell region may include a first substrate 201. The first substrate 101 may be disposed on the second insulating interlayer 271. In the cell region, a plurality of gate electrode layers 231-238(230) and a plurality of channel layers 210 may be disposed to provide the plurality of memory cells MC1-MCn. The plurality of gate electrode layers 230 may be divided into a plurality of unit structures by a common source line 250. The common source line 250 may include first and second parts 251 and 252.

The first part 251 may be a small height than the second part 252. The first and second parts 251 and 252 may be alternately disposed along the first direction (X direction). The first part 251 may be provided on a plurality of supporting regions 205 and may have a smaller height than the second part 252 by a thickness of the supporting regions 205. The common source line 250 may be connected to a source region 208 in the substrate 201. The source region 208 may have an uneven or curved top surface along the first direction due to the plurality of supporting regions 205.

FIGS. 12 to 59 are cross-sectional views illustrating a method of manufacturing a memory device according to some example embodiments of inventive concepts. FIGS. 12, 14, 16, 18, 20, 22, 24, 27, 30, 33, 36, 39, 42, 45, 48, 51, 54 and 57 are plan views illustrating a method of forming a memory device according to some example embodiments of inventive concepts. FIGS. 13, 15, 17, 19, 21 and 25 are cross-sectional views taken along line IV-IV' of FIGS. 12, 14, 16, 18, 20 and 22, respectively. FIG. 26 is a cross-sectional view taken along line V-V' of FIG. 24. FIGS. 28, 31, 34, 37, 40, 43, 46, 49, 52, 55 and 58 are cross-sectional views taken along line IV-IV' of FIGS. 7, 30, 33, 36, 39, 42, 45, 48, 51, 54 and 57, respectively. FIGS. 29, 32, 35, 38, 41, 44, 47, 50, 53, 56 and 59 are cross-sectional views taken along line VI-VI' of FIGS. 7, 30, 33, 36, 39, 42, 45, 48, 51, 54 and 57, respectively.

Figure 12:
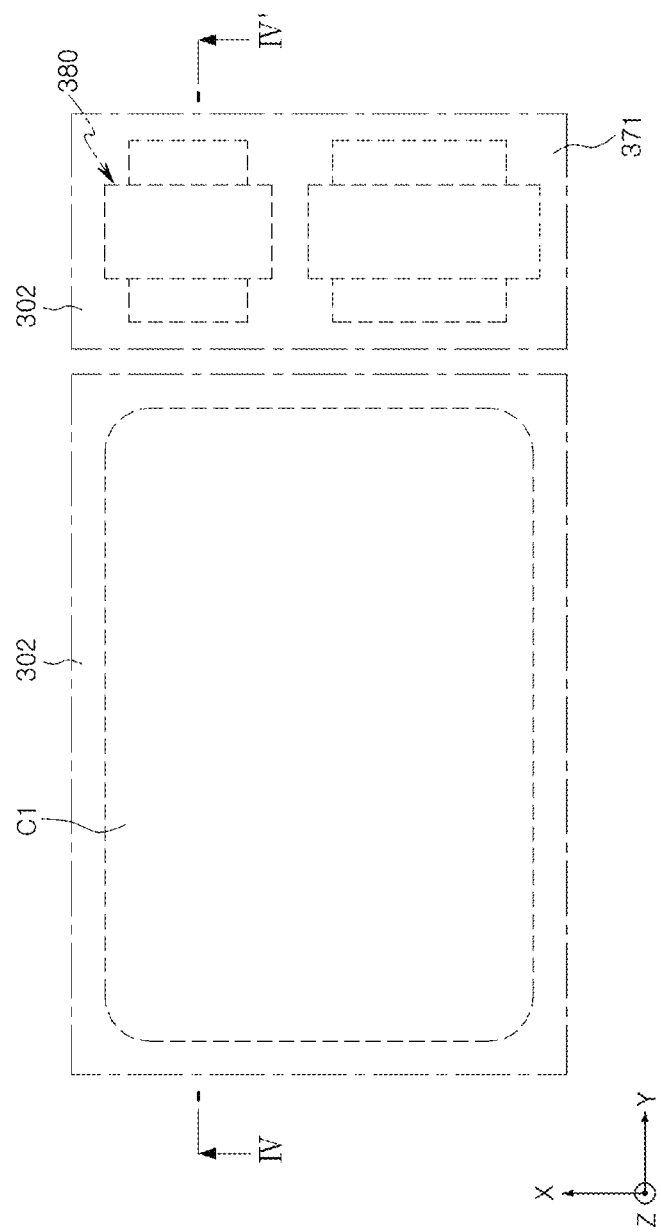
FIGS. 12 to 59 are cross-sectional views illustrating a method of manufacturing a memory device according to some example embodiments of inventive concepts.
Figure 13:
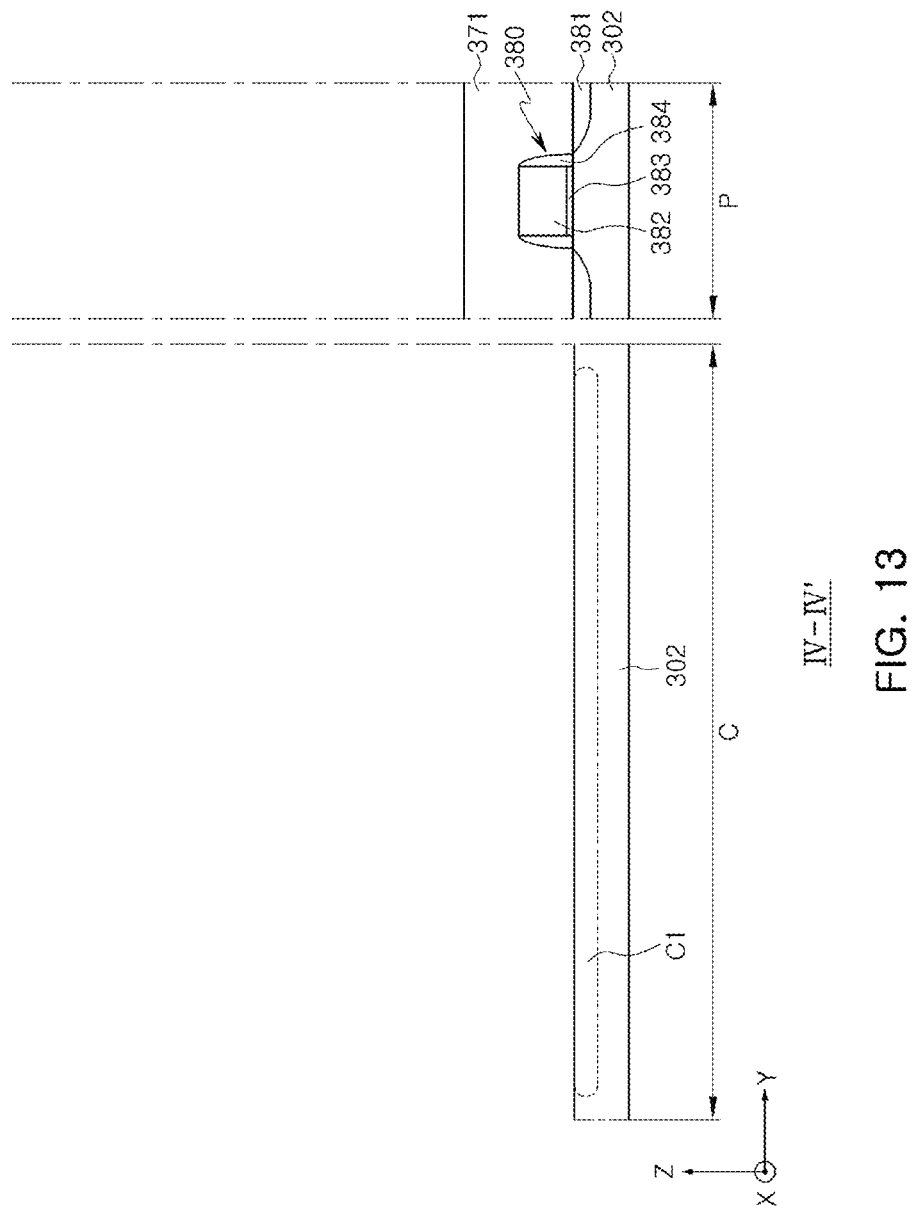

Referring to FIGS. 12 and 13, a peripheral circuit device 380 may be formed on a first region 302 in a peripheral region P. The peripheral circuit device 380 may include a peripheral source/drain region 381, a peripheral gate electrode 382, a peripheral gate insulating layer 383 and a peripheral spacer 384. The peripheral circuit device 380 may be covered by a lower insulating interlayer 371. The lower insulating interlayer 371 may include a material having an excellent gap-filling characteristic such as high density plasma (HDP) oxide.

The first region 302 may be a portion of a substrate for manufacturing a memory device and may include a semiconductor material. As an example, the first region 302 may include polysilicon. Carbon may be injected in a portion of an upper portion of the first region 302 to form a first impurity region C1 in a cell region C. The first impurity region C1 including carbon may have a lower etch rate during a wet etching process compared to other regions of the first region 302.

Figure 14:
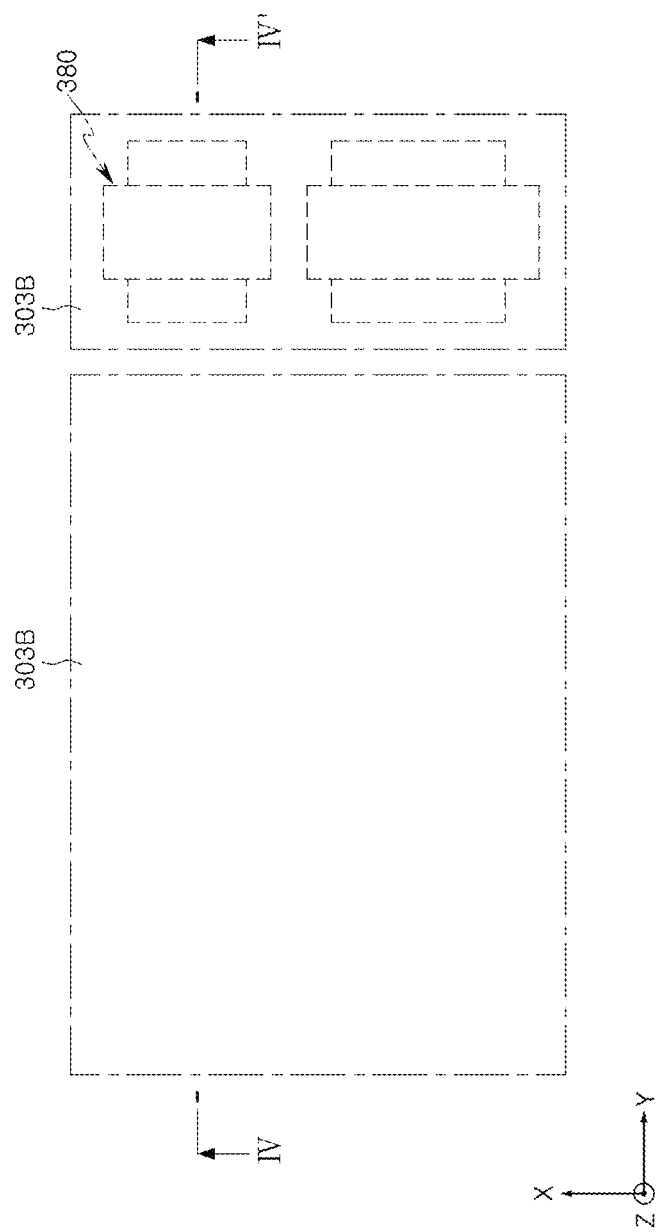
Figure 15:
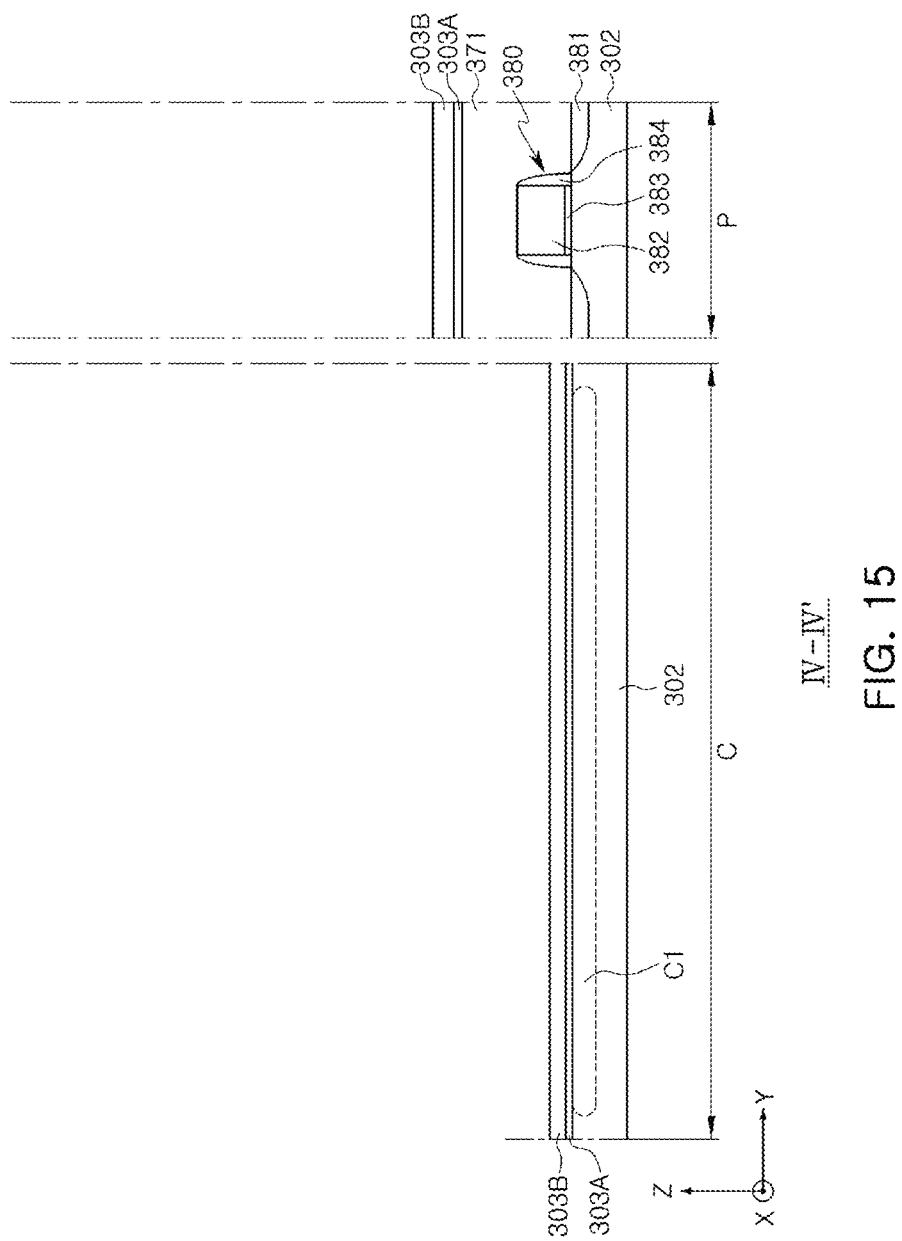

Referring to FIGS. 14 and 15, first and second sacrificial layers 303A and 303B may be formed on the first region 302. The first and second sacrificial layers 303A and 303B may be formed of an insulating material. As an example, the first sacrificial layer 303A may include silicon oxide, and the second sacrificial layer 303B may include silicon nitride. The second sacrificial layer 303B may have a greater thickness than the first sacrificial layer 303A, but is not limited thereto.

Figure 16:
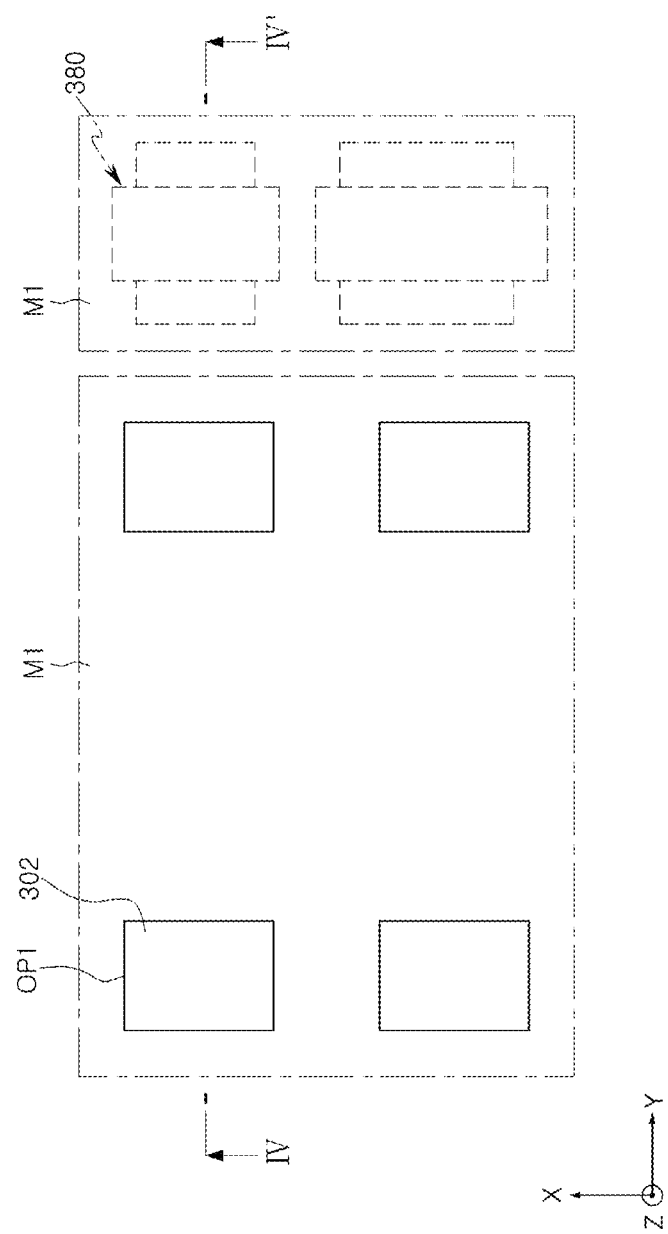
Figure 17:
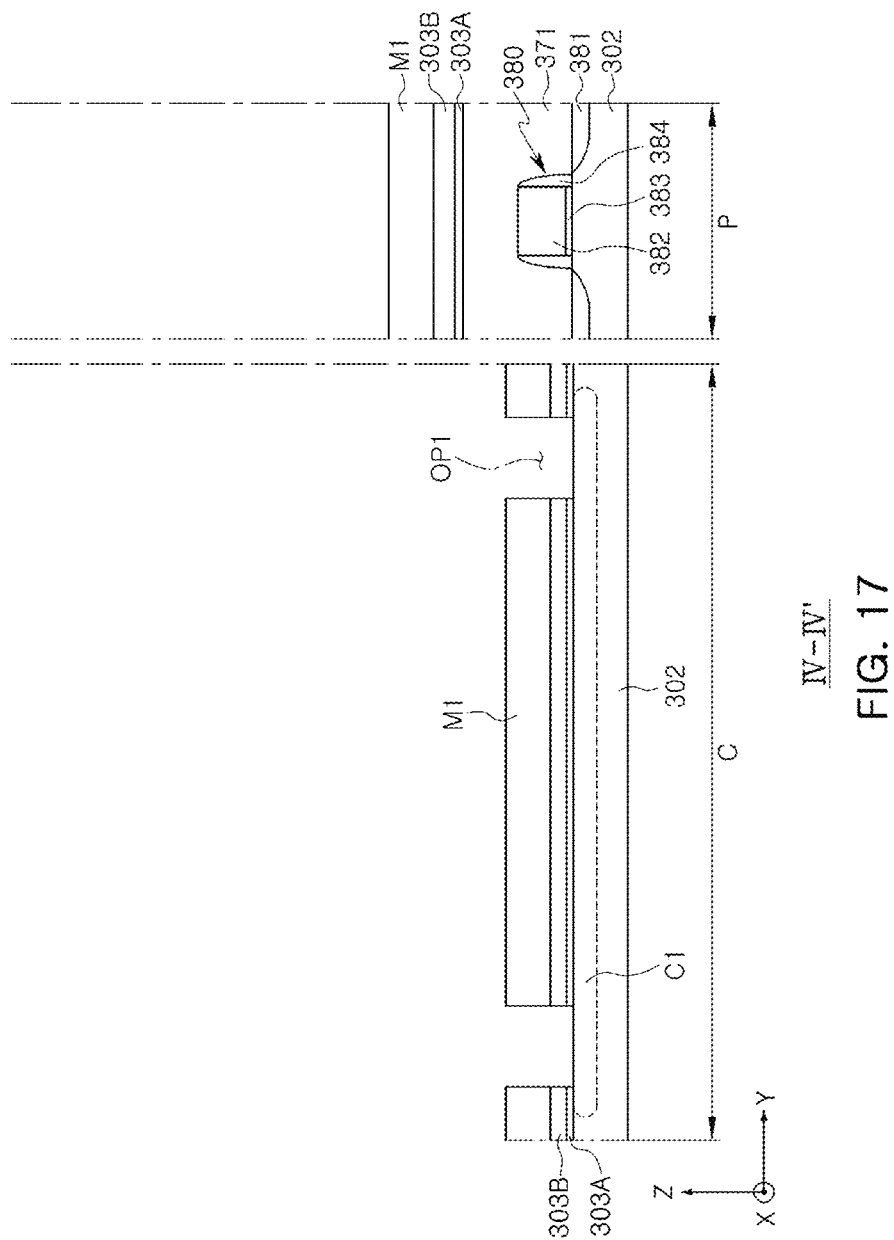

Referring to FIGS. 16 and 17, a first mask layer M1 including a plurality of first openings OP1 may be formed on the second sacrificial layer 303B. The plurality of first openings OP1 may be separated from each other as shown in FIG. 16. After forming the first mask layer M1, the first and second sacrificial layers 303A and 303B exposed to the plurality of first openings M1 may be removed to expose the first region 302 by the plurality of first openings M1.

Figure 18:
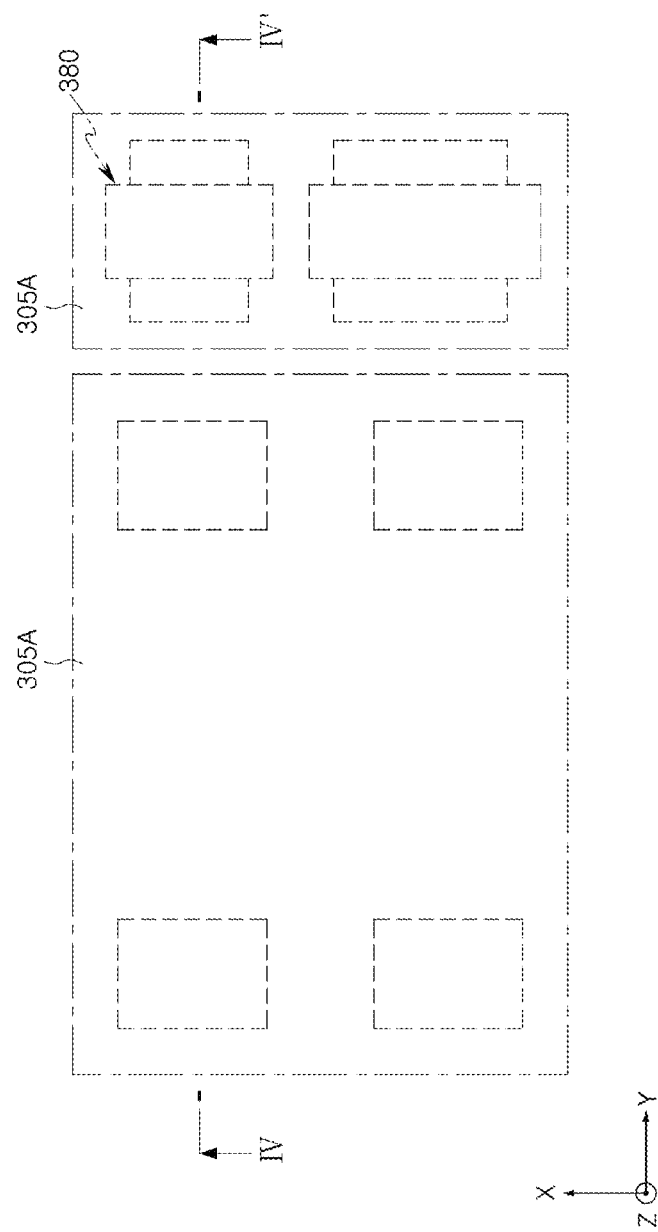
Figure 19:
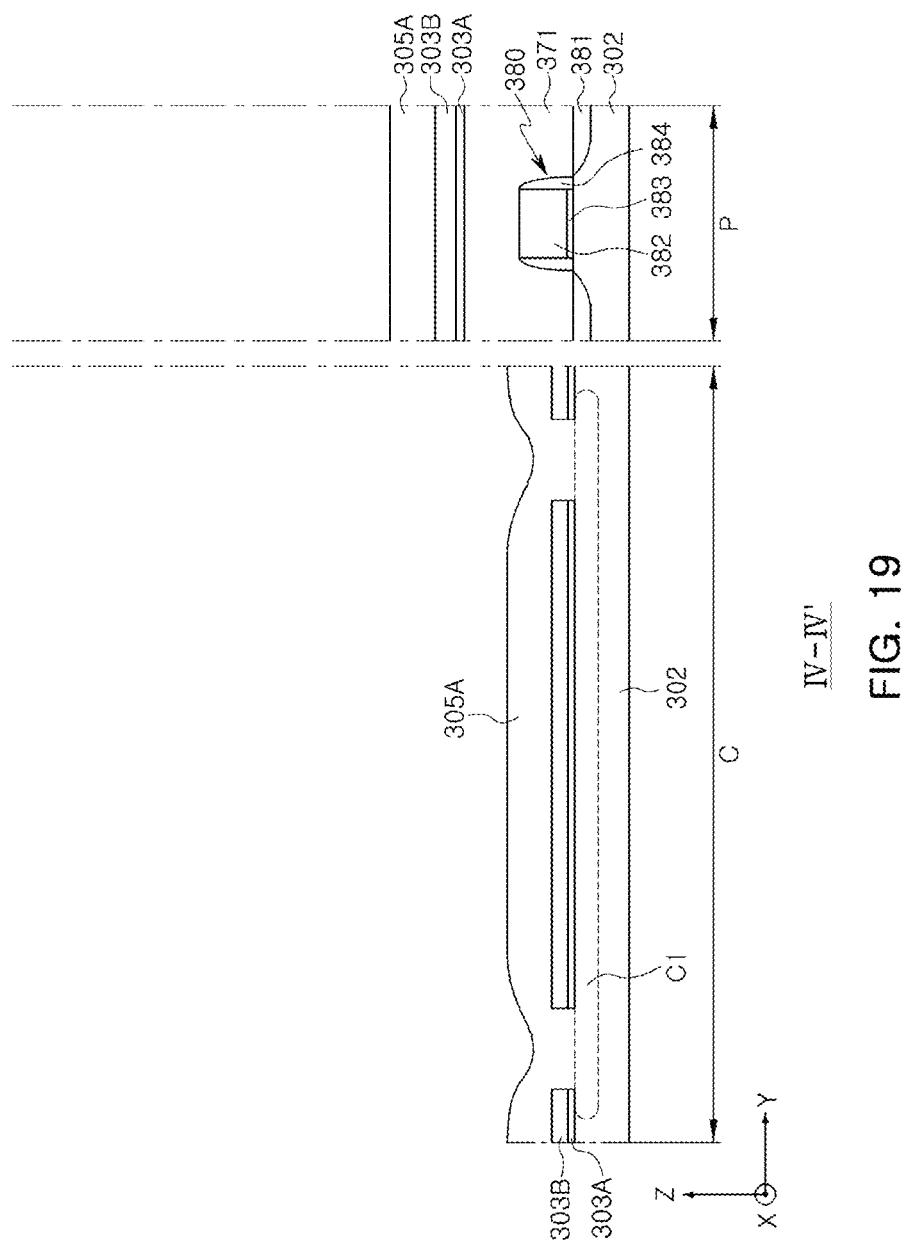
Figure 20:
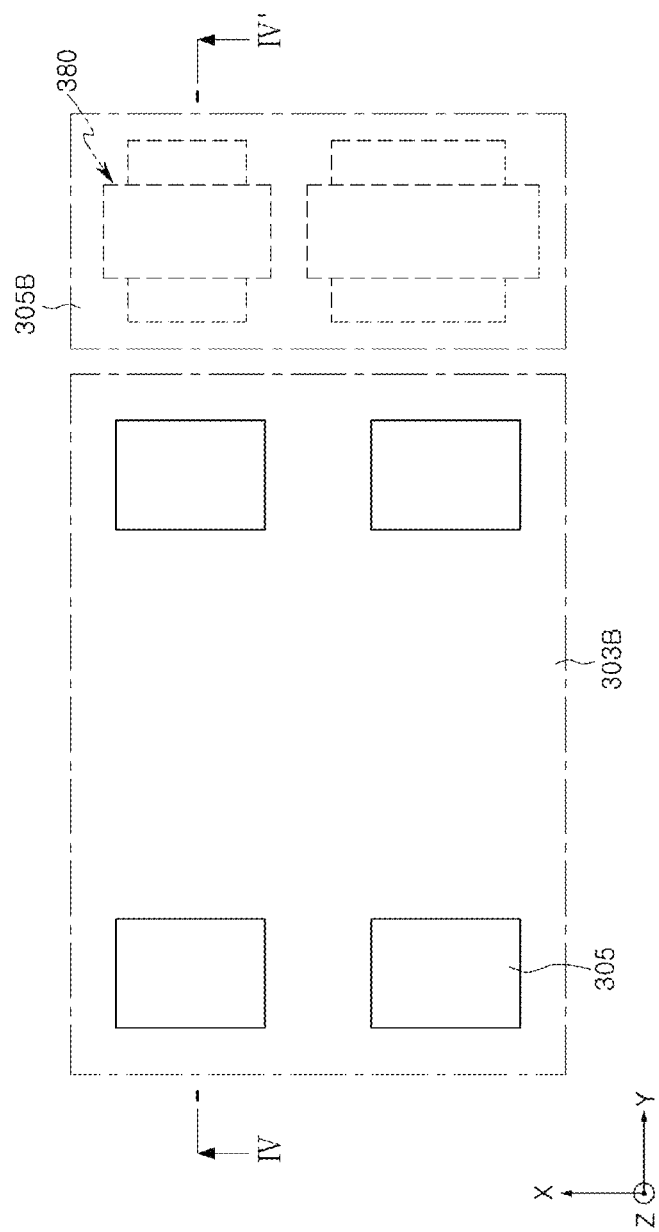
Figure 21:
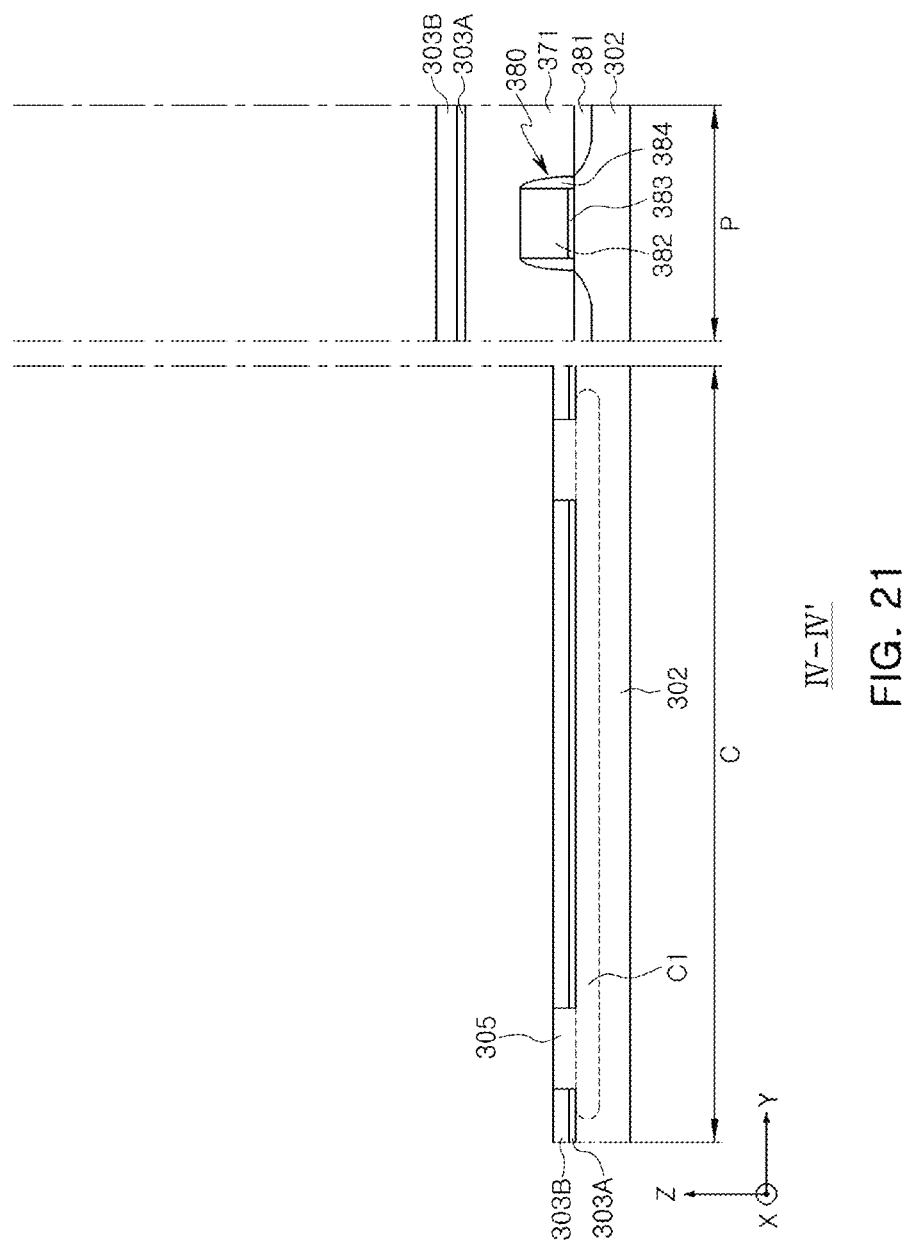

Referring to FIGS. 18 and 19, after removing the first mask layer OP1, polysilicon may be deposited on the first region 302 to form a first polysilicon layer 305A. The first polysilicon layer 305A may fill a region in which the first and second sacrificial layers 303A and 303B are removed. A chemical mechanical polishing process may be performed on the first polysilicon layer 305A to form a plurality of supporting regions 305 as shown in FIGS. 20 and 21. The plurality of supporting regions 305 may be separated from each other in an X-Y plane as shown in FIG. 20. Positions of the plurality of supporting regions 305 may correspond to respective positions of the plurality of first openings OP1 of the first mask layer M1 as described with reference to FIGS. 16 to 19. The top surfaces of the plurality of supporting regions 305 may be coplanar with a top surface of the second sacrificial layer 303B.

Figure 22:
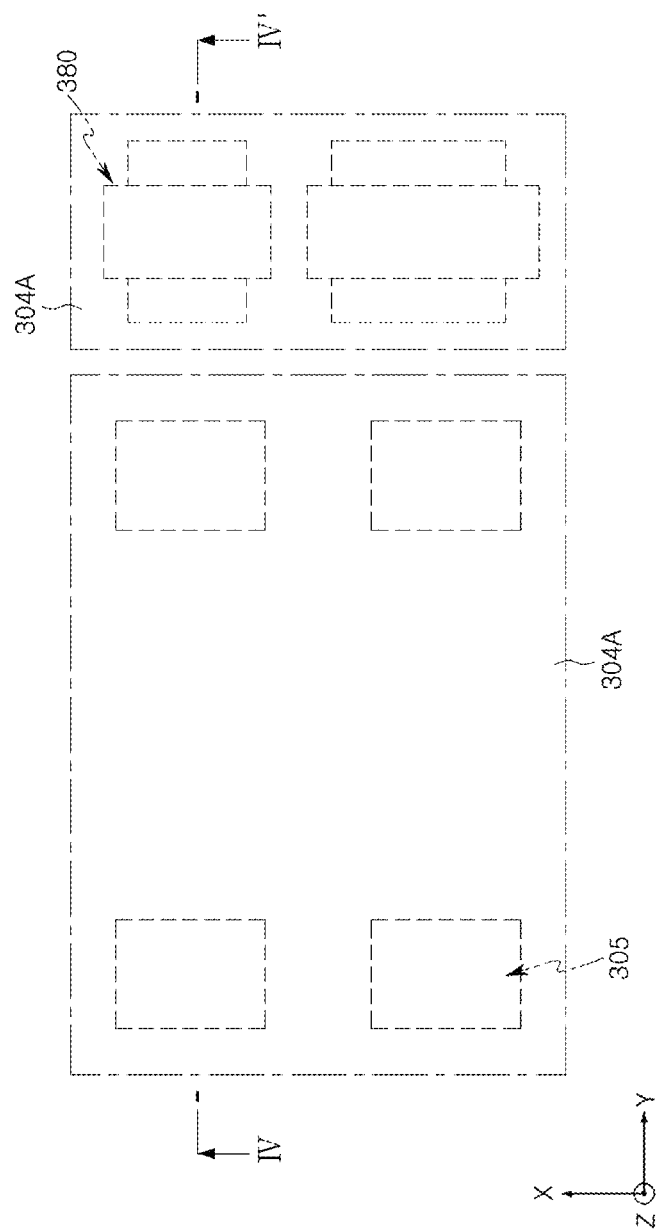
Figure 23:
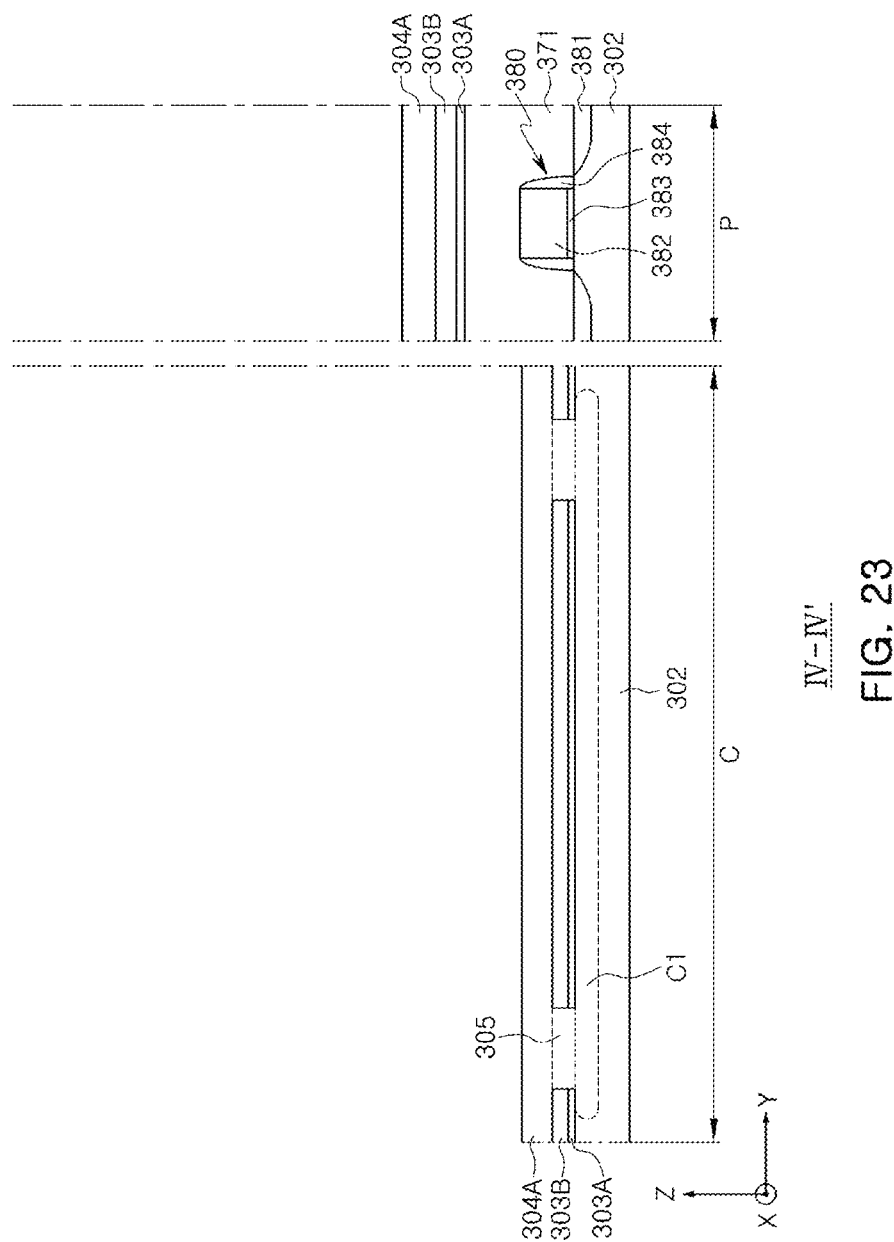

Referring to FIGS. 22 and 23, a second polysilicon layer 304A may be formed on the plurality of supporting regions 305 and the second sacrificial layer 303B. As an example, the second polysilicon layer 304A may have a thickness of several hundred Å.

Figure 24:
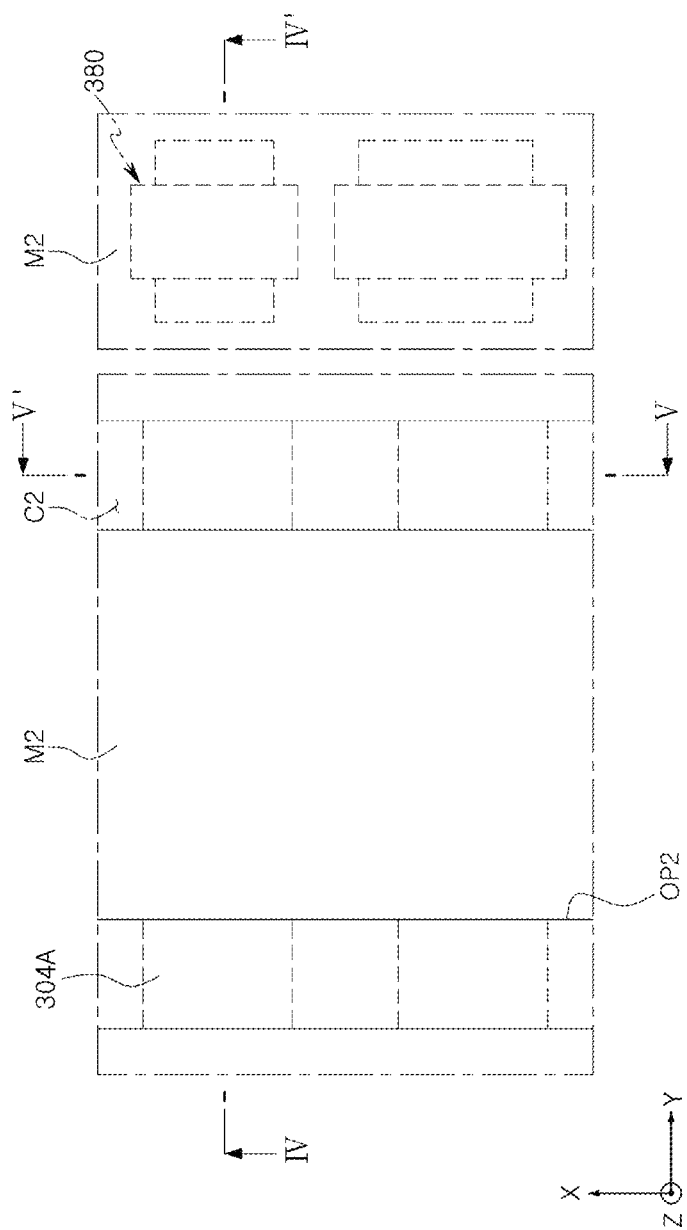
Figure 25:
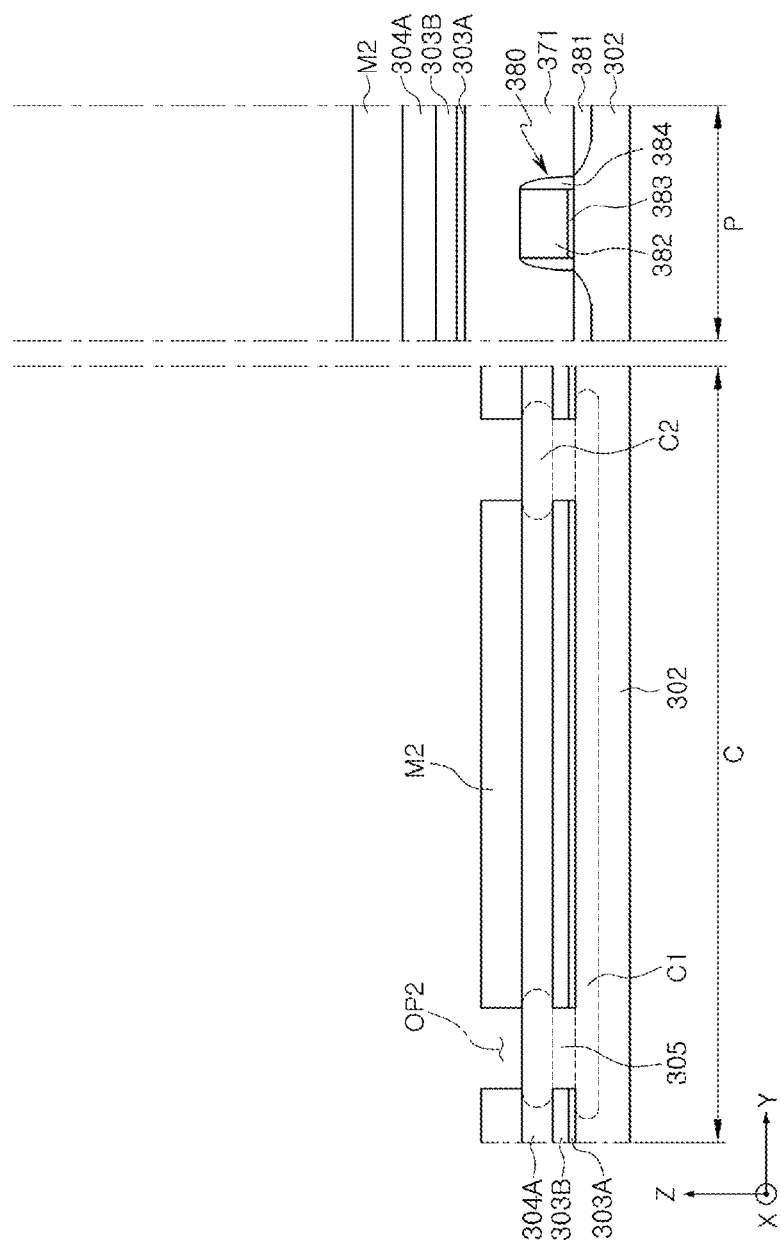
Figure 26:
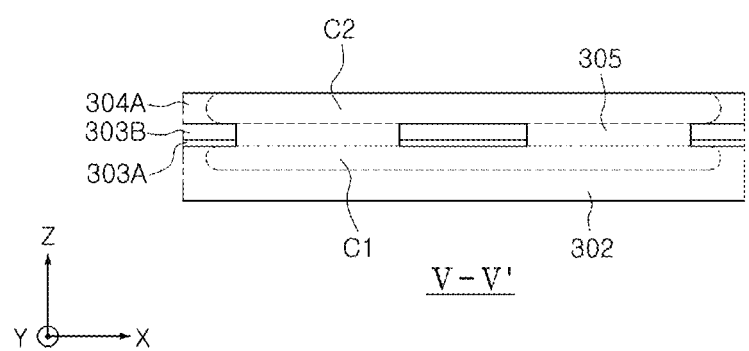

Referring to FIGS. 24 to 26, a second mask layer M2 including a plurality of second openings OP2 may be formed on the second polysilicon layer 304A. Carbon may be injected through the plurality of second openings OP2 into the second polysilicon layer 304A to form a second impurity region C2 including carbon.

The second impurity region C2 may be positioned on the plurality of supporting regions 305 as shown in FIG. 25 and may extend in a first direction (X direction) as shown in FIG. 26. The second impurity region C2 may be a region that continuously extends along the first direction compared to the plurality of supporting regions 305 that are arranged to be separated from each other along the first direction.

Figure 27:
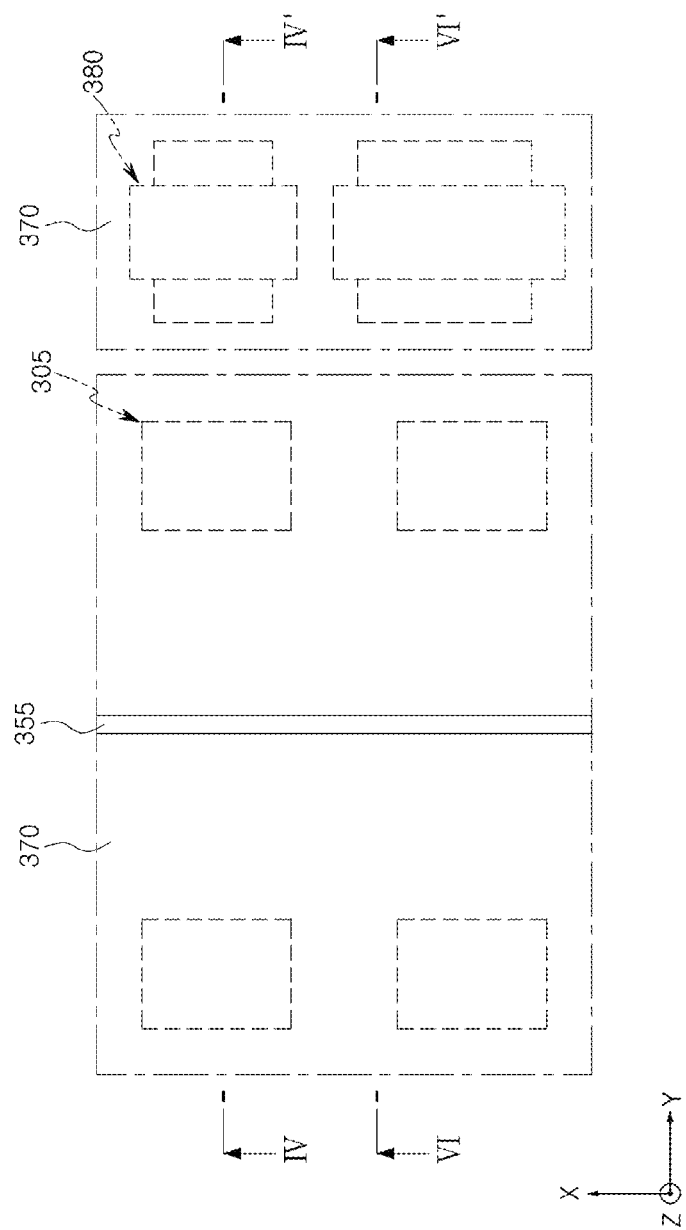
Figure 28:
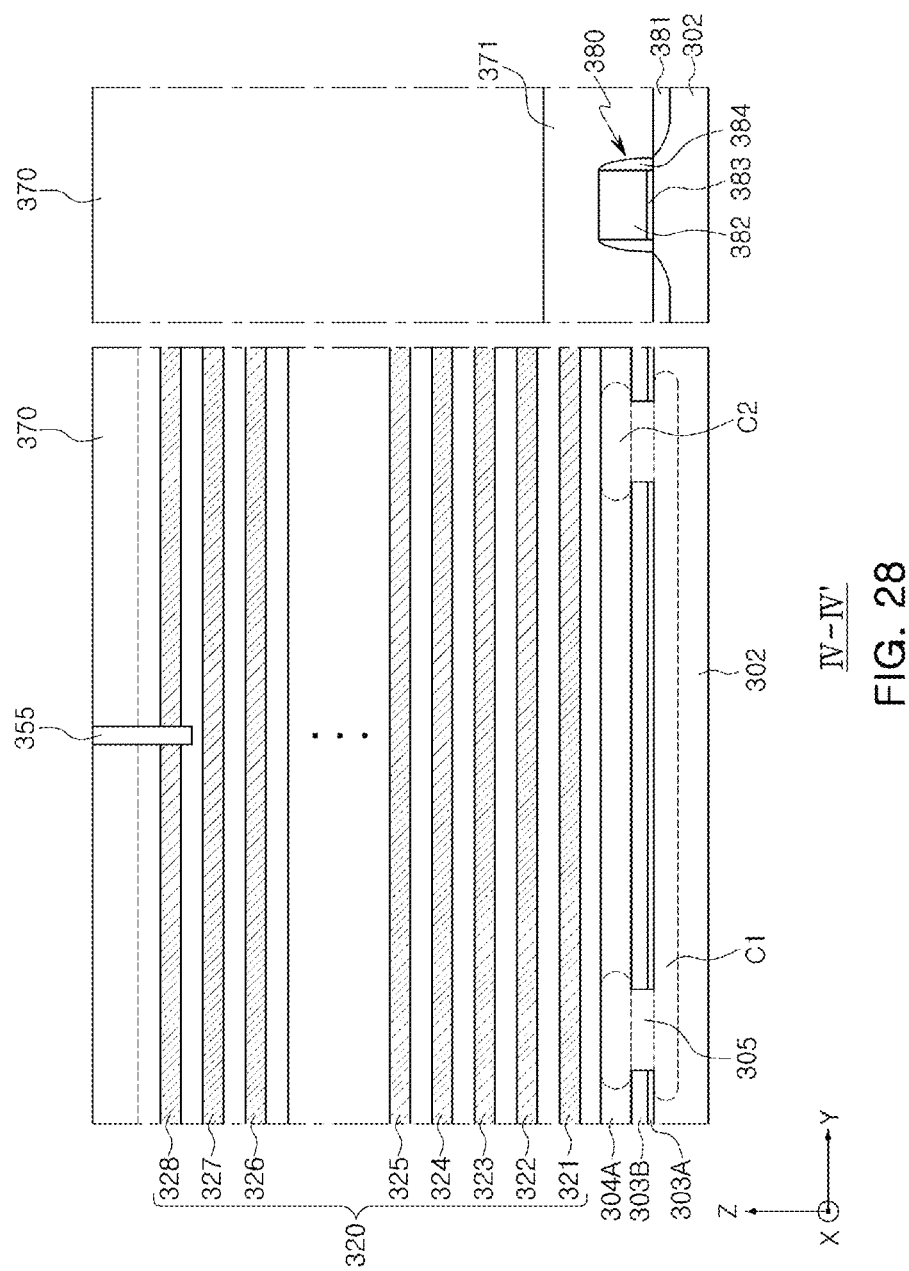
Figure 29:
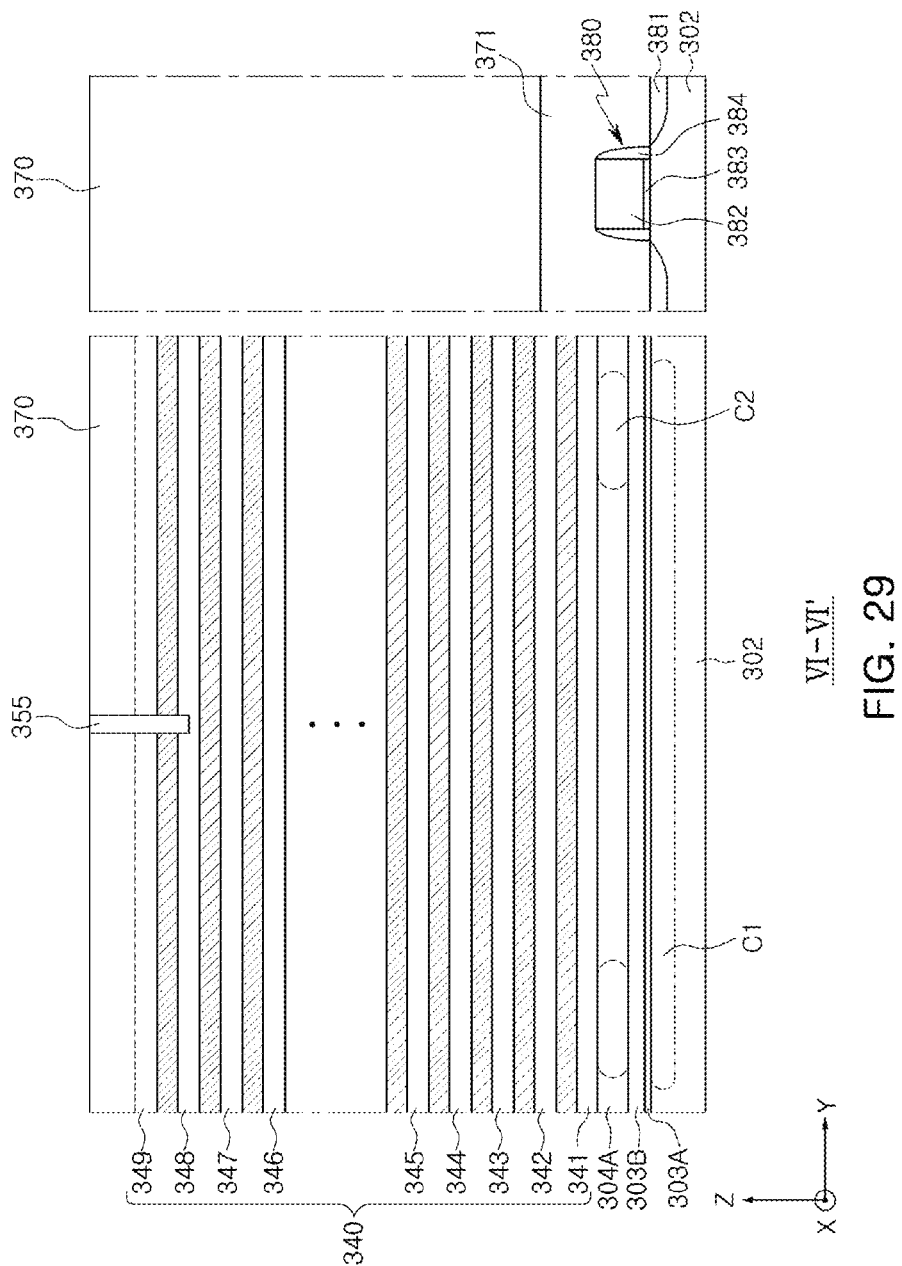

Referring to FIGS. 27 to 29, a plurality of sacrificial layers 321-328 (320) and a plurality of insulating layers 341-347 (340) may be alternately and repeatedly stacked on the second polysilicon layer 304A. In some example embodiments, before forming the plurality of sacrificial layers 320 and a plurality of insulating layers 340, the first and second sacrificial layers 303A and 303B and the second polysilicon layer 304A may be removed in the peripheral circuit region P. The number and thickness of the sacrificial layers 320 and the insulating layers 340 may be variously modified according to some example embodiments. In some example embodiments, the number of the sacrificial layers 320 may be equal to a sum of the numbers of a ground select transistor, a string select transistor, a memory cell and a dummy transistor included in a memory device.

The plurality of sacrificial layers 320 and the plurality of insulating layers 340 may extend to different lengths in a direction (X and Y directions) parallel to a top surface of the second polysilicon layer 304A, thereby forming a step structure. The step structure may be formed adjacent to the peripheral circuit region P. After forming the step structure, an insulating interlayer 370 may be formed on the plurality of sacrificial layers 320 and the plurality of insulating layers 340. The insulating interlayer 370 may be formed on the lower insulating interlayer 371 in the peripheral region P. The insulating interlayer 370 may include silicon oxide such as HDP oxide or Tetra-Ethyl-Ortho-Silicate (TEOS) oxide, or silicon nitride.

A separation insulating layer 355 may be formed in the cell region C. The separation insulating layer 355 may extend in the first direction (X direction) and extend downwardly from a top surface of the insulating interlayer 370 to divide an uppermost sacrificial layer 328 into a plurality of patterns. The uppermost sacrificial layer 328 may be replaced with a gate electrode layer of the string select transistor.

Figure 30:
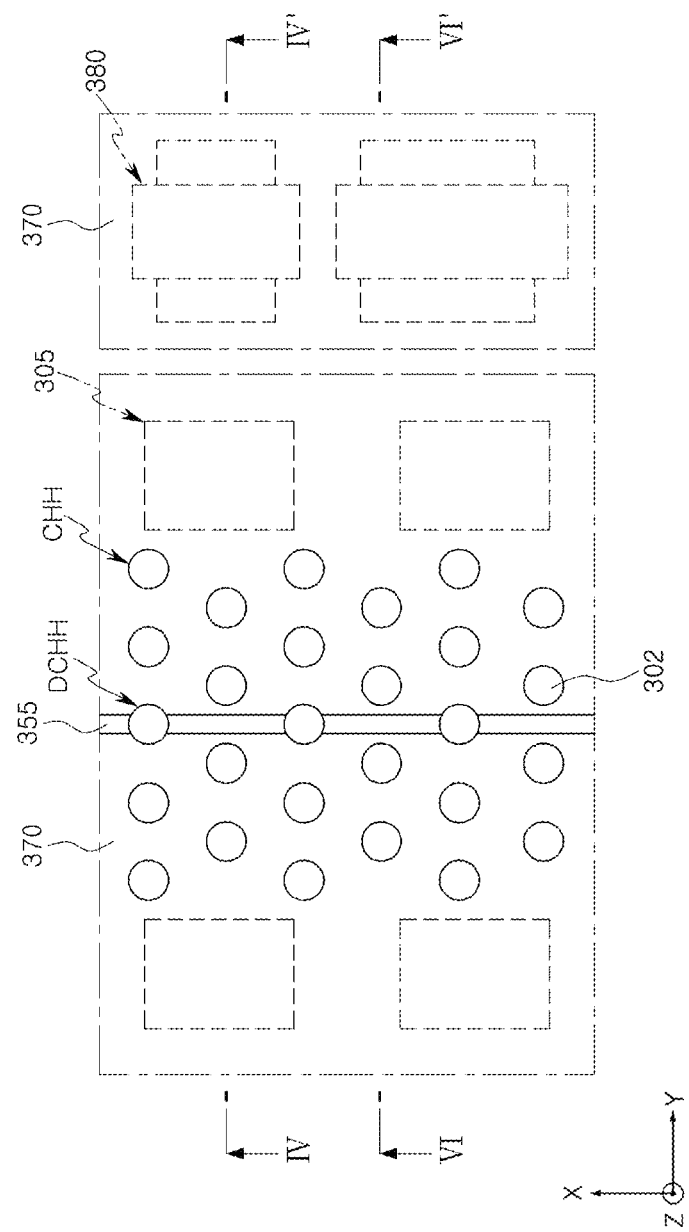
Figure 31:
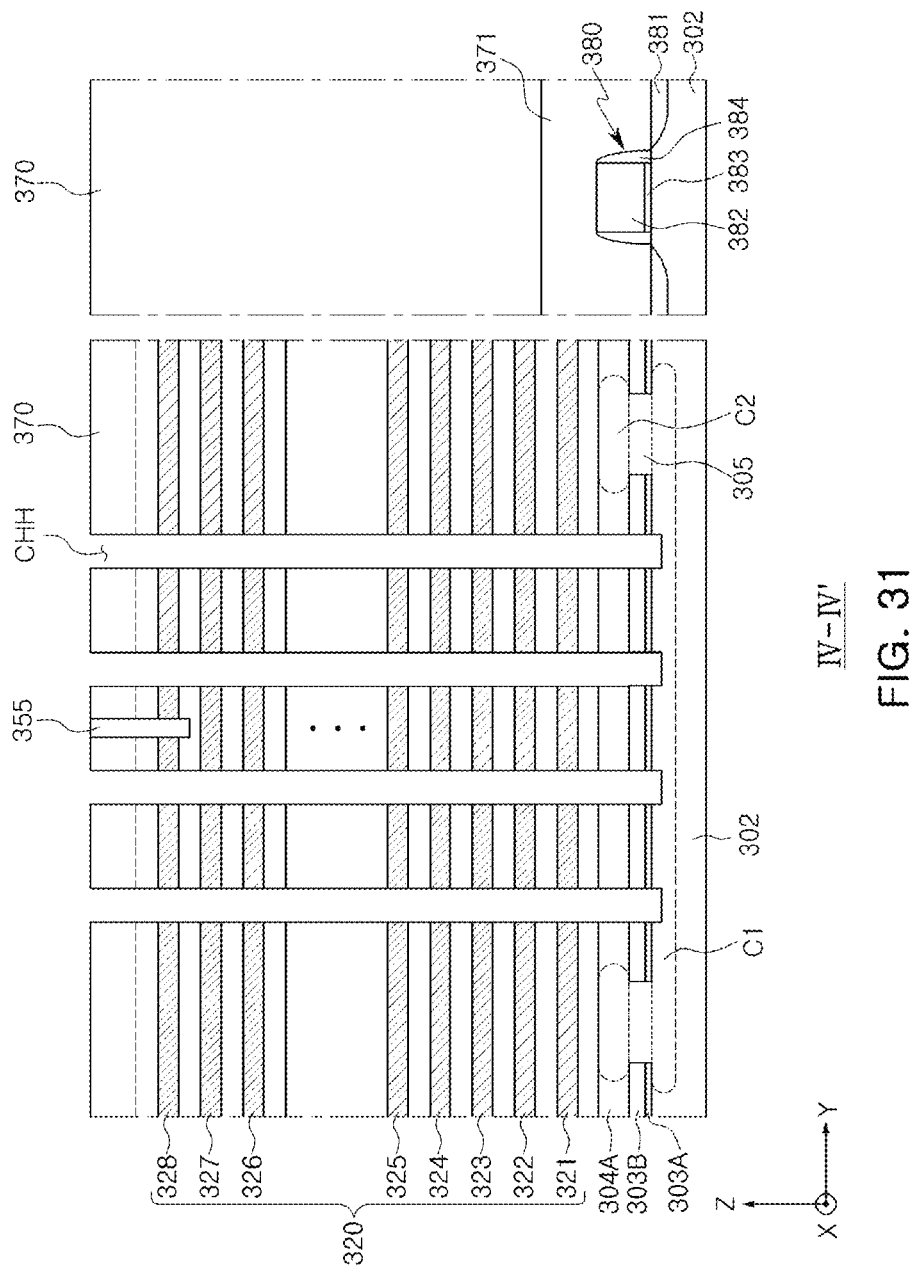
Figure 32:
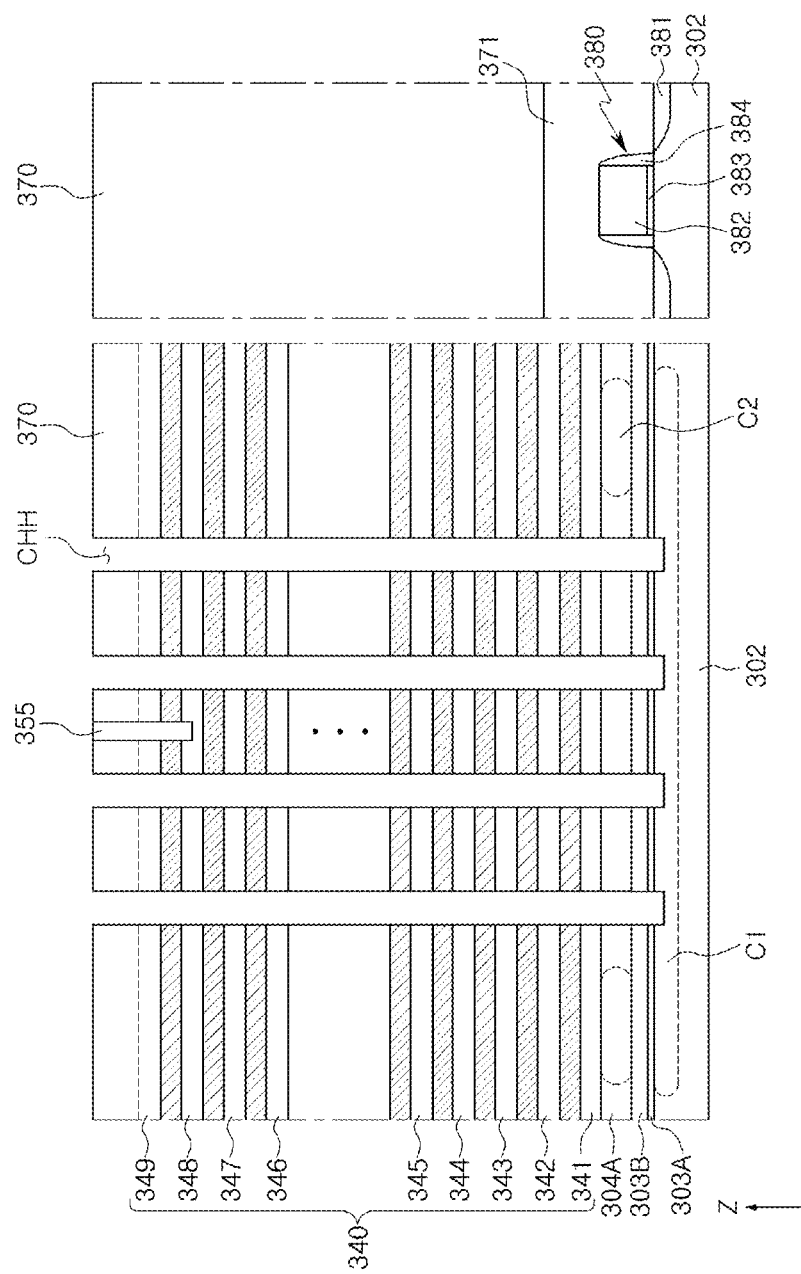

Referring to FIGS. 30 to 32, a plurality of channel holes CHH and a plurality of the dummy channel holes DCHH may be formed in a region for forming a channel structure and a dummy channel structure. As shown in FIG. 30, the plurality of channel holes CHH may be arranged to be separated from each other on the first region 302 on which the plurality of supporting regions 305 are not formed. The plurality of dummy channel holes DCHH may be formed to be arranged in the first direction (X direction) at an arrangement position of the separating insulating layer 355. The plurality of channel holes CHH may be formed to penetrate the insulating interlayer 370, the plurality of sacrificial layers 320 and the plurality of insulating layers 340. The plurality of dummy channel holes DCHH may be formed to penetrate the separation insulating layer 355 in addition to the plurality of sacrificial layers 320 and the plurality of insulating layers 340. The plurality of channel holes CHH and the plurality of the dummy channel holes DCHH may extend to penetrate the second polysilicon layer 304A and the first and second sacrificial layers 303A and 303B. Accordingly, the first region 302 may be exposed by the plurality of channel holes CHH and the plurality of dummy channel holes DCHH. As the number of the sacrificial layers 320 and the insulating layers 340 increase, the plurality of channel holes CHH and the plurality of dummy channel holes DCHH may have a taper shape with a narrow width closer to the second polysilicon layer 304A along a depth direction (Z direction).

Figure 33:
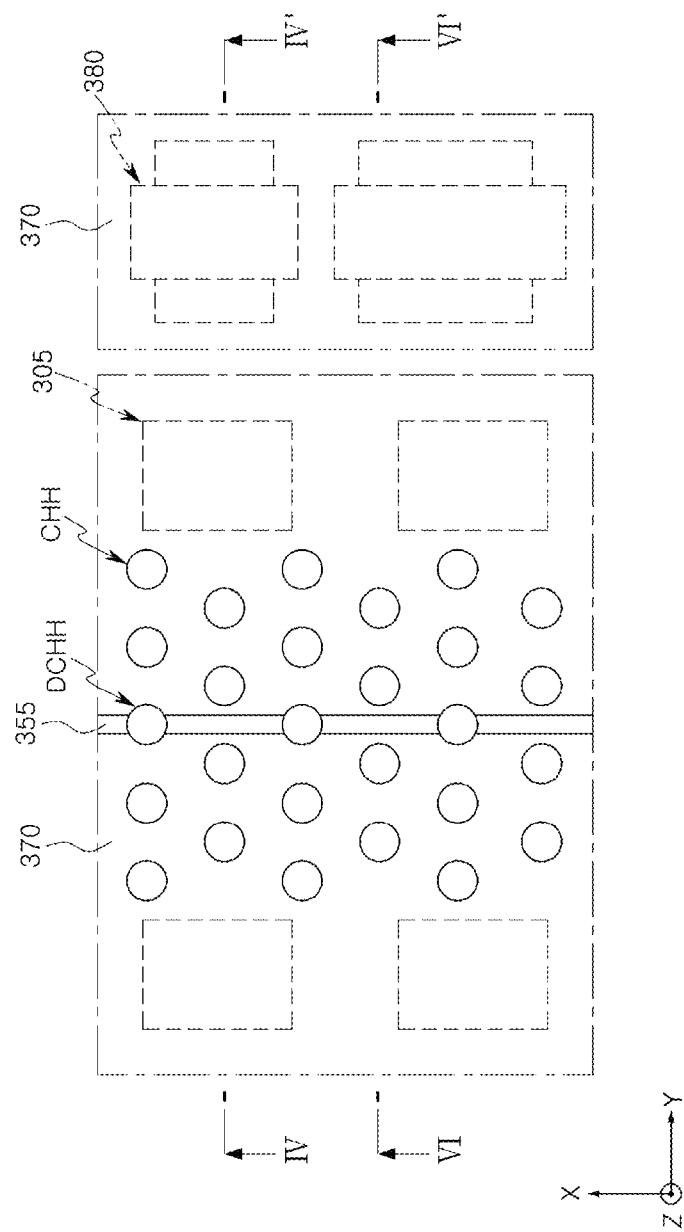
Figure 34:
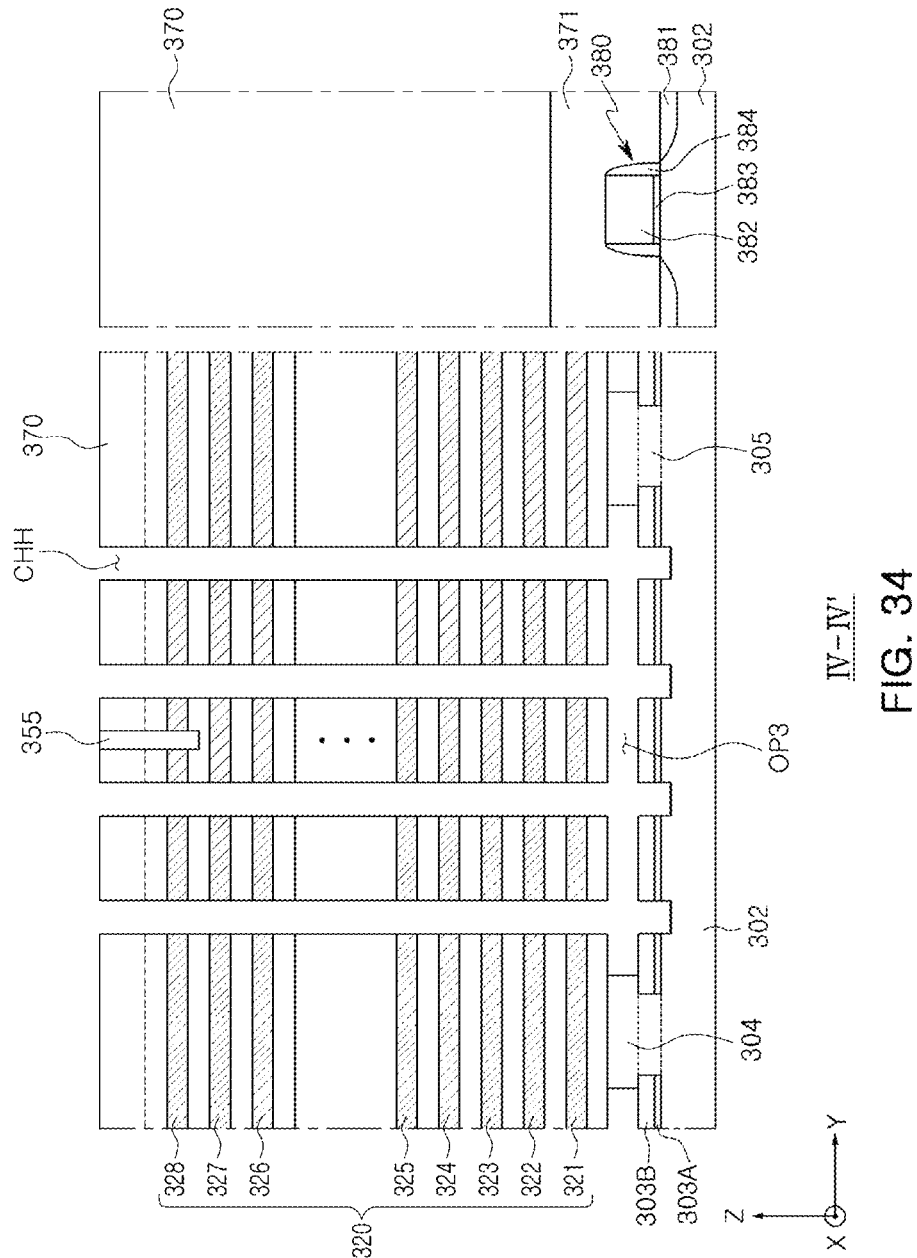
Figure 35:
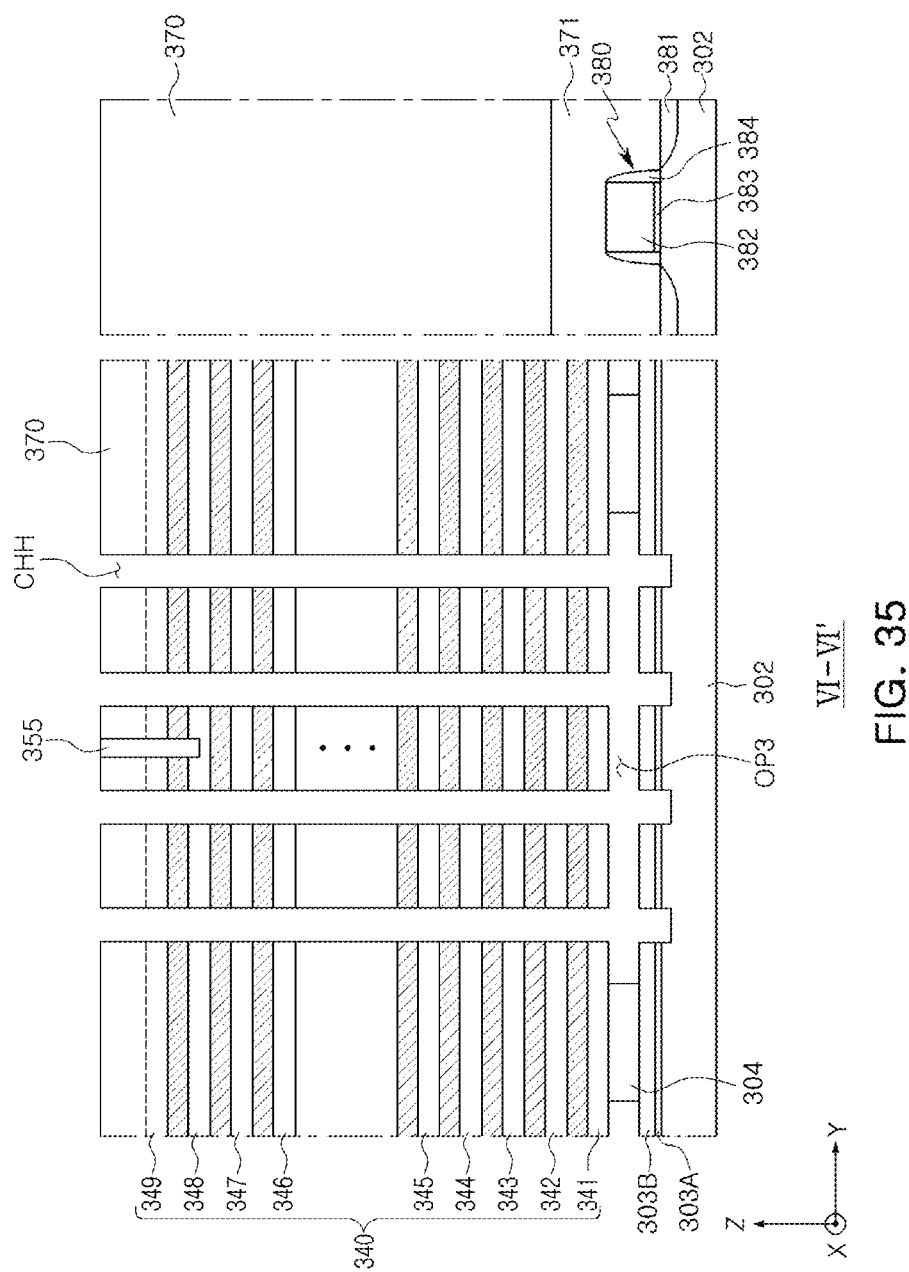
Figure 36:
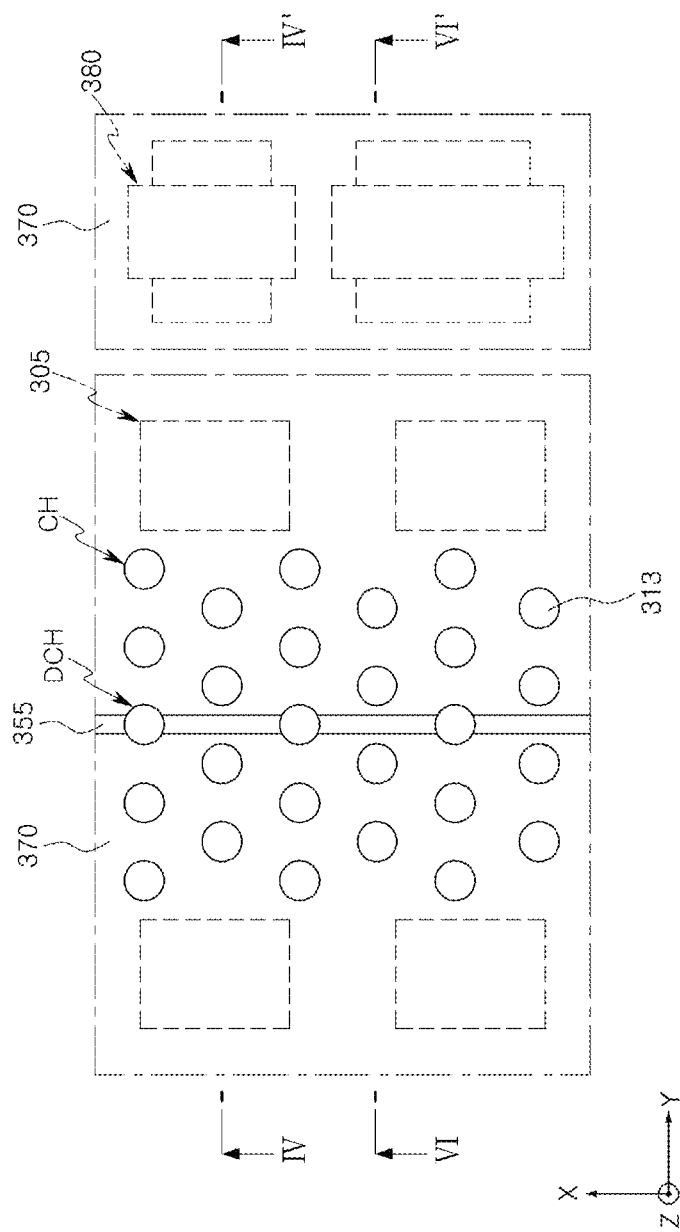

Referring to FIGS. 33 to 35, a wet etch may be performed through the plurality of channel holes CHH and the plurality of dummy channel holes DCHH, and thus a portion of the second polysilicon layer 304A exposed by the plurality of channel holes CHH and the plurality of dummy channel holes DCHH may be removed. A portion of the second poysilicon layer 304A remaining without being removed may be provided as a third region 304. The plurality of supporting regions 305 or the first and second sacrificial layers 303A and 303B may be disposed between the third region 304 and the first region 302.

The third region 304 remaining without being removed by the wet etch may correspond to the second impurity region C2 including carbon. That is, a width (or a length in the Y direction) of the third region 304 may be substantially equal to a width of the second region C2 in the Y direction. In some example embodiments, since a ploysilicon layer in which carbon is injected may have a lower etch rate compared to a polysilicon layer in which carbon is not injected, the second impurity region C2 including carbon may not be removed during the wet etching process such that a portion of the second polysilicon layer 304A may remain to form the third trigon 304.

The second polysilicon 304A may be removed except for the third region 304, thereby forming a third opening OP3. By the third opening OP3 between the plurality of sacrificial layers 320 and the second sacrificial layer 303B, the plurality of channel holes CHH may be connected to each other.

Figure 37:
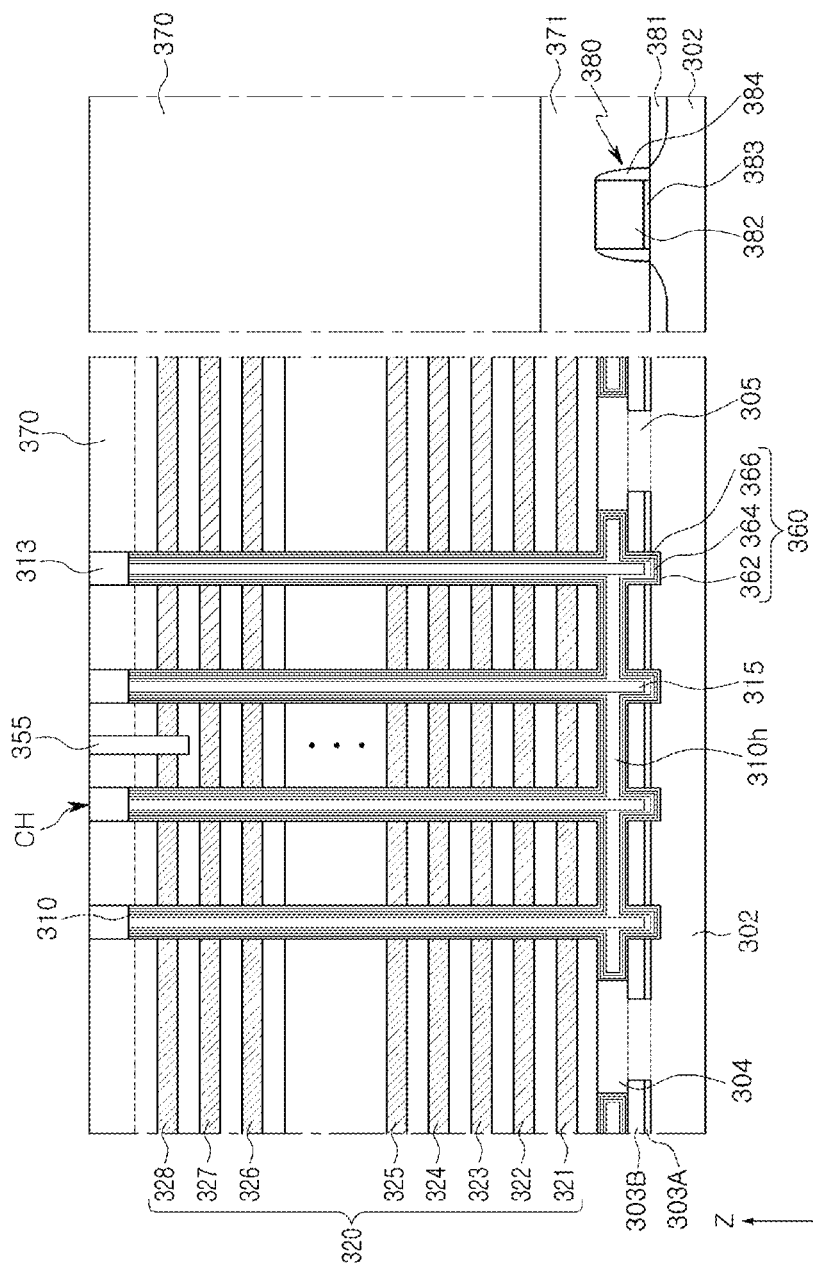
Figure 38:
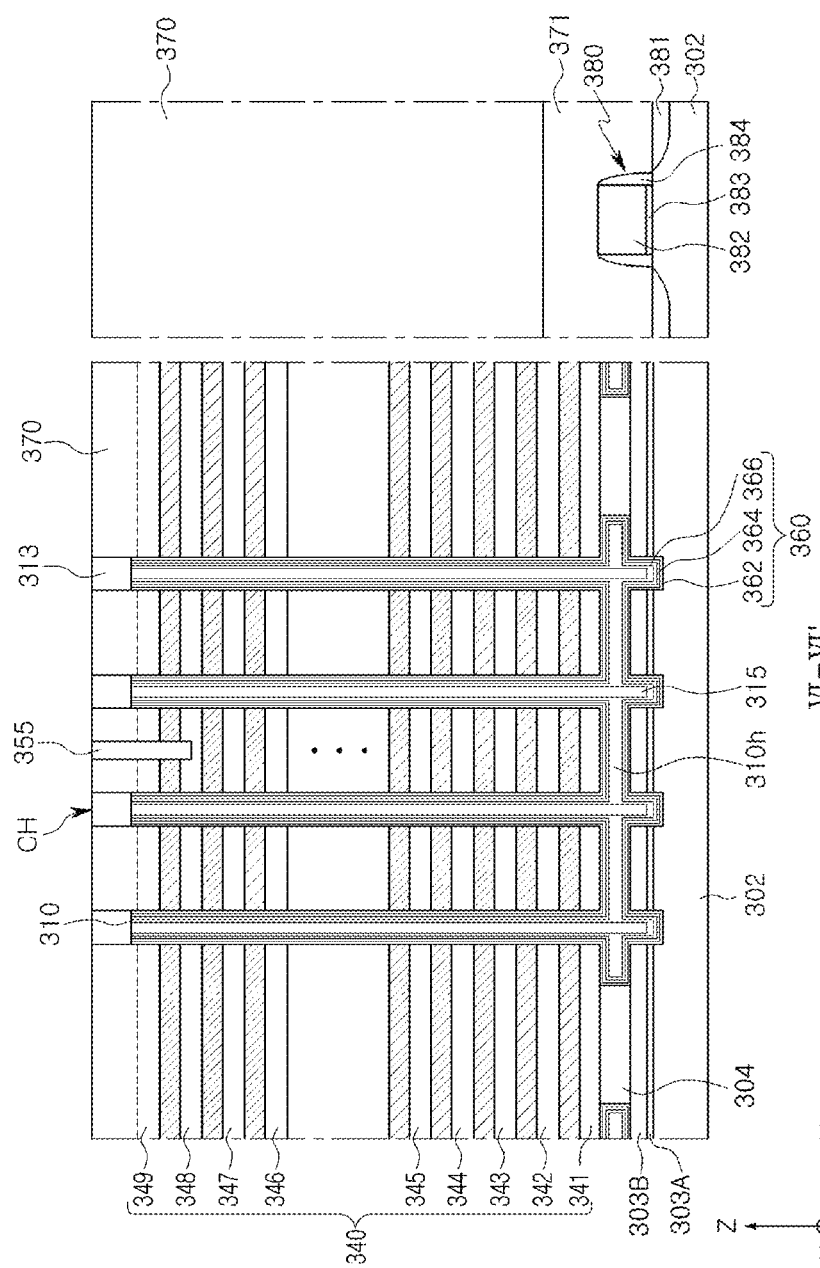

Referring to FIGS. 37 and 38, a gate insulating layer 360, a channel layer 310 and a drain region 313 may be formed in respective ones of the plurality of channel holes CHH to form a channel structure CH. A dummy channel structure DCH may be formed in respective ones of the plurality of dummy channel holes DCHH to have a similar structure to the channel structure CH. A plurality of channel structures CH and a plurality of dummy channel structures DCH may be formed on the first region 302.

A process of forming the channel structure CH and the dummy channel structure DCH include forming the gate insulating layer 360 in the plurality of channel holes CHH and the plurality of dummy channel holes DCHH.

The gate insulating layer 360 may include a blocking layer 362, a charge storage layer 364 and a tunnel layer 366 and may be formed by an atomic layer deposition (ALD) process or a chemical vapor deposition (CVD) process to fill a portion of each of the plurality of channel holes CHH and a portion of each of dummy channel holes DCHH. The gate insulating layer 360 may also be formed in the third openings OP3. Accordingly, the gate insulating layer 360 may contact the first region 302 below the plurality of channel holes CHH.

As an example, the blocking layer 362 may include a high-k dielectric material of which a dielectric constant is higher than that of silicon oxide. The tunnel layer 366 may be configured to allow charge to tunnel through by F-N tunneling and move into the charge storage layer 364. The tunnel layer 366 may include, for example, silicon oxide.

In some example embodiments, the blocking layer 362 may include a silicon oxide ($SiO_2$), silicon nitride ($Si_3N_4$), silicon oxynitride (SiON) or a high-k dielectric material. The high-k dielectric material may include at least one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$). The blocking layer 362 may be formed of a single layer, but is not limited there to. For example, the blocking layer 362 may be formed of a multilayer including a high-k dielectric layer and a low-k dielectric layer that have dielectric constants different from each other. In this case, the low-k dielectric layer may be near the charge storage layer 364, and the high-k dielectric layer may have a higher permittivity than the tunnel layer 366. The low-k dielectric layer may be disposed on a side of the high-k dielectric layer to adjust energy band such as barrier height such that a characteristic (e.g., an erase characteristic) of a nonvolatile memory device may be improved.

The charge storage layer 364 may be a charge trap layer or a floating gate conductive layer. When the charge storage layer 364 is a floating gate conductive layer, the charge storage layer 364 may be formed of polysilicon deposited by a low pressure chemical vapor deposition (LPCVD) process. When the charge storage layer 364 is a charge trap layer, the charge storage layer 364 may include a dielectric material, for example, at least one of silicon oxide ($SiO_2$), silicon nitride ($Si_3N_4$), silicon oxynitride (SiON), hafnium oxide ($HfO_2$), zirconium oxide ($ZrO_2$), tantalum oxide ($Ta_2O_3$), titanium oxide ($TiO_2$), hafnium aluminum oxide ($HfAl_xO_y$), hafnium tantalum oxide ($HfTa_xO_y$), hafnium silicon oxide ($HfSi_xO_y$), aluminum nitride ($Al_xN_y$) and aluminum gallium nitride ($AlGa_xN_y$). In some example embodiments, the charge storage layer 364 may include quantum dots or nanocrystals. Here, the quantum dots or the nanocrystals may be formed of metal nanoparticles or semiconductor nanoparticles.

The tunnel layer 366 may include at least one of silicon oxide ($SiO_2$), silicon nitride ($Si_3N_4$), silicon oxynitride (SiON), hafnium oxide ($HfO_2$), hafnium silicon oxide ($HfSi_xO_y$), aluminum oxide ($Al_2O_3$) and zirconium oxide ($ZrO_2$).

The channel layer 310 may be formed on the inside of gate dielectric layer 360 and may include polysilicon. As an example, the channel layer 310 may be formed on the inside of the tunnel layer 366 that is formed last among the layers included in the gate insulating layer 360. The channel layer 310 may have a thickness in a range of about 1/50 to 1/5 of a diameter of the channel hole CHH. The channel layer 310 may be formed by an ALD process or a CVD process.

The channel layer 310 may have a hollow cylinder shape. A buried insulating layer 315 may be formed inside the channel layer 310. In some example embodiments, before forming the buried insulating layer 315, a hydrogen annealing process processing at a gas atmosphere containing hydrogen or deuterium may be further performed on a structure having the channel layer 310. A large number of crystal defects exiting in the channel layer 310 may be cured by the hydrogen annealing process. A drain region 313 formed of a conductive material such as polysilicon may be formed on the channel layer 310.

A horizontal channel layer 310h may be formed to fill a portion of the third opening OP3 that is not filled by the gate insulating layer 360. The horizontal channel layer 310h may extend from the channel layer 310 and may include polysilicon. Accordingly, a plurality of channel layers 310 separated from each other in the X-Y plane may be integrally connected to each other by the horizontal channel layer 310h, thereby forming a monolithic layer.

Figure 39:
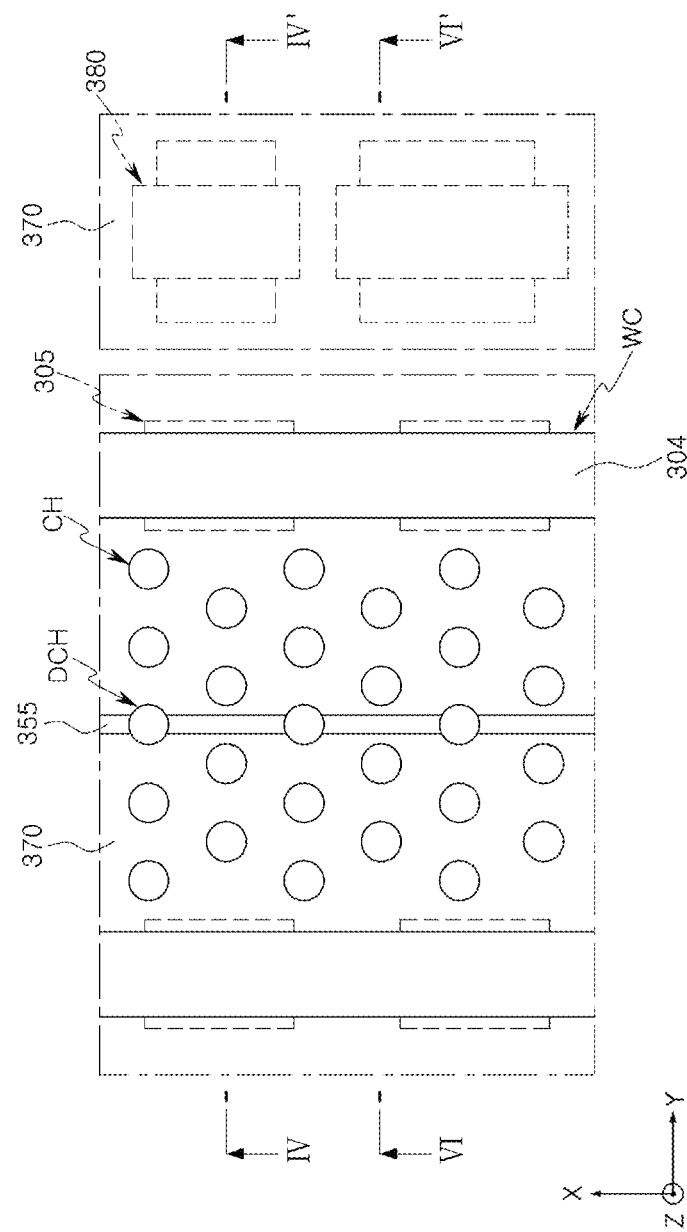
Figure 40:
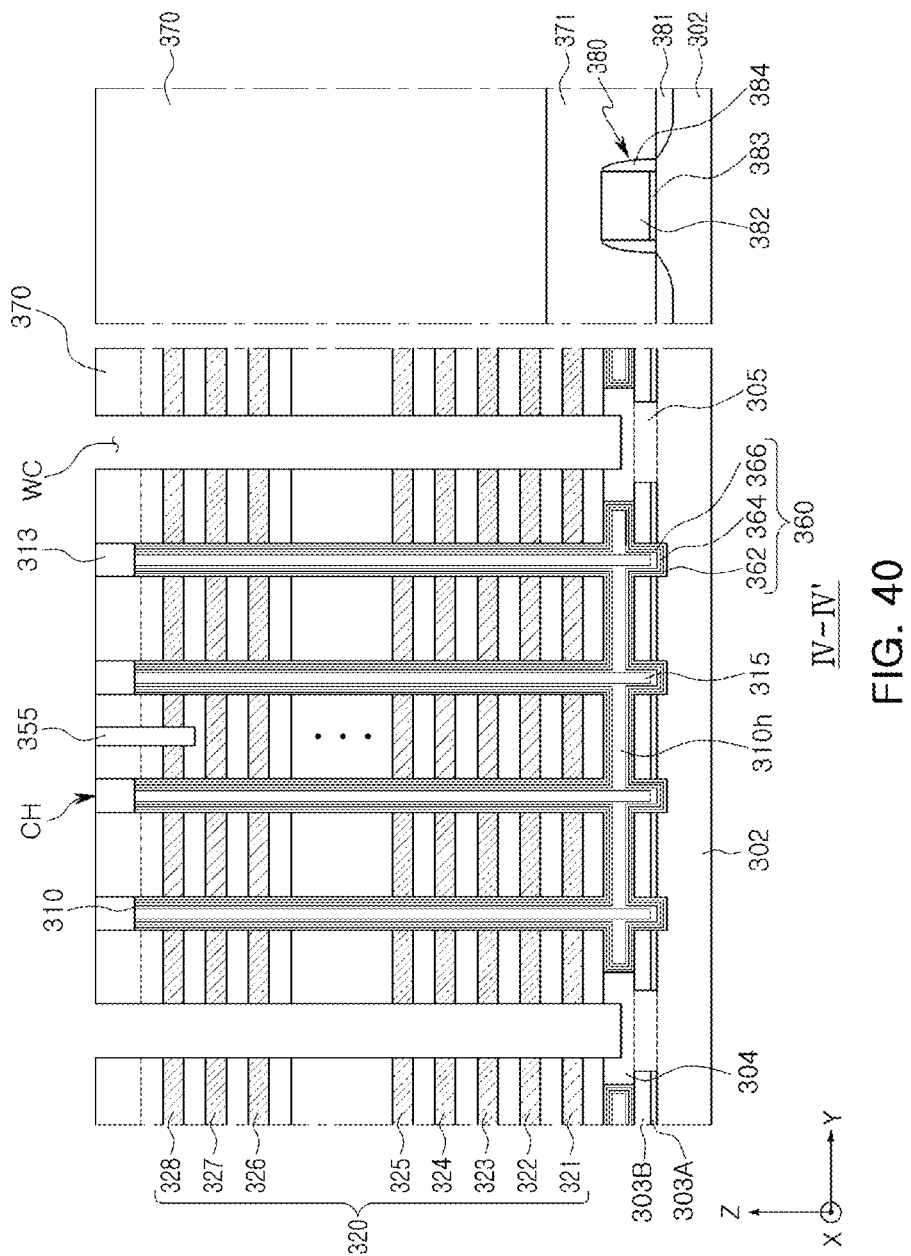
Figure 41:
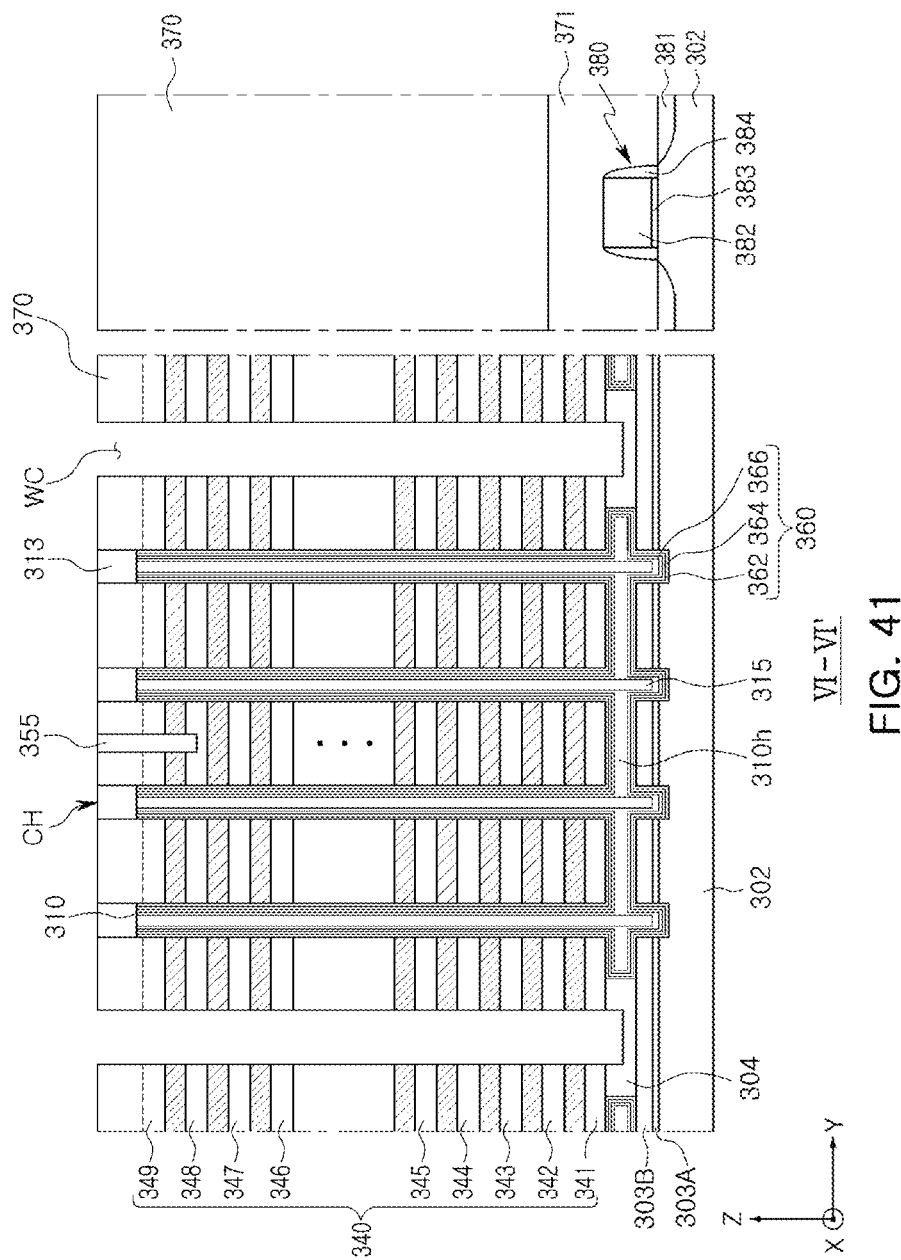

Referring to FIGS. 39 to 41, a word line cut WC may be formed. The word line cut WC may be formed at a region in which a common source line is to be formed in the following process. The third region 304 may be exposed at a bottom of the word line cut WC, and the plurality of sacrificial layers 320 and the plurality of insulating layers 340 may be exposed at an inner sidewall of the word line cut WC.

Figure 42:
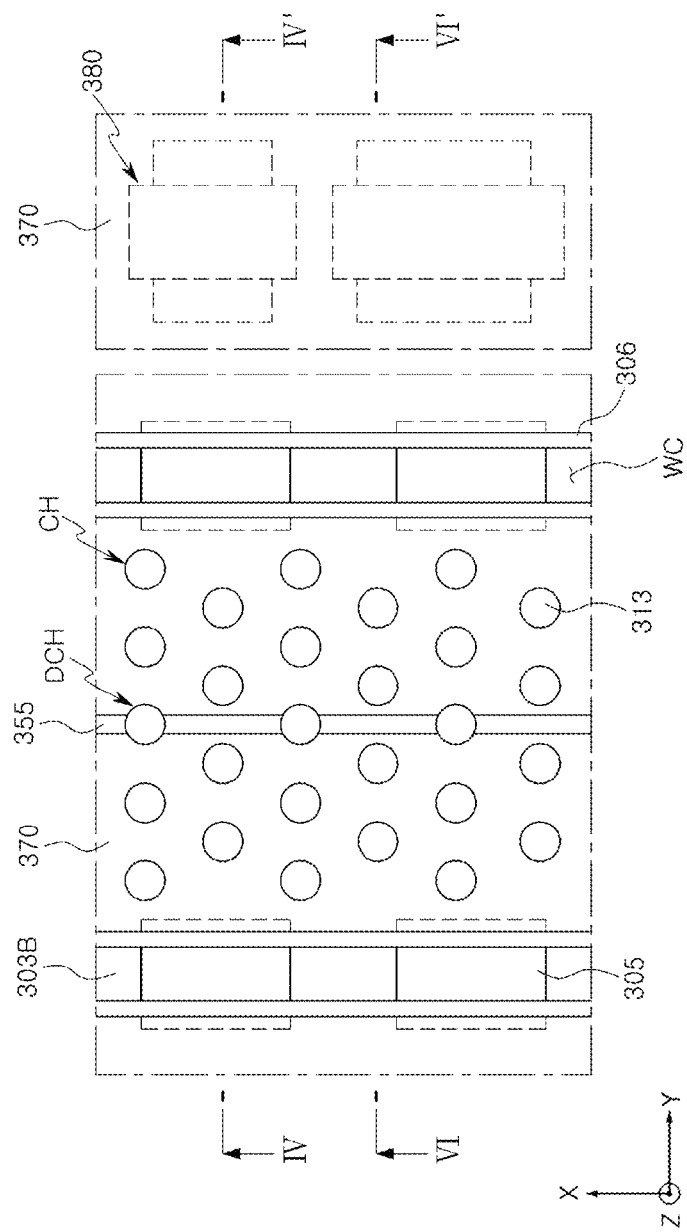
Figure 43:
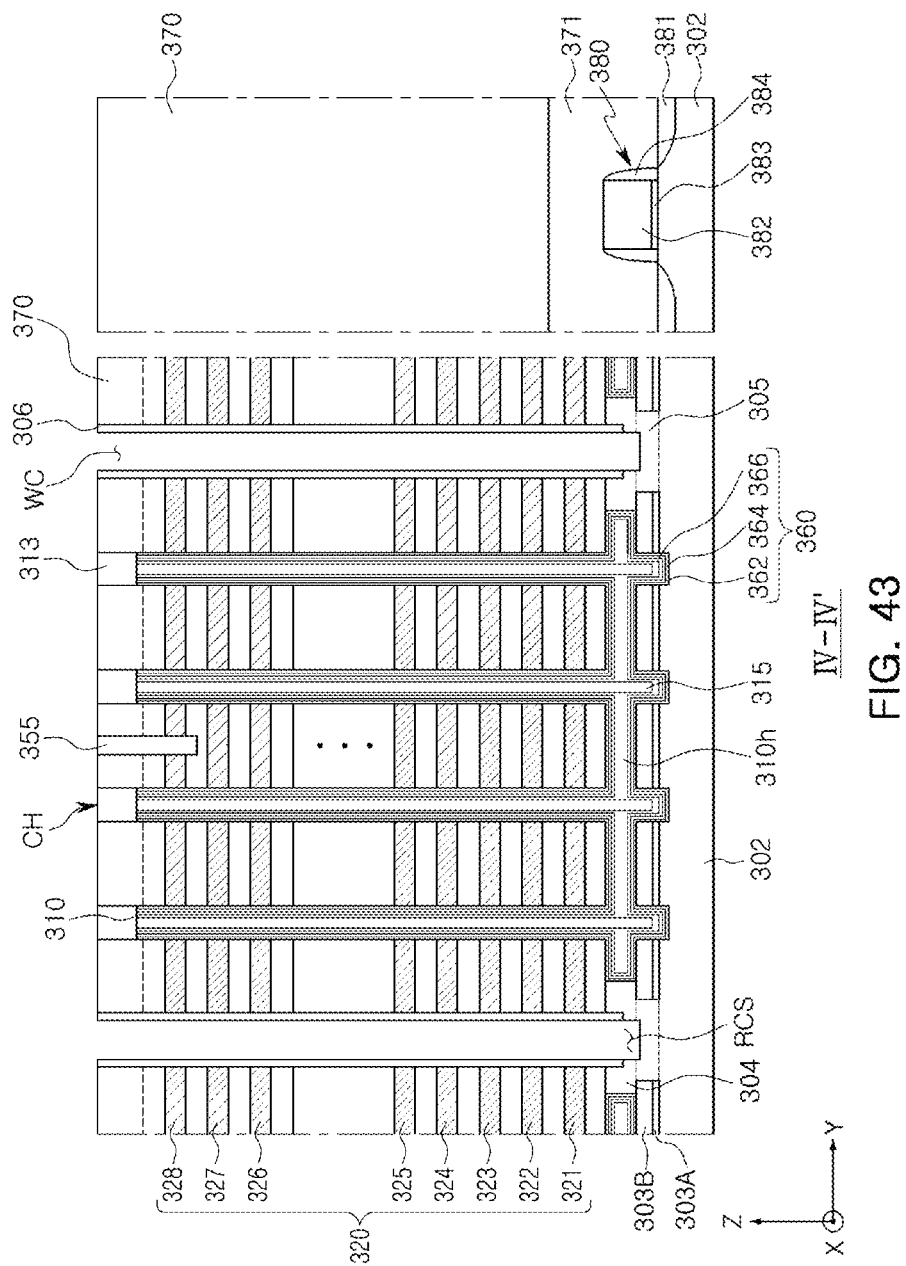
Figure 44:
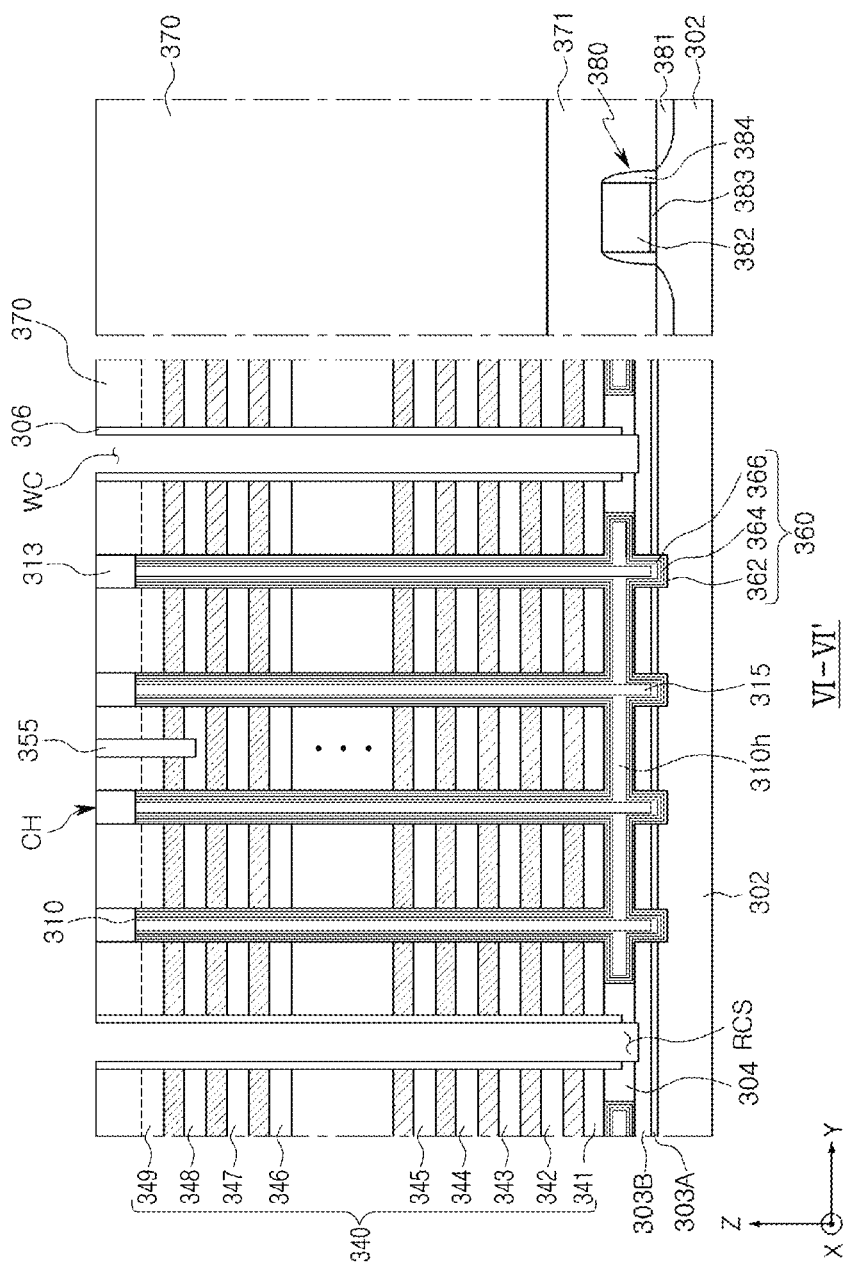

Referring to FIGS. 42 to 44, after a poly spacer 306 formed of polysilicon is formed on the inner sidewall of the word line cut WC, an additional etching may be performed through the word line cut WC by a dry etching process to further form a trench RCS below the word line cut WC. The trench RCS may extend from the word line cut WC and may be formed to a depth enough to expose the plurality of supporting regions 30 and the second sacrificial layer 303B. In some example embodiments, the trench RCS may be formed without forming the poly spacer 306.

Figure 45:
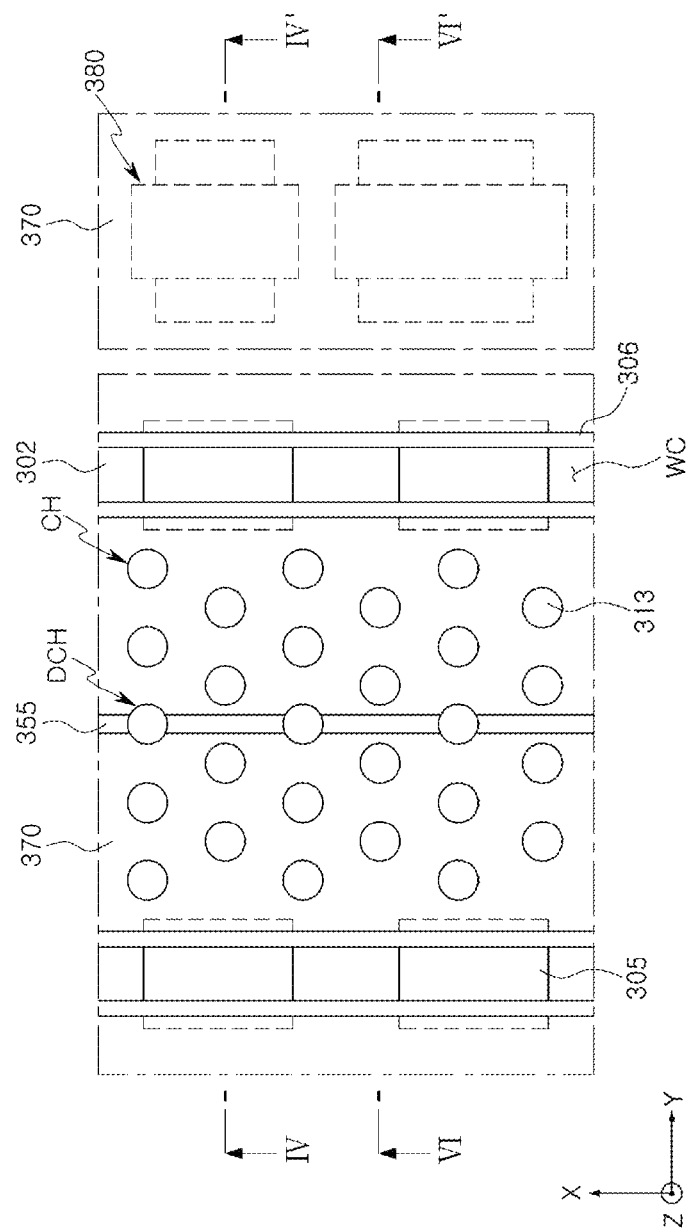
Figure 46:
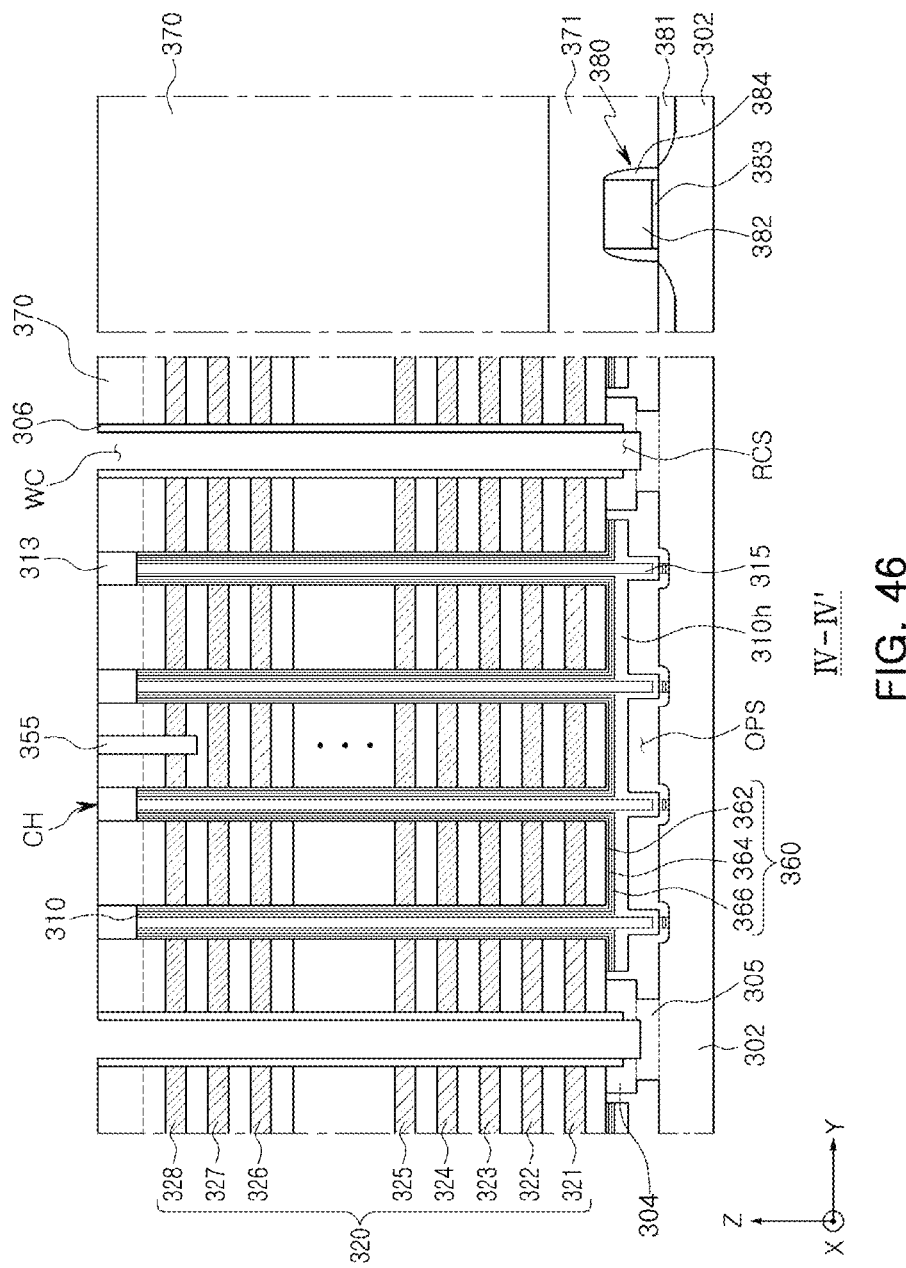
Figure 47:
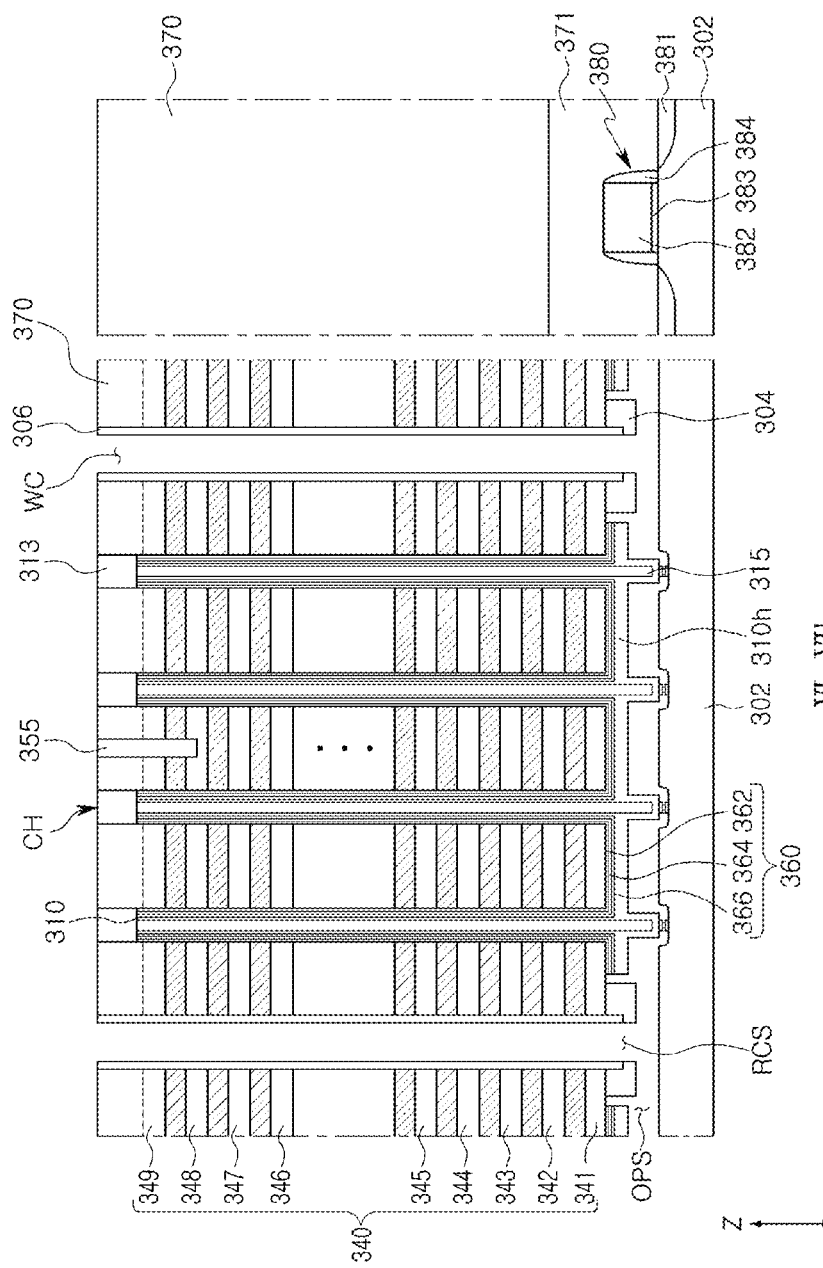

Referring to FIGS. 45 to 47, the first and second sacrificial layers 303A and 303B may be removed through the word line cut WC and the trench RCS to form a substrate opening OPS. The second sacrificial layer 303B that is exposed by the word line cut WC and the trench RCS may be removed first, and then the first sacrificial layer 303A may be removed. By removing the first and second sacrificial layers 303A and 303B, a portion of the first region 302, a portion of the third region 304 and a portion of each of plurality of supporting regions 305 may be exposed by the substrate opening OPS. When forming the substrate opening OPS, the plurality of sacrificial layers 320 and the plurality of insulating layers 320 may be supported by the plurality of supporting regions 305 without collapsing.

While removing the first and second sacrificial layers 303A and 303B or while performing an additional etching process after removing the second sacrificial layers 303B, the gate insulating layer 360 below the horizontal channel layer 310h and on a sidewall of the horizontal channel layer 310h may be removed. In some example embodiments, when the second sacrificial layer 303B is removed first by performing a first etching process through the word line cut WC and the trench RCS, the gate insulating layer 360 may be exposed by a region in which the second sacrificial layer 303B is removed. By performing a second etching process after the first etching process, the first sacrificial layer 303A and a portion of the gate insulating layer 360, e.g., the blocking layer 362 may be removed together. That is, the blocking layer 362 below the horizontal channel layer 310h may be removed by the second etching process. In this case, the blocking layer 362 on a sidewall of the horizontal channel layer 310 h may also be removed.

After performing the second etching process, a third etching process may be performed to remove the charge storage layer 364 and the tunnel layer 366 below the horizontal channel layer 310*h*. In this case, the charge storage layer 364 and the tunnel layer 366 on the sidewall of the horizontal channel layer 310*h* may also be removed. Since at least one of the blocking layer 362, the charge storage layer 364 and the tunnel layer 366 may include a different material from the others, a plurality of etching processes as described above may be performed to remove the gate insulating layer 360 below the horizontal channel layer 310*h*. When removing the gate insulating layer 360 below the horizontal channel layer 310*h*, a portion of the gate insulating layer 360 may remain between the first region 302 and the horizontal channel layer 310*h*. That is, a portion of the gate insulating layer 360 (i.e., a portion of the blocking layer 362, a portion of the charge storage layer 364 and a portion of the tunnel layer 366) may remain between the first region 302 and the horizontal channel layer 310*h* below a bottom surface of the buried insulating layer 315. The gate insulating layer 360 may remain on a top surface of the horizontal channel layer 310*h* thereby constituting a horizontal part of the gate insulating layer 360. By the horizontal part, vertical parts of the gate insulating layer 360, each of which surrounds the outside of the channel layer 310, may be connected to each other.

Figure 48:
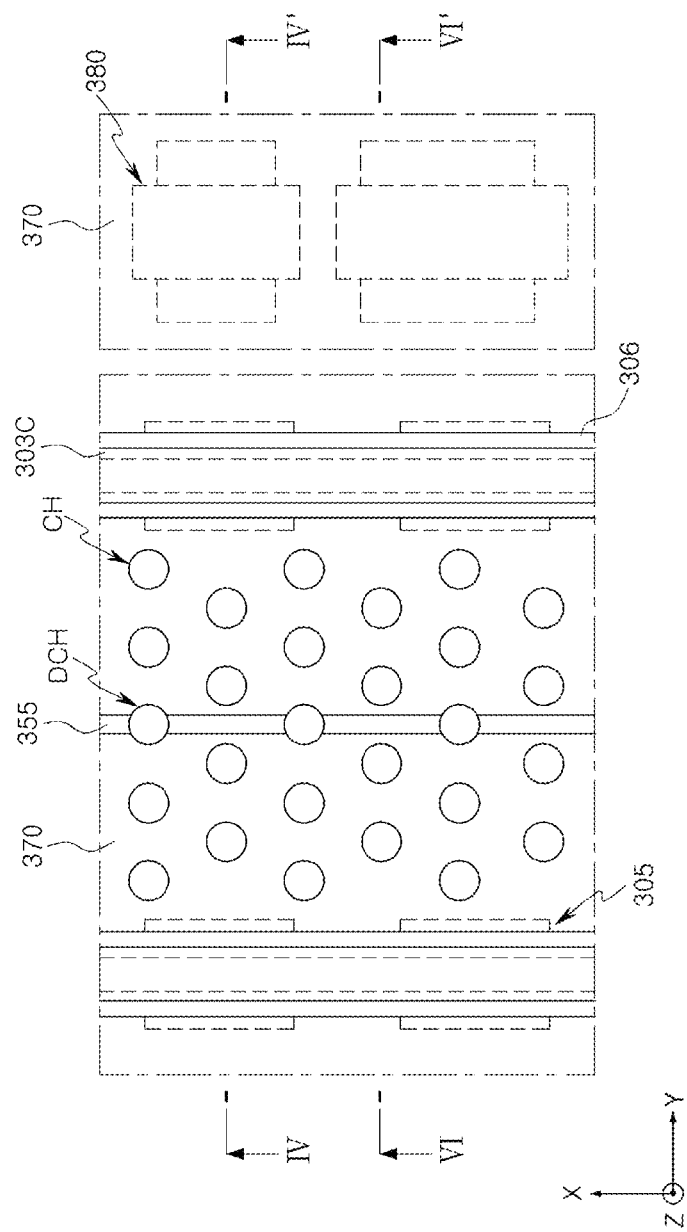
Figure 49:
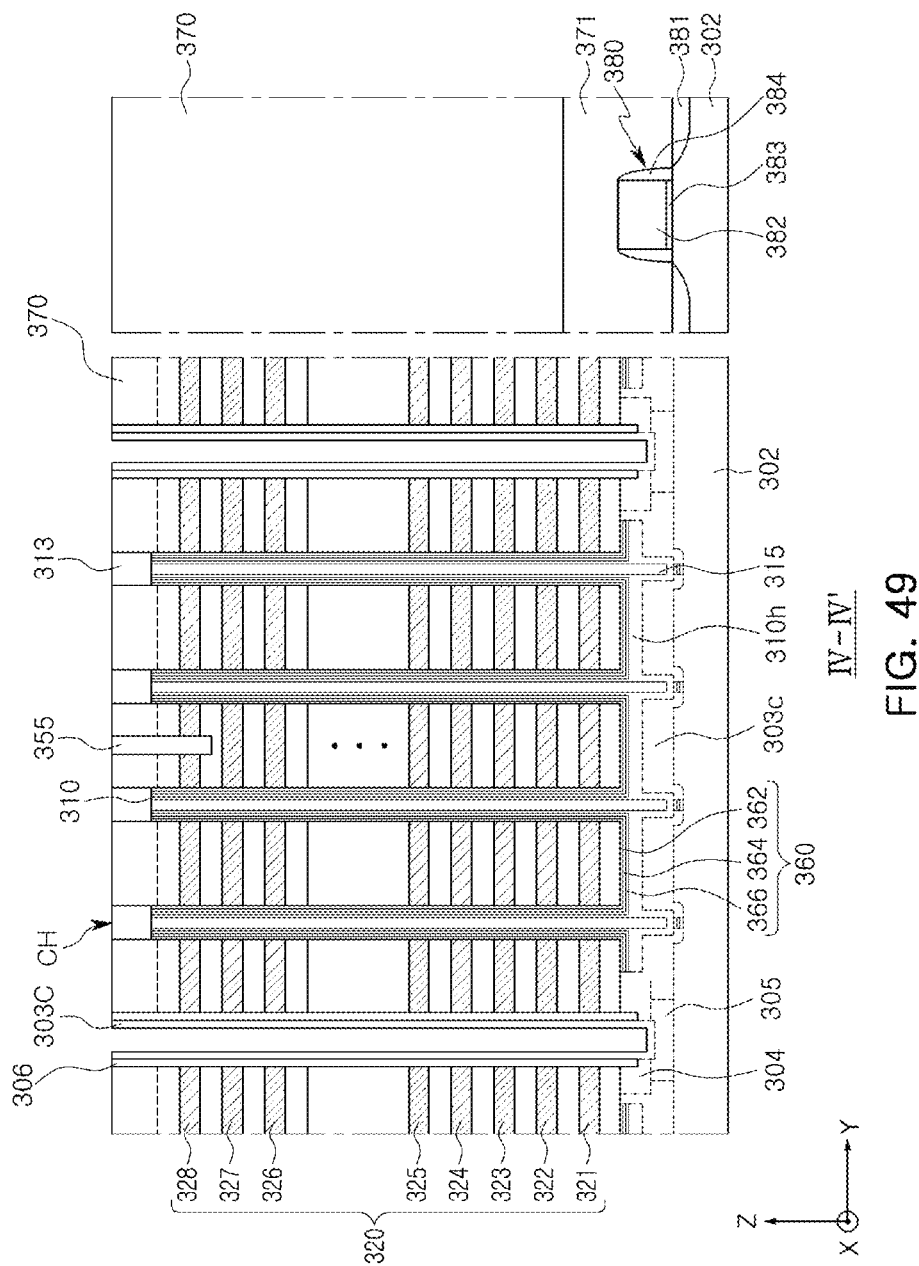
Figure 50:
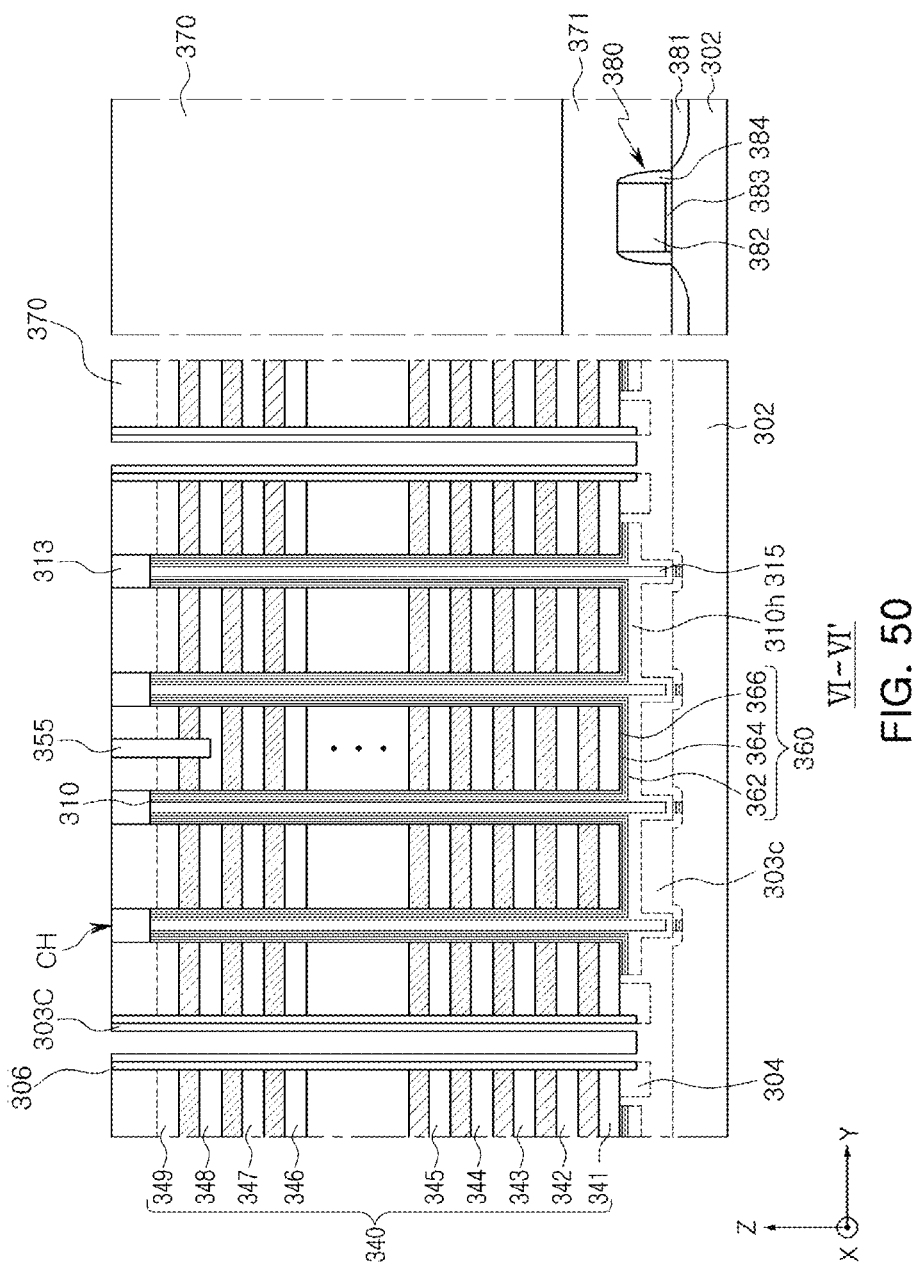

Referring to FIGS. 48 to 50, the substrate opening OPS may be filled with polysilicon through the word line cut WC. A polysilicon layer 303C may fill the substrate opening OPS. The polysilicon layer 303C may fill the trench RCA and may also be formed in the word line cut WC. Referring to FIGS. 9 and 10, while filling the substrate opening OPS with polysilicon, at least one void Vo may be formed in the polysilicon layer 303C. The first region 302, the third region 304, the channel layer 310 and the horizontal channel layer 310*h* may be connected to each other by the polysilicon layer 303C. The polysilicon layer 303C may be undoped in some example embodiments.

Figure 51:
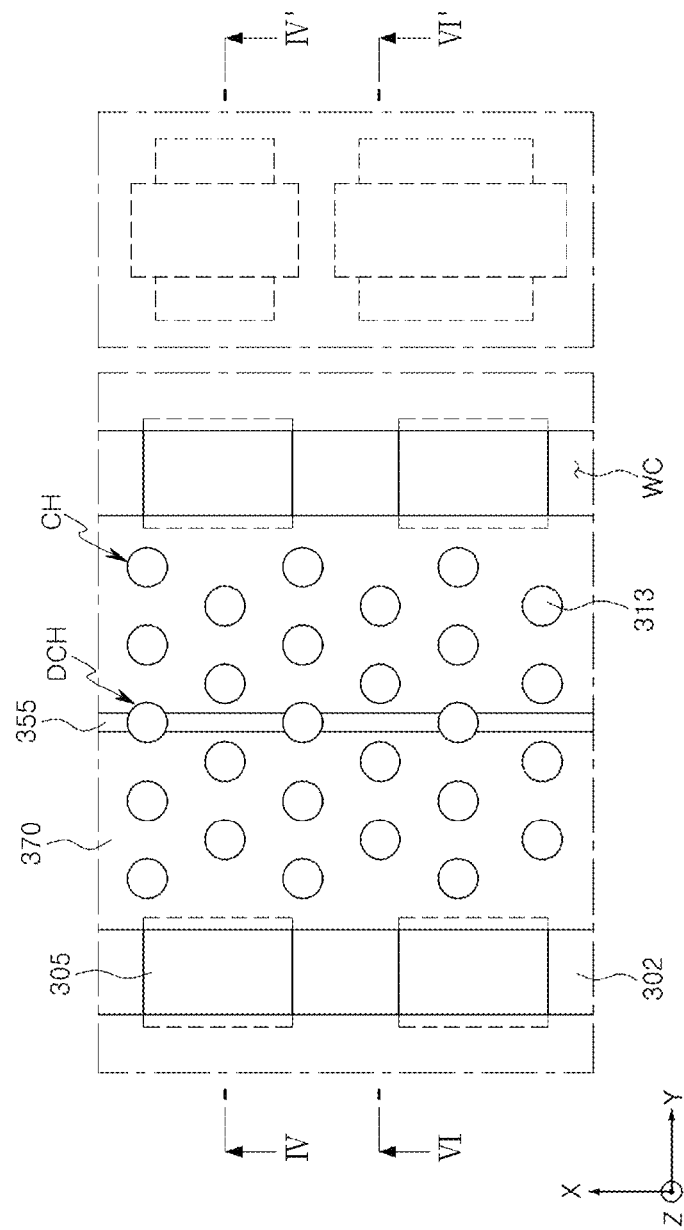
Figure 52:
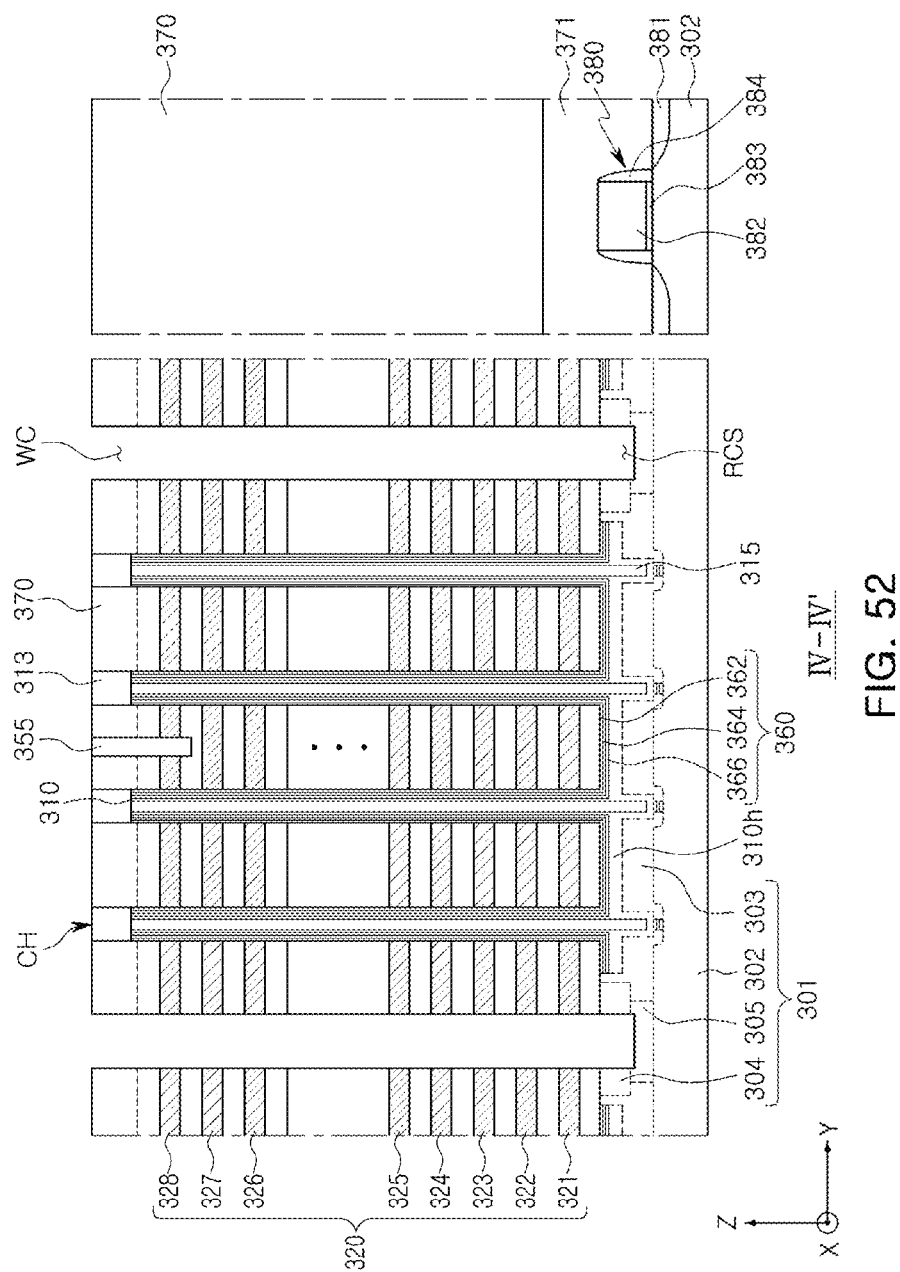
Figure 53:
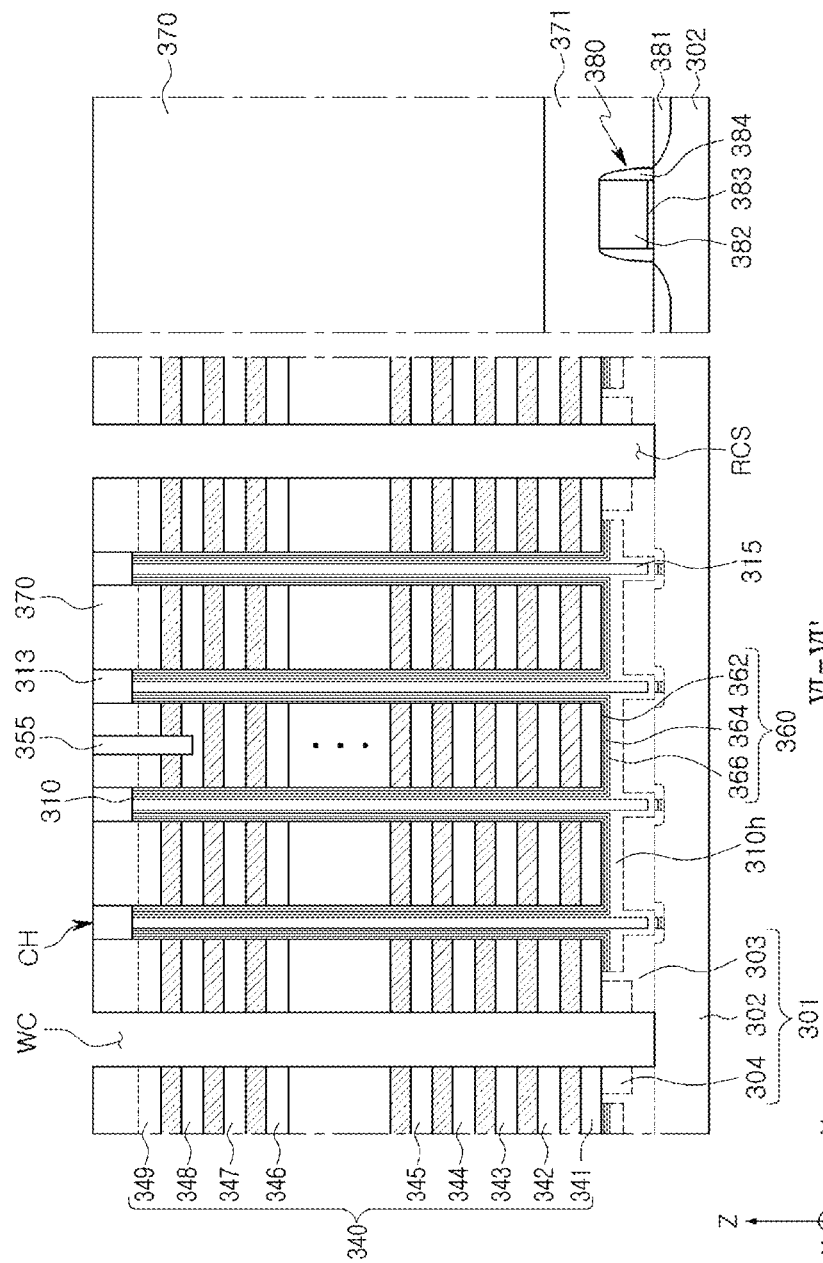

Referring to FIGS. 51 to 53, an etching process may be performed through the word line cut WC. The etching process may be performed to selectively remove polysilicon. By the etching process, the polysilicon layer 303C and the poly spacer 306 in the word line cut WC may be removed. In this case, the polysilicon layer 303C below the word line cut WC may be removed. However, since the first and third regions 302 and 304 include carbon, the first and third regions 302 and 304 may not be removed while performing the etching process. By removing the polysilicon layer 303C below and in the word line cut WC and the poly spacer 306 in the word line cut WC, the plurality of the sacrificial layers 320 and the plurality of insulating layer 340 may be exposed by the word line cut WC, and the plurality of supporting regions 305 and/or the first region 302 may also be exposed by the trench RCS. In addition, the polysilicon layer 303C may remain in the substrate opening OPS to form a second region 303. For example, the second region 303 may be a region in which the substrate opening OPS formed by removing the first and second sacrificial layers 303A and 303B is filled with polysilicon As a result, a substrate 301 including the first to third regions 302, 303 and 304 and the plurality of supporting regions 305 may be formed. The first and third regions 302 and 304 may be connected to the channel layer 310 and the horizontal channel layer 310*h* by the second region 303.

In general, when forming a channel layer, a channel hole may be formed and then an epitaxial layer may be formed in the channel hole. Next, a gate insulating layer may be formed in the channel hole having the epitaxial layer. In this case, since a top surface of the epitaxial layer may be covered by the gate insulating layer, an etching process may be performed to expose the top surface of the epitaxial layer, and then the channel layer may be formed. However, when the top surface of the epitaxial layer may be sufficiently exposed, failure in which the epitaxial layer and the channel layer are not connected to each other may be generated. Accordingly, a diameter of the channel hole may be required to be increased. However, such an approach may impose limits on an integration density of a memory device.

According to some example embodiments of inventive concepts, the channel layer 310 may be directly connected to the substrate 301 without growing an epitaxial layer. In addition, when forming the channel layer 310, a process of forming the channel layer 310 after removing a portion of the gate insulating layer 360 may be omitted. As described with reference to FIGS. 36 to 38, the gate insulating layer 360 may be formed in the channel hole CHH and then the channel layer 310 may be formed on the gate insulating layer 360 in the channel hole CHH. In the following process, a portion of the gate insulating layer 360 surrounding the channel layer 310 may be removed, and a removed region of the gate insulating layer 360 may be filled with polysilicon, such that the horizontal channel layer 310*h* below the horizontal part of the gate insulating layer can directly contact the substrate 301. Accordingly, a diameter of the channel hole CHH may be reduced to increase an integration density of the memory device, and thus reliability of the memory device may be improved.

Figure 54:
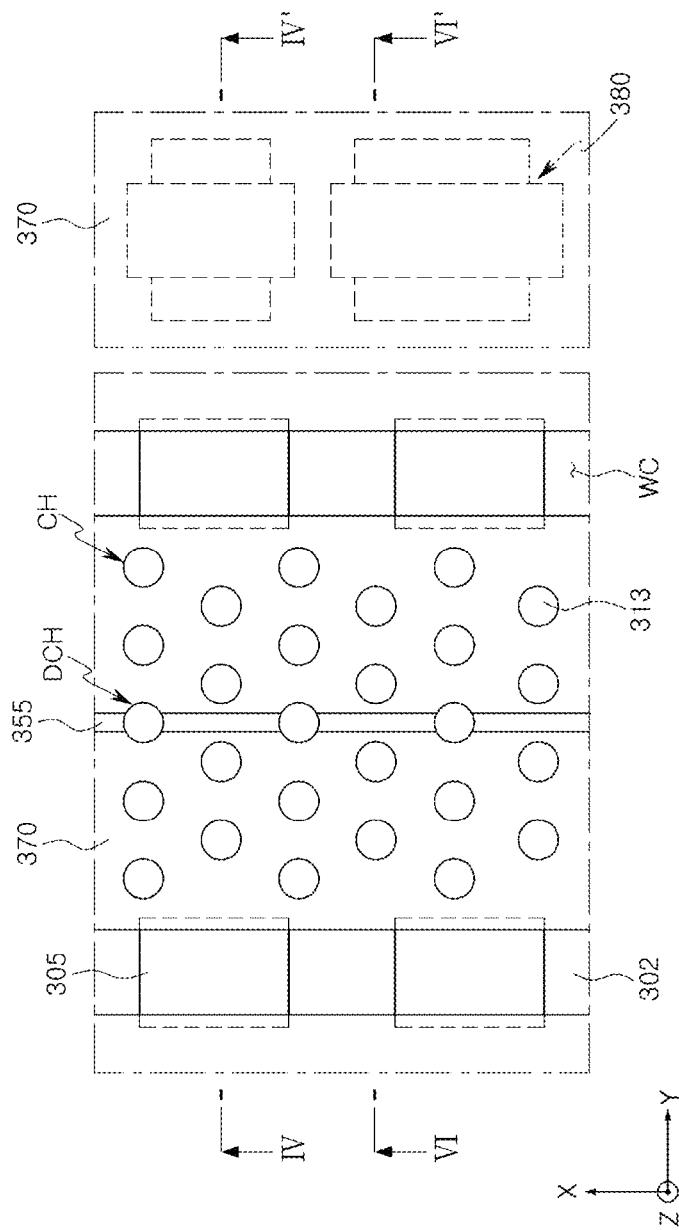
Figure 55:
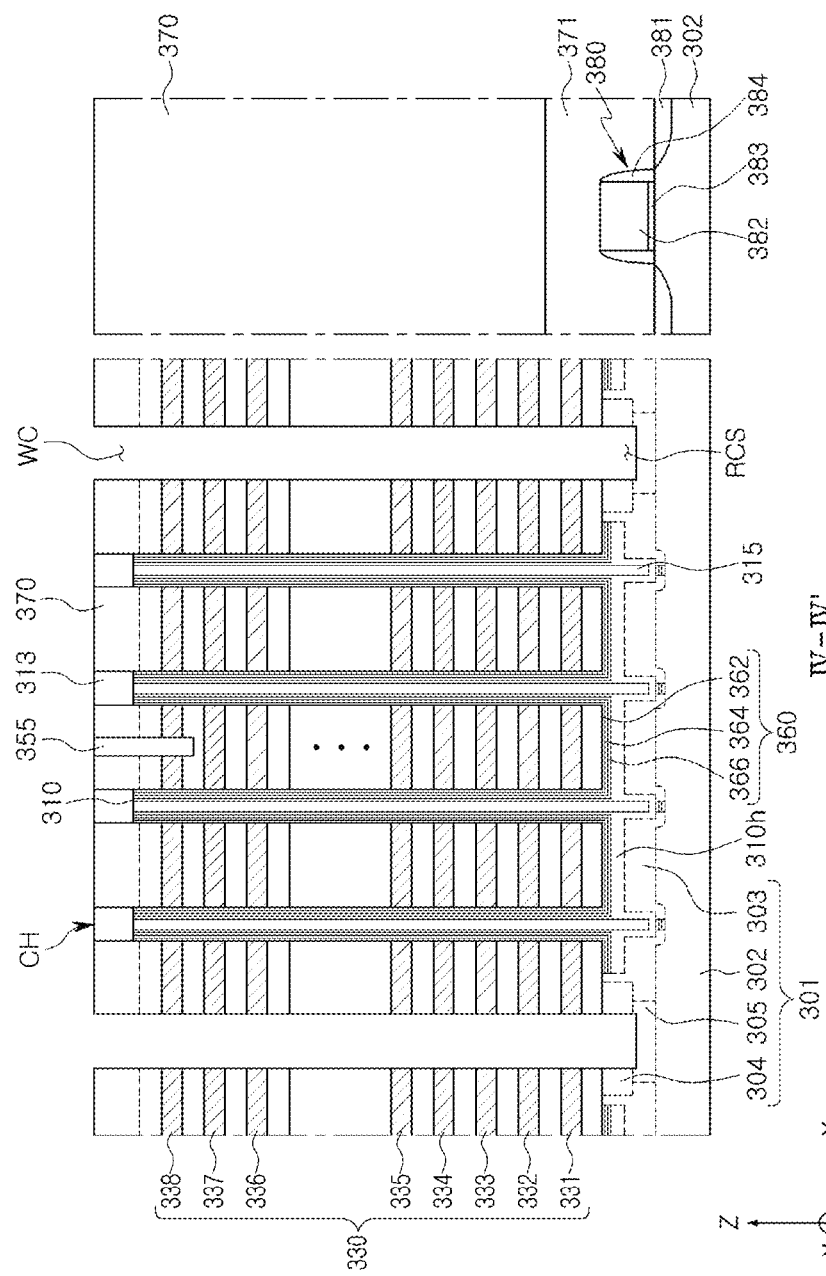
Figure 56:
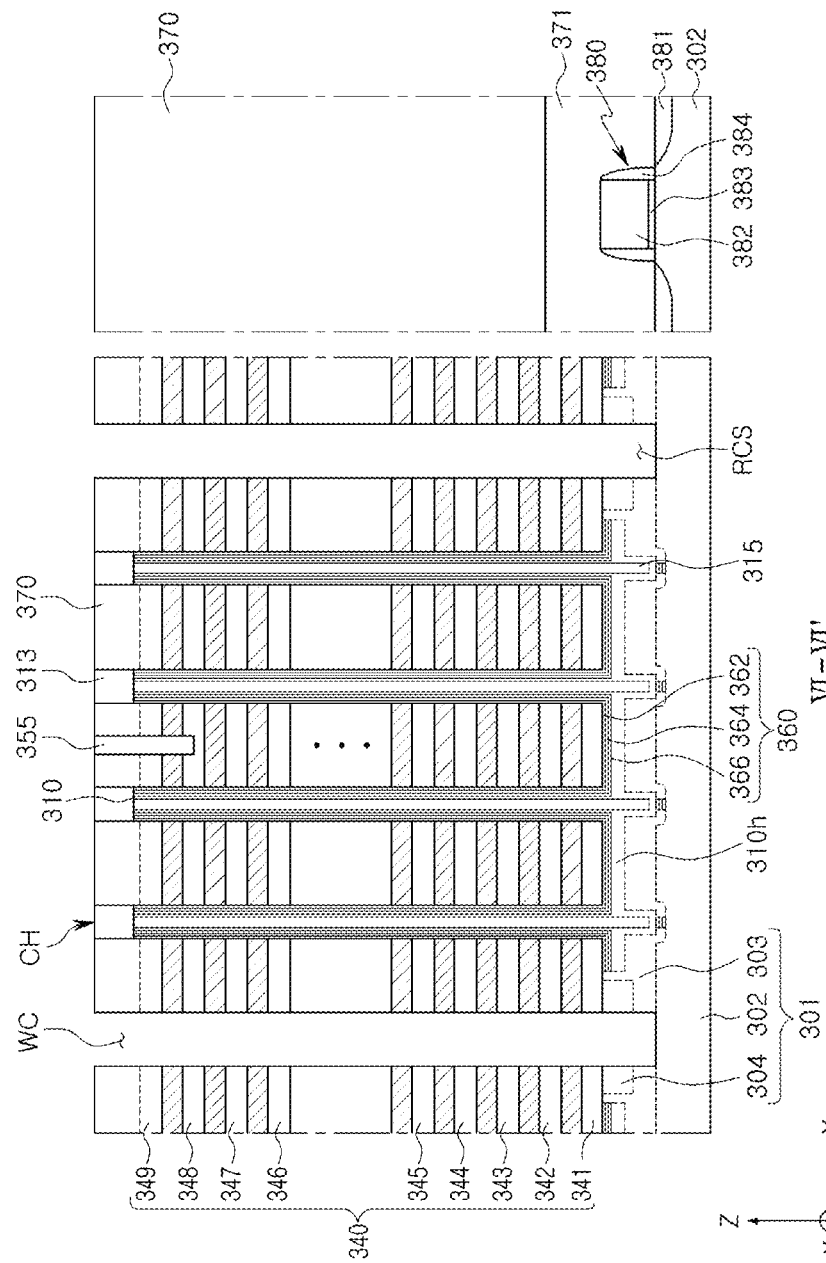

Referring to FIGS. 54 to 56, the plurality of sacrificial layers 320 exposed by the word line cut WC may selectively be removed, and then a conductive material may be filled in a region in which the plurality of sacrificial layers 320 are removed such that a plurality of gate electrode layers 331-338(330) may be formed. The gate electrode layers 330 may include metal, polysilicon, or metal silicide. The metal silicide may include cobalt silicide (CoSi), nickel silicide (NiSi), hafnium silicide (HfSi), platinum silicide (PtSi), tungsten silicide (WSi), titanium silicide (TiSi), or a combination thereof. When the gate electrode layers 330 may be formed of metal silicide, after silicon is filled in the region in which the plurality of sacrificial layers 320 are removed, a metal layer may be formed and then a silicidation process may be performed to form the gate electrode layers 330. In some example embodiments, the gate electrode layers 330 may include a plurality of metal layers, for example, a titanium nitride (TiN) layer and a tungsten (W) layer. In some example embodiments, before forming the plurality of gate electrode layers 330, an additional blocking layer similar to the additional blocking layer 168 as shown in FIG. 6 may be formed in the region in which the plurality of sacrificial layers 320 are removed. Accordingly, the additional blocking layer may surround the plurality of gate electrode layers 330.

Figure 57:
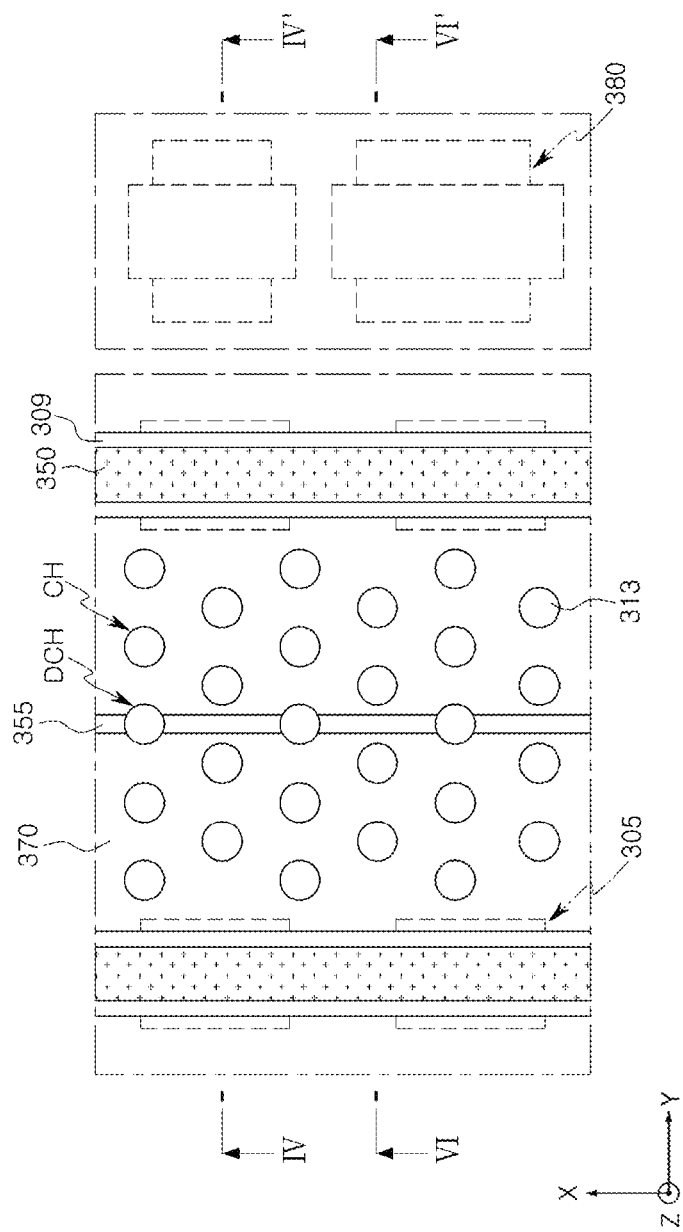
Figure 58:
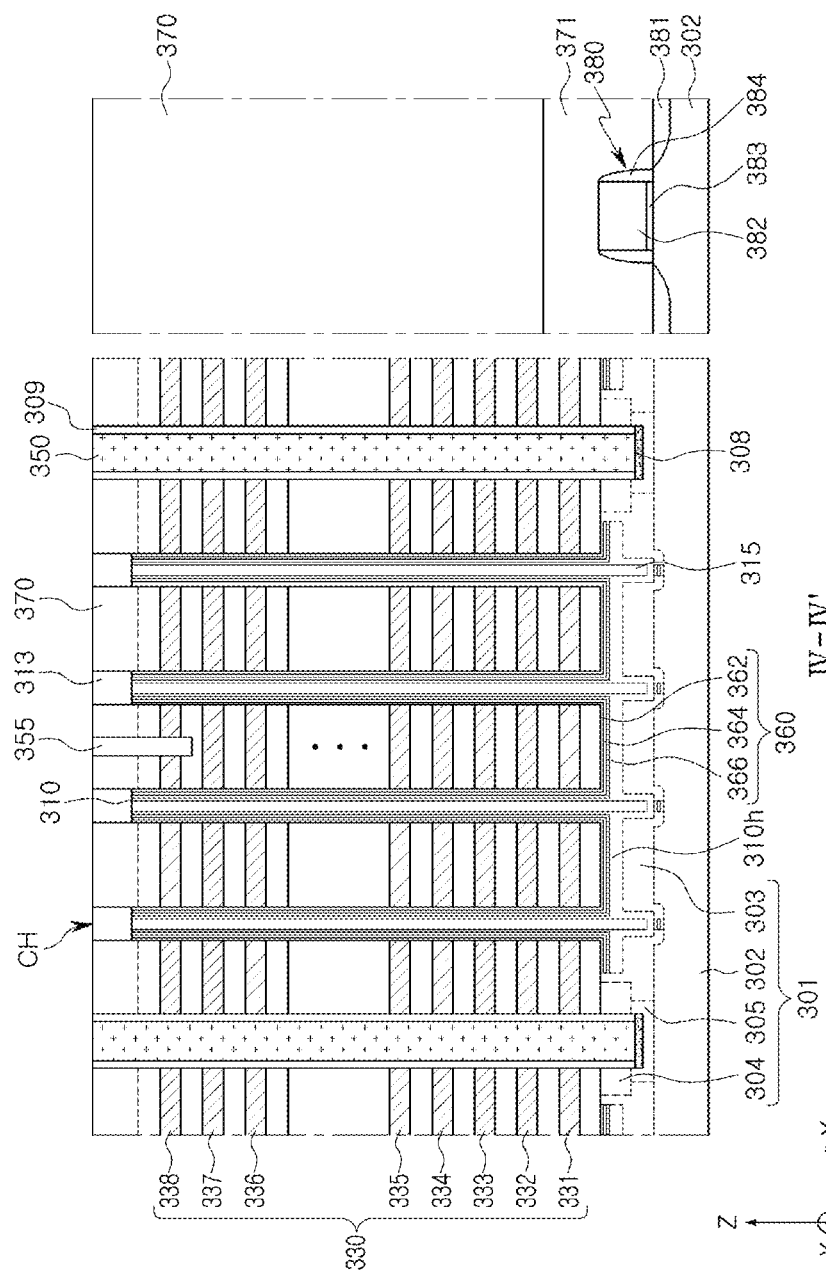
Figure 59:
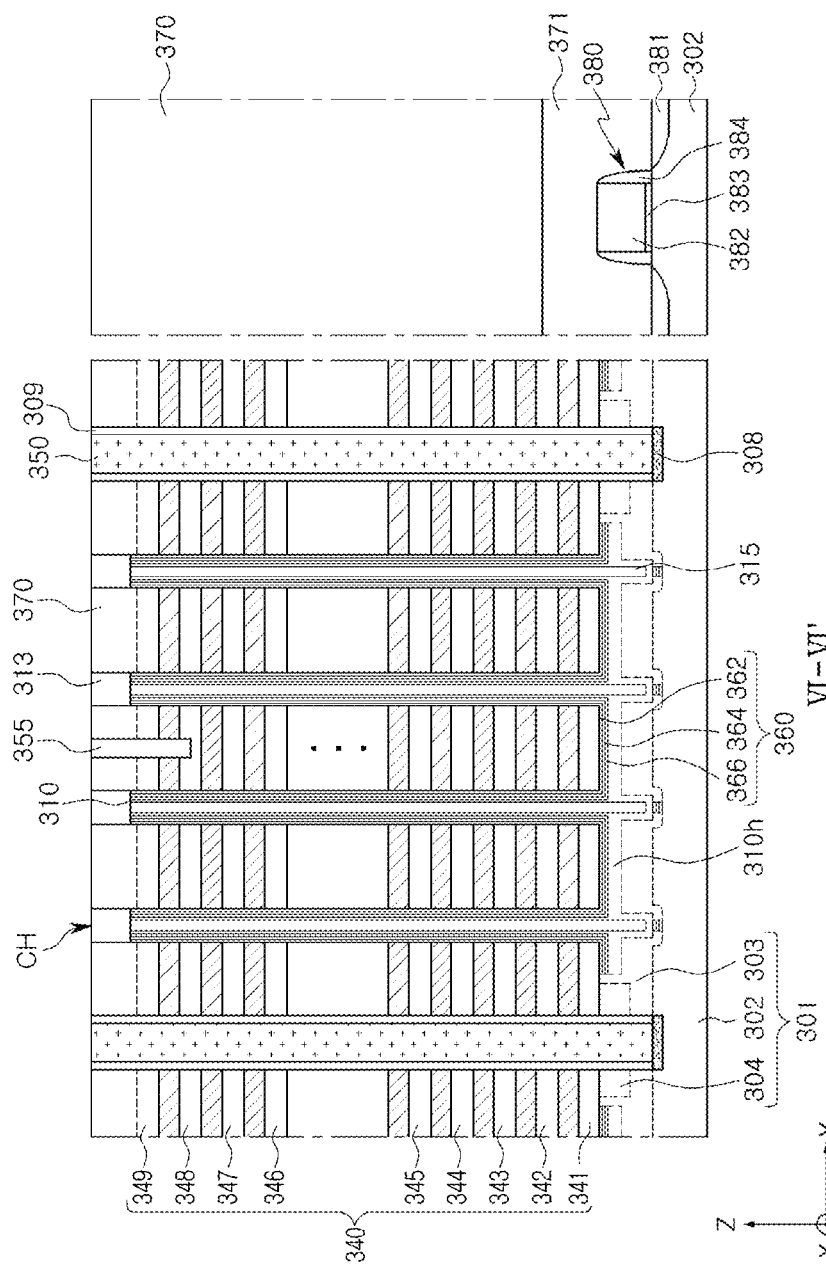

Referring to FIGS. 57 to 59, after forming the plurality of gate electrode layers 330, a spacer 309 may be formed in the sidewall of the word line cut WC and impurity ions may be injected into the substrate 301 (e.g., the first region 302 and the plurality of supporting layer 305) to form a source region 308. The source region 308 may include n-type impurities. After forming the source region 308, a common source line 350 may be formed in the word line cut WS by filling the word line cut WS having the spacer 309 with a conductive material.

In a memory device according to some example embodiments of inventive concepts, the plurality of channel layers and the substrate can be directly connected to each other without the epitaxial layer therebetween and the plurality of channel layers can be connected to each other by the horizontal channel layer in the substrate, and thus the diameter of the channel hole, in which each channel layer is formed, can be reduced. Accordingly, an open failure (or a non-contact) between the channel layers and the substrate can be limited and/or prevented and an integration density of the memory device can also be improved.

Figure 60:
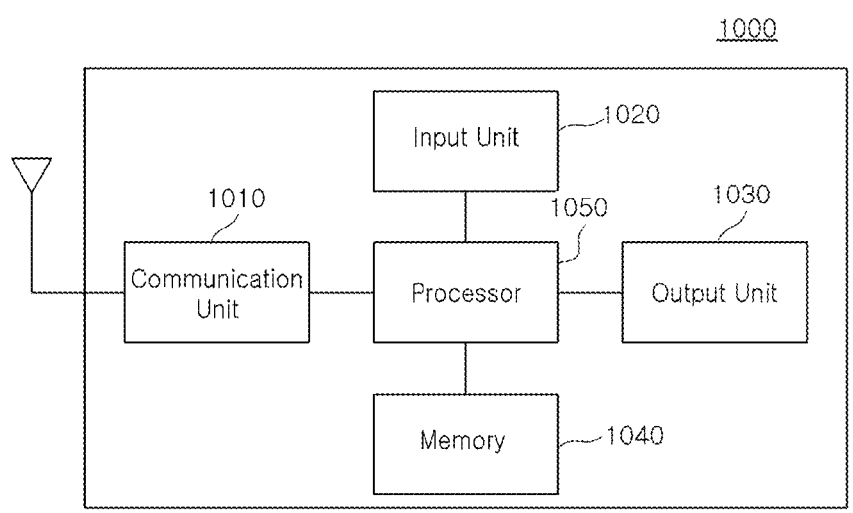
FIG. 60 is a schematic block diagram illustrating an electronic device including a memory device according to some example embodiments of inventive concepts.

FIG. 60 is a schematic block diagram illustrating an example of an electronic device including at least one semiconductor memory device according to some example embodiments of inventive concepts.

Referring to FIG. 60, an electronic device 1000 may include a communication unit 1010, an input unit 1020, an output unit 1030, a memory 1040 and a processor 1050.

The communication unit 1010 may include a wired/wireless communication module. The communication unit 1010 may include a wireless internet module, a local area communication module, a global positioning system (GPS) module, a mobile communication module, etc. The wired/wireless communication module may be connected to an external communication network by various communication standards and may transmit and receive data.

The input unit 1020 may be provided as a module configured to allow a user to control an operation of the electronic device 1000 and may include a mechanical switch, a touch screen, a voice recognition module, etc. Further, the input unit 1020 may include a mouse of a track ball type or a laser pointer type, or a finger mouse device. The input unit 1020 may include a wide variety of sensor modules in which a user can input data.

The output unit 1020 may be configured to output information processed in the electronic device 1000 in audio or video format. The memory 1040 may store a program for controlling and processing the processor 1050, data, etc. The memory 1040 may include at least one of memory devices 100, 200 and 300 according to some example embodiments as described above. The processor 1050 may transmit a command to the memory 1040 depending on a required operation, and thus data can be stored or output.

The memory 1040 may be communicated with the processor 1050 through an interface in the electronic device 1000 or a separate interface. The processor 1050 may be communicated with the memory 1040 through various interface standards such as SD, SDHC, SDXC, MICRO SD or USB to store data in the memory 1040 or retrieve data from the memory 1040.

The processor 1050 may control an operation of each unit in the electronic device 1000. The processor 1050 may perform controlling and processing related to an audio call, a video call, a data communication, multimedia playback and management, etc. In addition, the processor 1050 may process an input transmitted from a user through the input unit 1020 and may output corresponding results through the output unit 1030. The processor 1050 may store data required for controlling an operation of the electronic device 1000 in the memory 1040 or may retrieve such data from the memory 1040.

It should be understood that example embodiments described herein should be considered in a descriptive sense only and not for purposes of limitation. Descriptions of features or aspects within each device or method according to some example embodiments should typically be considered as available for other similar features or aspects in other devices or methods according to some example embodiments. While some example embodiments of inventive concepts have been particularly shown and described, it will be understood by one of ordinary skill in the art that variations in form and detail may be made therein without departing from the spirit and scope of the attached claims.

What is claimed is:

1. A method of manufacturing a semiconductor device, comprising:
    forming a first impurity region by injecting impurity to at least a portion of a semiconductor substrate;
    forming a substrate sacrificial layer and a plurality of supporting regions in contact with an upper surface of the semiconductor substrate;
    forming a semiconductor layer on the substrate sacrificial layer and the plurality of supporting regions, the semiconductor layer including a second impurity region;
    stacking alternately a plurality of sacrificial layers and a plurality of insulating layers on the semiconductor layer;
    forming a plurality of channel holes penetrating the plurality of sacrificial layers and the plurality of insulating layers and extending to the first impurity region;
    remaining the second impurity region by removing a portion of the semiconductor layer;
    forming a gate insulating layer and a channel layer in each of the plurality of channel holes;
    forming a word line cut dividing the plurality of sacrificial layers and the plurality of insulating layers into a plurality of regions;
    forming a substrate opening by removing a substrate sacrificial layer and a portion of the gate insulating layer; and
    filling the substrate opening with a semiconductor material.

2. The method of claim 1, wherein the first impurity region and the second impurity region comprise carbon.

3. The method of claim 1, wherein the plurality of supporting regions are disposed along a first direction and a second direction parallel to an upper surface of the semiconductor substrate.

4. The method of claim 3, wherein the second impurity region is extended along the first direction, and is overlapped with at least a portion of the plurality of supporting regions.

5. The method of claim 3, wherein a width of each of the plurality of supporting regions is smaller than a width of the second impurity region.

6. The method of claim 1, wherein an area of the first impurity region is greater than an area of the second impurity region.

7. The method of claim 1, wherein an upper surface of the plurality of supporting regions is co-planar with an upper surface of the substrate sacrificial layer.

8. The method of claim 1, wherein the substrate sacrificial layer comprises a first substrate sacrificial layer formed of a first insulating material on the first impurity region and a second substrate sacrificial layer formed of a second insulating material on the first substrate sacrificial layer, and
    the first insulating material and the second insulating material are different to each other.

9. The method of claim 8, wherein a thickness of the second substrate sacrificial layer is greater than a thickness of the first substrate sacrificial layer.

10. The method of claim 8, wherein the first insulating material is silicon oxide, and the second insulating material is silicon nitride.

11. The method of claim 1, further comprising:
    forming a poly spacer with polysilicon on an inner sidewall of the word line cut; and exposing the substrate sacrificial layer and the plurality of supporting regions in the word line cut, by removing a lower surface of the poly spacer.

12. The method of claim 1, further comprising:
forming an opening by removing the portion of the semiconductor layer through the plurality of channel holes; and
filling the plurality of channel holes and the opening with the gate insulating layer and the channel layer,
wherein the channel layer comprises a horizontal channel layer filling a portion of the opening and extending in a direction parallel to the upper surface of the semiconductor substrate.

13. The method of claim 12, wherein the gate insulating layer is contact with the horizontal channel layer, and
at least a portion of the gate insulating layer being contact with a lower surface of the horizontal channel layer is removed by forming the substrate opening.

14. The method of claim 1, wherein the plurality of supporting regions and the semiconductor layer comprise polysilicon.

15. The method of claim 1, wherein the forming a first impurity region includes
forming the first impurity region in the substrate.

16. The method of claim 1, wherein the forming the substrate sacrificial layer includes,
forming the substrate sacrificial layer directly on the upper surface of the semiconductor substrate.

17. The method of claim 1, wherein the forming a semiconductor layer on the substrate sacrificial layer includes,
injecting impurities to form the second impurity region.

18. A method of manufacturing a semiconductor device, comprising:
forming a first impurity region by injecting impurity to an upper surface of a semiconductor substrate;
forming a first substrate sacrificial layer and a second substrate sacrificial layer on an upper surface of the first impurity region;
forming a plurality of supporting regions being contact with the upper surface of the first impurity region, in regions in which a portion of the first substrate sacrificial layer and the second substrate sacrificial layer are removed;
forming a semiconductor layer with polysilicon on upper surfaces of the second sacrificial layer and the plurality of supporting regions;
remaining a portion of the semiconductor layer on the plurality of supporting regions and removing a remaining portion of the semiconductor layer, through a plurality of channel holes penetrating the semiconductor layer, the first substrate sacrificial layer and the second substrate sacrificial layer and extending to the semiconductor substrate;
forming a substrate opening by removing the first substrate sacrificial layer and the second substrate sacrificial layer through a word line cut exposing the plurality of supporting regions and the second sacrificial layer in the portion of the semiconductor layer; and
filling the substrate opening with polysilicon.

19. The method of claim 18, wherein the portion of the semiconductor layer is doped with the same impurity as the first impurity region.

20. The method of claim 18, wherein the portion of the semiconductor layer is extended along a direction parallel to the upper surface of the semiconductor substrate, and
the plurality of supporting regions are separated from each other under the portion of the semiconductor layer, along the direction.

* * * * *